(12) United States Patent
Sano et al.

(10) Patent No.: US 9,601,502 B2
(45) Date of Patent: Mar. 21, 2017

(54) MULTIHEIGHT CONTACT VIA STRUCTURES FOR A MULTILEVEL INTERCONNECT STRUCTURE

(71) Applicant: SANDISK TECHNOLOGIES LLC, Plano, TX (US)

(72) Inventors: Michiaki Sano, Ichinomiya (JP); Keisuke Izumi, Yokkaichi (JP)

(73) Assignee: SANDISK TECHNOLOGIES LLC, Plano, TX (US)

( * ) Notice: Subject to any disclaimer, the term of this patent is extended or adjusted under 35 U.S.C. 154(b) by 0 days.

(21) Appl. No.: 15/211,401

(22) Filed: Jul. 15, 2016

(65) Prior Publication Data

US 2016/0322374 A1    Nov. 3, 2016

Related U.S. Application Data

(60) Continuation-in-part of application No. 15/189,458, filed on Jun. 22, 2016, which is a division of
(Continued)

(51) Int. Cl.
*H01L 21/00*    (2006.01)
*H01L 27/115*    (2006.01)
(Continued)

(52) U.S. Cl.
CPC .. *H01L 27/11556* (2013.01); *H01L 21/31051* (2013.01); *H01L 21/76804* (2013.01);
(Continued)

(58) Field of Classification Search
USPC ........ 257/751, 774, 762, 200, 314, E21.423, 257/E21.422, E29.3, 315, E21.679,
(Continued)

(56) References Cited

U.S. PATENT DOCUMENTS 5,915,167 A    6/1999    Leedy
7,005,350 B2    2/2006    Walker et al.
(Continued)

FOREIGN PATENT DOCUMENTS

WO    WO02/15277 A2    2/2002
WO    WO2013/176960 A2    11/2013

OTHER PUBLICATIONS

Jang et al., "Vertical Cell Array Using TCAT (Terabit Cell Array Transistor) Technology for Ultra High Density NAND Flash Memory," 2009 Symposium on VLSI Technology Digest of Technical Papers, pp. 192-193.
(Continued)

*Primary Examiner* — Tram H Nguyen
(74) *Attorney, Agent, or Firm* — The Marbury Law Group PLLC

(57) ABSTRACT

A recessed region can be formed on a semiconductor substrate, and peripheral semiconductor devices can be formed on a recessed horizontal surface of the semiconductor substrate. An alternating stack of insulating layers and sacrificial material layers are formed over the semiconductor substrate, and memory stack structures are formed therethrough. Contact openings extending to sacrificial material layers located at different depths can be formed by sequentially exposing a greater number of openings in a mask layer by iterative alternation of trimming of a slimming layer over the mask layer and an anisotropic etch that recesses preexisting contact openings by one level. Electrically conductive via structures extending to electrically conductive electrodes located at different level can be provided with self-aligned insulating liners.

25 Claims, 61 Drawing Sheets

Related U.S. Application Data application No. 14/468,744, filed on Aug. 26, 2014, now Pat. No. 9,401,309.

(51) Int. Cl.
*H01L 23/522* (2006.01)
*H01L 21/768* (2006.01)
*H01L 21/3105* (2006.01)

(52) U.S. Cl.
CPC .... *H01L 21/76877* (2013.01); *H01L 23/5226* (2013.01); *H01L 27/11529* (2013.01); *H01L 27/11573* (2013.01); *H01L 27/11582* (2013.01)

(58) Field of Classification Search
USPC .... 257/E29.262, E21.21, E21.614, E21.645, 257/E27.102, E27.111, E29.129, 257/E29.331, E21.312, E21.41, E21.663, 257/E27.07, 733, 374, 499–564, 763, 757, 257/296, 301; 438/270, 257, 424, 258, 438/287, 268; 365/185.18, 185.17, 365/185.03, 17, 184, 185.22, 185.23, 365/185.29, 89.14, 51, 63
See application file for complete search history.

(56) References Cited

U.S. PATENT DOCUMENTS

| | | | |
|---|---|---|---|
| 7,023,739 B2 | 4/2006 | Chen et al. | |
| 7,177,191 B2 | 2/2007 | Fasoli et al. | |
| 7,221,588 B2 | 5/2007 | Fasoli et al. | |
| 7,233,522 B2 | 6/2007 | Chen et al. | |
| 7,473,589 B2 | 1/2009 | Lai et al. | |
| 7,514,321 B2 | 4/2009 | Mokhlesi et al. | |
| 7,539,056 B2* | 5/2009 | Katsumata | G11C 16/0483 365/185.18 |
| 7,575,973 B2 | 8/2009 | Mokhlesi et al. | |
| 7,696,559 B2 | 4/2010 | Arai et al. | |
| 7,745,265 B2 | 6/2010 | Mokhlesi et al. | |
| 7,808,038 B2 | 10/2010 | Mokhlesi et al. | |
| 7,848,145 B2 | 12/2010 | Mokhlesi et al. | |
| 7,851,851 B2 | 12/2010 | Mokhlesi et al. | |
| 7,855,457 B2 | 12/2010 | Mizukami et al. | |
| 8,008,710 B2 | 8/2011 | Fukuzumi | |
| 8,053,829 B2 | 11/2011 | Kang et al. | |
| 8,187,936 B2 | 5/2012 | Alsmeier et al. | |
| 8,247,860 B2* | 8/2012 | Iwase | H01L 21/28282 257/314 |
| 8,394,716 B2 | 3/2013 | Hwang et al. | |
| 9,023,719 B2 | 5/2015 | Pachamuthu et al. | |
| 9,117,822 B1 | 8/2015 | Singh et al. | |
| 9,236,392 B1 | 1/2016 | Izumi et al. | |
| 2003/0011017 A1 | 1/2003 | Lee et al. | |
| 2004/0232552 A1 | 11/2004 | Wang et al. | |
| 2005/0088551 A1 | 4/2005 | Lee et al. | |
| 2007/0090531 A1 | 4/2007 | Offenberg et al. | |
| 2007/0210338 A1 | 9/2007 | Orlowski | |
| 2007/0252201 A1 | 11/2007 | Kito et al. | |
| 2007/0264819 A1 | 11/2007 | Offenberg et al. | |
| 2009/0230449 A1 | 9/2009 | Sakaguchi et al. | |
| 2009/0242967 A1* | 10/2009 | Katsumata | H01L 21/764 257/324 |
| 2010/0013049 A1 | 1/2010 | Tanaka et al. | |
| 2010/0044778 A1 | 2/2010 | Seol | |
| 2010/0112769 A1 | 5/2010 | Son et al. | |
| 2010/0120214 A1 | 5/2010 | Park et al. | |
| 2010/0155810 A1 | 6/2010 | Kim et al. | |
| 2010/0155818 A1 | 6/2010 | Cho | |
| 2010/0163968 A1 | 7/2010 | Kim et al. | |
| 2010/0181610 A1 | 7/2010 | Kim et al. | |
| 2010/0207195 A1* | 8/2010 | Fukuzumi | G11C 16/0483 257/326 |
| 2010/0320528 A1 | 12/2010 | Jeong et al. | |
| 2011/0031546 A1 | 2/2011 | Uenaka et al. | |
| 2011/0076819 A1 | 3/2011 | Kim et al. | |
| 2011/0133606 A1 | 6/2011 | Yoshida et al. | |
| 2011/0169071 A1* | 7/2011 | Uenaka | H01L 27/105 257/326 |
| 2011/0266606 A1 | 11/2011 | Park et al. | |
| 2011/0284943 A1 | 11/2011 | Hwang et al. | |
| 2012/0001247 A1 | 1/2012 | Alsmeier | |
| 2012/0001249 A1 | 1/2012 | Alsmeier | |
| 2012/0001250 A1 | 1/2012 | Alsmeier | |
| 2012/0012920 A1 | 1/2012 | Shin et al. | |
| 2013/0264631 A1 | 10/2013 | Alsmeier et al. | |
| 2013/0267088 A1 | 10/2013 | Baek et al. | |
| 2013/0313627 A1 | 11/2013 | Lee et al. | |
| 2015/0076584 A1 | 3/2015 | Pachamuthu et al. | |
| 2015/0179660 A1 | 6/2015 | Yada et al. | |
| 2015/0380418 A1 | 12/2015 | Zhang et al. | |
| 2016/0064281 A1 | 3/2016 | Izumi et al. | |
| 2016/0093626 A1* | 3/2016 | Izumi | H01L 21/7688 257/324 |
| 2016/0172366 A1* | 6/2016 | Koka | H01L 29/7883 257/314 |
| 2016/0284726 A1* | 9/2016 | Sakakibara | H01L 27/11582 |

OTHER PUBLICATIONS

Katsumata et al., "Pipe-Shaped BiCS Flash Memory with 16 Stacked Layers and Multi-Level-Cell Operation for Ultra High Density Storage Devices," 2009 Symposium on VLSI Technology Digest of Technical Papers, pp. 136-137.

Maeda et al., "Multi-Stacked 1G Cell/Layer Pipe-Shaped BiCS Flash Memory," 2009 Symposium on VLSI Technology Digest of Technical Papers, pp. 22-23.

Endoh et al., "Novel Ultra High Density Memory with a Stacked-Surrounding Gate Transistor (S-SGT) Structured Cell," IEDM Proc. (2001) 33-36.

Tanaka et al., "Bit-Cost Scalable Technology for Low-Cost and Ultrahigh-Density Flash Memory," Toshiba Review, vol. 63, No. 2, 2008, pp. 28-31.

Kimura, et al. "3D Cells Make Terabit NAND Flash Possible," Nikkei Electronics Asia, Sep. 17, 2009, 6pgs.

International Search Report & Written Opinion, PCT/US2011/042566, Jan. 17, 2012.

Invitation to Pay Additional Fees & Partial International Search Report, PCT/US2011/042566, Sep. 28, 2011.

International Search Report, PCT/US2013/035567, Sep. 30, 2013, 6pgs.

International Search and Written Opinion, International Application No. PCT/US2013/041410, issued Dec. 20, 2013, 7pgs.

Office Action for U.S. Appl. No. 14/468,744, filed Aug. 26, 2014, dated Feb. 26, 2016 (16 sheets).

U.S. Appl. No. 15/189,458, filed Jun. 22, 2016, SanDisk Technologies LLC.

* cited by examiner

US 9,601,502 B2

MULTIHEIGHT CONTACT VIA STRUCTURES FOR A MULTILEVEL INTERCONNECT STRUCTURE

RELATED APPLICATION

This application is a continuation-in-part application of U.S. application Ser. No. 15/189,458 filed on Jun. 22, 2016, which is a divisional of U.S. application Ser. No. 14/468,744 filed on Aug. 26, 2014, the entire contents of which are incorporated by reference herein.

FIELD

The present disclosure relates generally to the field of metal interconnect structures, and specifically to multilevel metal interconnect structures including electrically conductive via structures having different heights, and methods of manufacturing the same.

BACKGROUND

Multilevel metal interconnect structures are routinely employed to provide electrical wiring for a high density circuitry, such as semiconductor devices on a substrate. Continuous scaling of semiconductor devices leads to a higher wiring density as well as an increase in the number of wiring levels. Recently, ultra high density storage devices have been proposed using a three-dimensional (3D) stacked memory structure sometimes referred to as a Bit Cost Scalable (BiCS) architecture. Such ultra high density storage devices include a large number of interconnect wiring levels. For example, a 3D NAND stacked memory device may include at least as many number of wiring levels as the total number of control gate electrodes employed for the 3D NAND stacked memory device.

Various schemes for constructing electrically conductive via structures extending to different electrically conductive electrodes located at different wiring levels of memory devices have been proposed in the art. For example, U.S. Pat. No. 8,394,716 to Hwang et al. and U.S. Patent Application Publication No. 2009/0230449 to Sakaguchi et al. teach formation of conductive via structures extending from a same top surface to top surfaces of electrically conductive electrodes located at different levels by staggering end portions of the electrically conductive electrodes. Specifically, end portions of electrically conductive electrodes are staggered such that an edge of each overlying electrically conductive electrode is laterally offset inward from an edge of any underlying electrically conductive electrodes throughout the entirety of a stack of the electrically conductive electrodes.

SUMMARY

According to an aspect of the present disclosure, a three-dimensional memory device is provided, which comprises: a first alternating stack of insulating layers and electrically conductive layers located over a substrate; memory stack structures extending through the alternating stack, each of the memory stack structures comprising a memory film and a vertical semiconductor channel extending substantially perpendicular to a top surface of the substrate and laterally surrounded by the memory film; an array of contact via structures located within the alternating stack and laterally spaced apart along a first horizontal direction and having different heights; and a peripheral semiconductor device located in a peripheral region on the substrate. Each contact via structure within the array of contact via structures is laterally surrounded by a respective insulating liner. Top surfaces of the plurality of contact via structures are located within a same horizontal plane. A bottom portion of each of the plurality of contact via structures is adjoined to a respective electrically conductive layer. Each contact via structure that passes through a topmost electrically conductive layer is laterally surrounded by each electrically conductive layer that overlies the respective electrically conductive layer to which the contact via structure is adjoined.

According to another aspect of the present disclosure, a method of forming a three-dimensional memory structure is provided, which comprises steps of: forming a peripheral semiconductor device on a semiconductor substrate; forming an alternating stack of sacrificial material layers and insulating layers over the peripheral semiconductor device and over a top surface of the substrate; forming contact openings partially through the alternating stack, wherein each of the contact openings extends through the alternating stack to a respective one of the sacrificial material layers; selectively removing the sacrificial material layers from the alternating stack to form lateral recesses extending substantially parallel to the top surface of the substrate between a respective pair of the insulating layers; forming electrically conductive layers in the lateral recesses; forming contact via structures in volumes of the contact openings; and forming a device contact via structure extending through levels of the alternating stack to the peripheral semiconductor device.

According to an aspect of the present disclosure, a method of making multi-level contacts is provided. An in-process multilevel device is provided, which comprises a device region and a contact region including a stack of plurality of alternating sacrificial material layers and insulating layers located over a major surface of a substrate. A plurality of contact openings is formed, each of which extends substantially perpendicular to the major surface of the substrate to the plurality of sacrificial material layers. Each of the plurality of contact openings extends through the stack to a respective one of the sacrificial material layers. The sacrificial material layers are selectively removed from the stack to form a plurality of recesses extending substantially parallel to the major surface of the substrate between the insulating layers. A plurality of electrically conductive via structures is deposited in the plurality of the contact openings and a plurality of electrically conductive electrodes in the plurality of recesses in one deposition step.

According to another aspect of the present disclosure, a method of making contact openings in a stack of layers is provided. A stack of plurality of alternating sacrificial material layers and insulating layers is formed over a major surface of a substrate. A mask with a plurality of openings is formed over the stack. A slimming layer is formed over the mask. The slimming layer is etched to reduce its thickness and width to expose a first opening in the mask. A portion of a first insulating layer exposed in the first opening is etched to form a portion of a first contact opening in the first insulating layer extending to a first sacrificial material layer located under the first insulating layer in the stack. The slimming layer is etched to reduce its thickness and width to expose a second opening in the mask. A portion of the first insulating layer exposed in the second opening is etched to form a portion of a second contact opening in the first insulating layer extending to the first sacrificial material layer. A portion of the first sacrificial material layer and a portion of a second insulating layer are etched through the first contact opening to extend the first contact opening to a second sacrificial material layer located under the second insulating layer in the stack. An insulating liner is formed on a sidewall of the first and the second contact openings.

According to yet another aspect of the present disclosure, a three-dimensional NAND device is provided, which includes a substrate having a major surface, and a stack of plurality of alternating word lines and insulating layers located over the major surface of the substrate and extending substantially parallel to the major surface of the substrate. The plurality of word lines comprise at least a first word line located in a first device level and a second word line located in a second device level located over the major surface of the substrate and below the first device level. The three-dimensional NAND device further includes a semiconductor channel. At least one end portion of the semiconductor channel extends substantially perpendicular to the major surface of the substrate through the stack. The three-dimensional NAND device further includes at least one charge storage region located adjacent to the semiconductor channel, and a plurality of electrically conductive via structures extending substantially perpendicular to the major surface of the substrate. Each of the plurality of electrically conductive via structures extends through the stack to contact an upper surface of a respective one of the plurality of word lines. An insulating liner is located around each of the plurality of electrically conductive via structures. The insulating liner isolates each electrically conductive via structure from all the word lines in the stack except a respective one of the plurality of word lines whose upper surface is contacted by the respective electrically conductive via structure.

According to still another aspect of the present disclosure, a method of forming contacts in a multilayer memory device is provided. An in-process memory device is provided, which includes a contact region, a device region, and a stack of alternating plurality of sacrificial material layers and insulating layers over a substrate and extending in a first direction substantially parallel to a major surface of the substrate from the contact region to the device region. A hard mask layer is formed over the contact region and the device region. A plurality of contact openings is formed in the contact region. Each contact opening extends in a second direction substantially perpendicular to the major surface of the substrate through the hard mask layer and a portion of the stack to a respective sacrificial material layer. An insulating liner is formed, which covers sidewalls of each contact opening of the plurality of contact openings. The insulating liner does not cover a bottom of each contact opening such that a portion of the respective sacrificial material layer is exposed at the bottom of the contact opening. A non-conformal layer is formed over the hard mask layer. The non-conformal layer covers a top opening of each contact opening to form a corresponding contact opening air gap.

According to even another aspect of the present disclosure, an in-process memory device is provided, which includes a contact region, a device region, and a stack of alternating plurality of sacrificial material layers and recesses over a substrate and extending in a first direction substantially parallel to a major surface of the substrate from the contact region to the device region. The in-process memory device further includes a hard mask layer formed over the contact region and the device region; a plurality of contact openings in the contact region, each contact opening extending in a second direction substantially perpendicular to the major surface of the substrate through the hard mask layer and a portion of the stack to a respective sacrificial material layer; an insulating liner covering sidewalls of each contact opening of the plurality of contact openings, wherein the insulating liner does not cover a bottom of each contact opening such that a portion of the respective sacrificial material layer is exposed at the bottom of the contact opening; and a non-conformal layer over the hard mask layer that covers a top opening of each contact opening to form a corresponding contact opening air gap. Each one of the plurality of recesses contacts a respective contact opening air gap.

BRIEF DESCRIPTION OF THE DRAWINGS

FIGS. 2, 4, 5, and 6 show bird's eye view of cut-out portions of the first exemplary structures. FIG. 14 includes an inset showing a magnified view of a portion of the first exemplary structure.

FIGS. 35, 37, 38, 39, and 41 show bird's eye view of cut-out portions of the third exemplary structures. FIG. 47 includes an inset showing a magnified view of a portion of the first exemplary structure.

DETAILED DESCRIPTION

Figure 1:
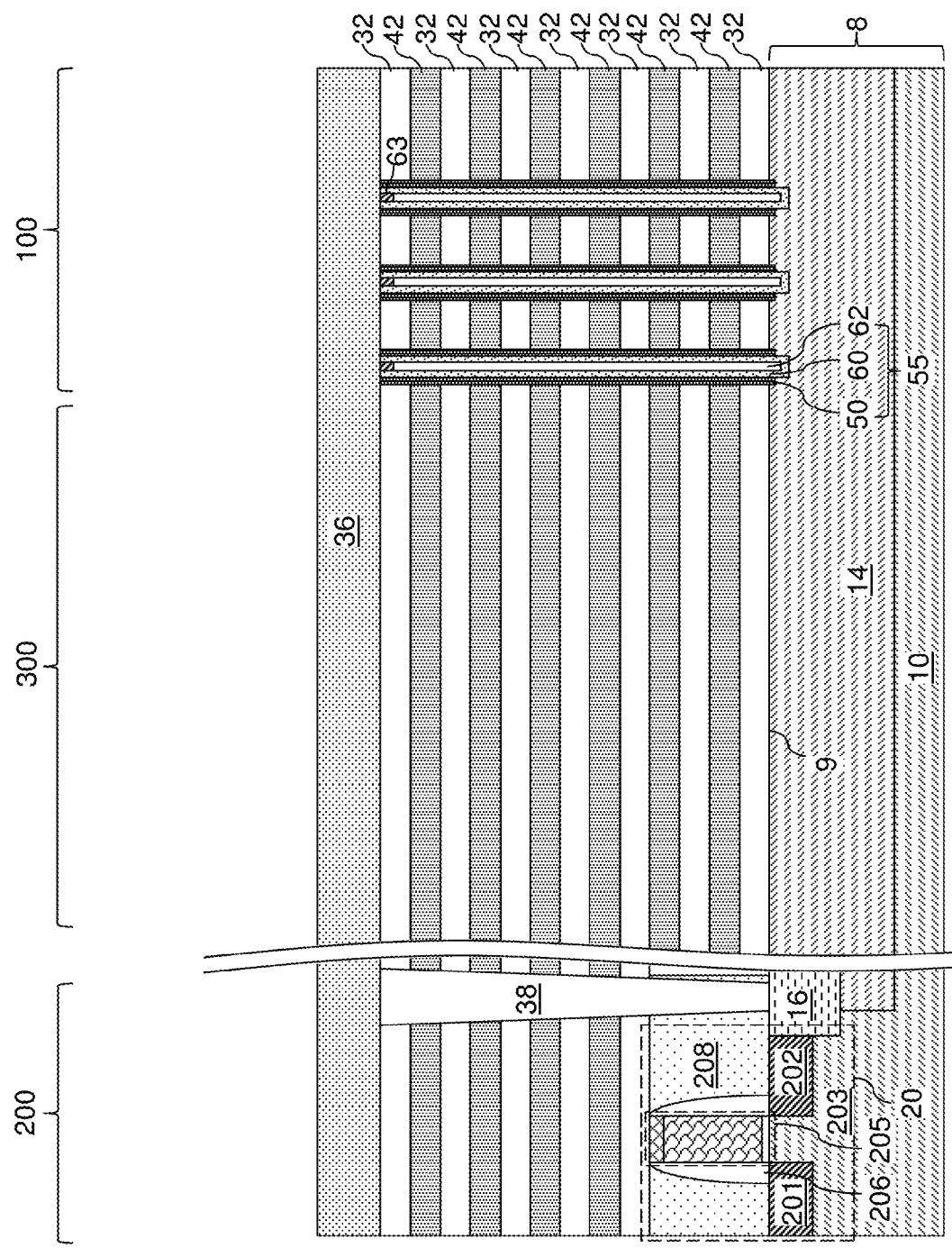
FIGS. 1-15 illustrate sequential vertical cross-sectional views of a first exemplary structure employed to fabricate a device structure containing vertical NAND memory devices at corresponding processing steps according to a first embodiment of the present disclosure.

As discussed above, the present disclosure is directed to multilevel metal interconnect structures including electrically conductive via structures having different heights, and methods of manufacturing the same, the various aspects of which are described below. The embodiments of the disclosure can be employed to form various structures including a multilevel metal interconnect structure, a non-limiting example of which includes semiconductor devices such as three-dimensional monolithic memory array devices comprising a plurality of NAND memory strings. The drawings are not drawn to scale. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure. As used herein, a first element located "on" a second element can be located on the exterior side of a surface of the second element or on the interior side of the second element.

A monolithic three dimensional memory array is one in which multiple memory levels are formed above a single substrate, such as a semiconductor wafer, with no intervening substrates. The term "monolithic" means that layers of each level of the array are directly deposited on the layers of each underlying level of the array. In contrast, two dimensional arrays may be formed separately and then packaged together to form a non-monolithic memory device. For example, non-monolithic stacked memories have been constructed by forming memory levels on separate substrates and vertically stacking the memory levels, as described in U.S. Pat. No. 5,915,167 titled "Three Dimensional Structure Memory." The substrates may be thinned or removed from the memory levels before bonding, but as the memory levels are initially formed over separate substrates, such memories are not true monolithic three dimensional memory arrays. The various three dimensional memory devices of the present disclosure include a monolithic three-dimensional NAND string memory device, and can be fabricated employing the various embodiments described herein.

The present inventors realized that the methods of Huang and Sakaguchi require lateral discontinuity of many electrically conductive electrodes at least along one direction within regions of the electrically conductive via contacts. Further, the methods of Huang and Sakaguchi prevent extension of any electrically conductive via contact through an area of a pre-existing electrically conductive electrode, thereby placing a significant limitation on the design and the density of the various components in a metal interconnect structure. At least some embodiments of the present disclosure provide methods for forming a high density multilevel metal interconnect structure without significant restrictions on the design of various metal interconnect components and/or with minimal processing complexity and cost.

According to various embodiments of the present disclosure, contact openings extending to sacrificial material layers located at different depths can be formed by sequentially exposing a greater number of openings in a mask layer by iterative alternation of trimming of a slimming layer over the mask layer and an anisotropic etch that recesses pre-existing contact openings by one level. In one embodiment, pairs of an electrically conductive via contact and an electrically conductive electrode can be simultaneously formed as integrated line and via structures. In another embodiment, encapsulated unfilled cavities can be formed in the contact openings by non-conformal deposition of a material layer, electrically conductive electrodes can be formed by replacement of portions of the sacrificial material layers, and the electrically conductive via contacts can be subsequently formed on the electrically conductive electrodes. A metal interconnect structure can be provided in which electrically conductive via contacts extending to electrically conductive electrodes located at different levels are provided with self-aligned insulating liner to provide electrical isolation from all other electrically conductive electrodes except one to which a respective electrically conductive via contact is electrically shorted.

Referring to FIG. 1, a first exemplary structure is illustrated, which can be employed, for example, to fabricate a device structure containing vertical NAND memory devices according to a first embodiment of the present disclosure. The first exemplary structure includes a substrate 8, which can be a semiconductor substrate. Various semiconductor devices can be formed on, or over, the substrate 8 employing methods known in the art. For example, an array of memory devices can be formed in a memory array region 100, and at least one peripheral device 20 can be formed in a peripheral device region 200. Electrically conductive via contacts to the electrically conductive electrodes of the devices in the memory array region 100 can be subsequently formed in a contact region 300.

The substrate 8 can include a substrate semiconductor layer 10. The substrate semiconductor layer 10 is a semiconductor material layer, and can include at least one elemental semiconductor material, at least one III-V compound semiconductor material, at least one II-VI compound semiconductor material, at least one organic semiconductor material, or other semiconductor materials known in the art. The substrate 8 has a major surface 9, which can be, for example, a topmost surface of the substrate semiconductor layer 10. The major surface 9 can be a semiconductor surface. In one embodiment, the major surface 9 can be a single crystalline semiconductor surface.

As used herein, a "semiconductor material" refers to a material having electrical conductivity in the range from $1.0 \times 10^{-5}$ Ohm-cm to $1.0 \times 10^5$ Ohm-cm, and is capable of producing a doped material having electrical conductivity in a range from 1 Ohm-cm to $1.0 \times 10^5$ Ohm-cm upon suitable doping with an electrical dopant. As used herein, an "electrical dopant" refers to a p-type dopant that adds a hole to a balance band within a band structure, or an n-type dopant that adds an electron to a conduction band within a band structure. As used herein, a "conductive material" refers to a material having electrical conductivity greater than 1.0 Ohm-cm. As used herein, an "insulator material" or a "dielectric material" refers to a material having electrical conductivity less than $1.0 \times 10^{-5}$ Ohm-cm. All measurements for electrical conductivities are made at the standard condition. Optionally, at least one doped well 14 can be formed within the substrate semiconductor layer 10 such as a single crystalline silicon surface.

Optionally, select gate electrodes (not shown) can be formed within, or on top of, the substrate semiconductor layer 10 using any suitable methods for implementing the array of vertical NAND strings. For example, a lower select gate device level may be fabricated as described in U.S. patent application Ser. No. 14/133,979, filed on Dec. 19, 2013, U.S. patent application Ser. No. 14/225,116, filed on Mar. 25, 2014, and/or U.S. patent application Ser. No. 14/225,176, filed on Mar. 25, 2014, all of which are incorporated herein by reference.

At least one shallow trench isolation structure 16 and/or at least one deep trench isolation structure (not shown) may be employed to provide electrical isolation among various semiconductor devices on the substrate 8. The at least one peripheral device 20 formed in the peripheral device region 200 can include any device known in the art and needed to support the operation of the semiconductor devices in the memory array region 100. The at least one peripheral device 20 can include a driver circuit associated with the array of the memory devices in the memory array region 100. The at least one peripheral device can comprise transistor device in the driver circuit. In one embodiment, the at least one peripheral device can include one or more field effect transistors, each of which can include a source region 201, a drain region 202, a body region 203 (e.g., a channel region), a gate stack 205, and a gate spacer 206. The gate stack 205 can include any type of gate stack known in the art. For example, each gate stack 205 can include, from one side to another, a gate dielectric, a gate electrode, and an optional gate cap dielectric. Optionally, a planarization dielectric layer 208 including a dielectric material may be employed in the peripheral device region 200 to facilitate planarization of the portion of material stacks to be subsequently formed on the substrate 8.

A stack of alternating layers of a first material and a second material different from the first material is formed over a top surface of the substrate 8. In one embodiment, the stack can include an alternating plurality of insulator layers 32 and sacrificial layers 42. As used herein, an "an alternating plurality" of first elements and second elements refers to a structure in which an instance of the first elements and an instance of the second elements form a unit that is repeated within a stacked structure. The first elements may have the same thickness there amongst, or may have different thicknesses. The second elements may have the same thickness there amongst, or may have different thicknesses.

The stack of the alternating layers is herein referred to as an alternating stack (32, 34). In one embodiment, the alternating stack (32, 42) can include insulator layers 32 composed of the first material, and sacrificial material layers 42 composed of a second material different from that of insulator layers 32. The sacrificial material layers 42 may comprise an electrically insulating material, a semiconductor material, or a conductive material. The second material of the sacrificial material layers 42 can be subsequently replaced with electrically conductive electrodes which can function, for example, as control gate electrodes of a vertical NAND device.

The first material of the insulator layers 32 can be at least one electrically insulating material. As such, each insulator layer 32 can be an insulating material layer. Electrically insulating materials that can be employed for the insulator layers 32 include, but are not limited to silicon oxide (including doped or undoped silicate glass), silicon nitride, silicon oxynitride, organosilicate glass (OSG), spin-on dielectric materials, dielectric metal oxides that are commonly known as high dielectric constant (high-k) dielectric oxides (e.g., aluminum oxide, hafnium oxide, etc.) and silicates thereof, dielectric metal oxynitrides and silicates thereof, and organic insulating materials.

The second material of the sacrificial material layers 42 is a sacrificial material that can be removed selective to the first material of the insulator layers 32. As used herein, a removal of a first material is "selective to" a second material if the removal process removes the first material at a rate that is at least twice the rate of removal of the second material. The ratio of the rate of removal of the first material to the rate of removal of the second material is herein referred to as a "selectivity" of the removal process for the first material with respect to the second material. Non-limiting examples of the second material include silicon nitride, an amorphous semiconductor material (such as amorphous silicon), and a polycrystalline semiconductor material (such as polysilicon).

In one embodiment, the insulator layers 32 can include silicon oxide, and sacrificial material layers can include silicon nitride sacrificial material layers. The first material of the insulator layers 32 can be deposited, for example, by chemical vapor deposition (CVD). For example, if silicon oxide is employed for the insulator layers 32, tetraethyl orthosilicate (TEOS) can be employed as the precursor material for the CVD process. The second material of the sacrificial material layers 42 can be formed, for example, CVD or atomic layer deposition (ALD).

The sacrificial material layers 42 can be suitably patterned so that conductive material portions to be subsequently formed by replacement of the sacrificial material layers 42 can function as electrically conductive electrodes, such as the control gate electrodes of the monolithic three-dimensional NAND string memory devices to be subsequently formed. The sacrificial material layers 42 may comprise a portion having a strip shape extending substantially parallel to the major surface 9 of the substrate 8.

The thicknesses of the insulator layers 32 and the sacrificial material layers 42 can be in a range from 20 nm to 50 nm, although lesser and greater thicknesses can be employed for each insulator layer 32 and for each sacrificial material layer 42. The number of repetitions of the pairs of an insulator layer 32 and a sacrificial material layer (e.g., a control gate electrode or a sacrificial material layer) 42 can be in a range from 2 to 1,024, and typically from 8 to 256, although a greater number of repetitions can also be employed. The top and bottom gate electrodes in the stack may function as the select gate electrodes. In one embodiment, each sacrificial material layer 42 in the alternating stack (32, 42) can have a uniform thickness that is substantially invariant within each respective sacrificial material layer 42.

A lithographic material stack (not shown) including at least a photoresist layer can be formed over the alternating stack (32, 42), and can be lithographically patterned to form openings therein. The pattern in the lithographic material stack can be transferred through the entirety of the alternating stack (32, 42) by at least one anisotropic etch that employs the patterned lithographic material stack as an etch mask. Portions of the alternating stack (32, 42) underlying the openings in the patterned lithographic material stack are etched to form memory openings. In other words, the transfer of the pattern in the patterned lithographic material stack through the alternating stack (32, 42) forms the memory opening through the alternating stack (32, 42). The chemistry of the anisotropic etch process employed to etch through the materials of the alternating stack (32, 42) can alternate to optimize etching of the first and second materials in the alternating stack (32, 42). The anisotropic etch can be, for example, a series of reactive ion etches. Optionally, a sacrificial etch stop layer (not shown) may be employed between the alternating stack (32, 42) and the substrate 8. The sidewalls of the memory openings can be substantially vertical, or can be tapered. The patterned lithographic material stack can be subsequently removed, for example, by ashing.

As used herein, a first element "overlies" a second element if a first horizontal plane including the bottommost point of the first element is within, or above, a second horizontal plane including a topmost point of the second element and if there exits an areal overlap between the area of the first element and the area of the second element in a see-through view along a direction perpendicular to the first and second horizontal planes. If a first element overlies a second element, the second element "underlies" the first element.

Each of the memory openings can include a sidewall (or a plurality of sidewalls) that extends substantially perpendicular to the major surface of the substrate 8 and is defined by the physically exposed sidewall surfaces of the alternating stack (32, 42,).

A memory stack structure 55 can be formed within each memory opening through the alternating stack (32, 42). The memory stack structures 55 can be formed, for example, by depositing a memory film layer in the memory openings and over the alternating stack (32, 42), and by anisotropically etching the memory film layer. The memory film layer can be a stack of continuous material layers that overlie the entirety of the alternating stack (32, 42). The memory film layer contacts all sidewall surface(s) and all bottom surface(s) of the memory openings. The memory film layer is a continuous film stack that provides the functionality of charge storage in the absence of an external electrical bias voltage, while enabling charge transfer in the presence of a suitable external electrical bias voltage. In one embodiment, the memory film layer can be a stack, in the order of formation, of a blocking dielectric layer, a charge storage layer, and a tunnel dielectric layer. In one embodiment, a plurality of floating gates or a charge storage dielectric can be located between the tunneling dielectric layer and the blocking dielectric layer.

The blocking dielectric layer contacts the sidewalls of the memory openings. Specifically, the blocking dielectric layer can contact the sidewalls of the sacrificial material layers 42. The blocking dielectric layer may include one or more dielectric material layers that can function as the dielectric material(s) of a control gate dielectric between the sacrificial material layers 42 and charge storage regions to be subsequently formed out of the charge storage layer. The blocking dielectric layer can include silicon oxide, a dielectric metal oxide, a dielectric metal oxynitride, or a combination thereof. In one embodiment, the blocking dielectric layer can include a stack of at least one silicon oxide layer and at least one dielectric metal oxide layer. The blocking dielectric layer can be formed by a conformal deposition process such as chemical vapor deposition (CVD) and/or atomic layer deposition (ALD), and/or by deposition of a conformal material layer (such as an amorphous silicon layer) and subsequent conversion of the conformal material layer into a dielectric material layer (such as a silicon oxide layer). The thickness of the blocking dielectric layer can be in a range from 6 nm to 24 nm, although lesser and greater thicknesses can also be employed. Alternatively, the blocking dielectric layer may be omitted from the memory opening, and instead be formed through the backside contact trench in recesses formed by removal of the sacrificial material layers 42 prior to forming the metal control gate electrodes through the backside contact trench.

The charge storage layer includes a dielectric charge trapping material, which can be, for example, silicon nitride, or a conductive material such as doped polysilicon or a metallic material. In one embodiment, the charge storage layer includes silicon nitride. The charge storage layer can be formed as a single charge storage layer of homogeneous composition, or can include a stack of multiple charge storage material layers. The multiple charge storage material layers, if employed, can comprise a plurality of spaced-apart floating gate material layers that contain conductive materials (e.g., metal such as tungsten, molybdenum, tantalum, titanium, platinum, ruthenium, and alloys thereof, or a metal silicide such as tungsten silicide, molybdenum silicide, tantalum silicide, titanium silicide, nickel silicide, cobalt silicide, or a combination thereof) and/or semiconductor materials (e.g., polycrystalline or amorphous semiconductor material including at least one elemental semiconductor element or at least one compound semiconductor material). Alternatively or additionally, the charge storage layer may comprise an insulating charge trapping material, such as one or more silicon nitride segments. Alternatively, the charge storage layer may comprise conductive nanoparticles such as metal nanoparticles, which can be, for example, ruthenium nanoparticles. The charge storage layer can be formed, for example, by chemical vapor deposition (CVD), atomic layer deposition (ALD), physical vapor deposition (PVD), or any suitable deposition technique for the selected material(s) for the charge storage layer. The thickness of the charge storage layer can be in a range from 2 nm to 20 nm, although lesser and greater thicknesses can also be employed.

The tunnel dielectric layer includes a dielectric material through which charge tunneling can be performed under suitable electrical bias conditions. The charge tunneling may be performed through hot-carrier injection or by Fowler-Nordheim tunneling induced charge transfer depending on the mode of operation of the monolithic three-dimensional NAND string memory device to be formed. The tunneling dielectric layer can include silicon oxide, silicon nitride, silicon oxynitride, dielectric metal oxides (such as aluminum oxide and hafnium oxide), dielectric metal oxynitride, dielectric metal silicates, alloys thereof, and/or combinations thereof. In one embodiment, the tunneling dielectric layer can include a stack of a first silicon oxide layer, a silicon oxynitride layer, and a second silicon oxide layer, which is commonly known as an ONO stack. In one embodiment, the tunneling dielectric layer can include a silicon oxide layer that is substantially free of carbon or a silicon oxynitride layer that is substantially free of carbon. The thickness of the tunnel dielectric layer can be in a range from 2 nm to 20 nm, although lesser and greater thicknesses can also be employed.

Optionally, a permanent channel material layer (such as a polysilicon layer) and/or a sacrificial material layer (such as a dielectric material layer) may be formed on the memory film layer. The memory film layer (and any additional layer such as a permanent channel material layer or a sacrificial material layer) can be anisotropically etched so that horizontal portions of the memory film layer (and any additional layer) are removed from above the top surface of the alternating stack (32, 42) and at the bottom of each memory opening. Each remaining vertical portion of the memory film layer that remains within a memory opening after the anisotropic etch constitutes a memory film 50. Each memory film 50 can be homeomorphic to a torus. As used herein, an element is homeomorphic to a geometrical shape if the shape of the element can be mapped to the geometrical shape by continuous deformation without creation or destruction of any hole.

A semiconductor channel 60 can be formed on inner sidewalls of each memory film 50 by deposition of a semiconductor material layer and a subsequent anisotropic etch of the semiconductor material layer. The semiconductor material layer can include a doped polycrystalline semiconductor material (such as doped polysilicon), or can include a doped amorphous semiconductor material (such as amorphous silicon) that can be subsequently converted into a doped polycrystalline semiconductor material after a suitable anneal at an elevated temperature.

Optionally, a dielectric core 62 can be formed within a cavity inside each semiconductor channel 60, for example, by deposition of a dielectric material such as silicon oxide, and subsequent planarization of the dielectric material. The planarization of the dielectric material removes the portion of the deposited dielectric material from above the top surface of the horizontal plane including the top surface of the alternating stack (32, 42). The planarization of the dielectric material can be performed, for example, by chemical mechanical planarization. Each remaining portion of the dielectric material inside a memory opening constitutes a dielectric core 62. The dielectric core 62 is an optional component, and a combination of a memory film 50 and a semiconductor channel 60 may completely fill a memory opening. A set of a memory film 50, a semiconductor channel 60, and a dielectric core 62 within a same memory opening constitutes a memory stack structure 55.

Drain regions 63 can be formed by recessing a top portion of each dielectric core and depositing a doped semiconductor material. The doped semiconductor material can be, for example, doped polysilicon. Excess portions of the deposited semiconductor material can be removed from above the top surface of the alternating stack (32, 42), for example, by chemical mechanical planarization (CMP) or a recess etch.

Optionally, at least one dielectric support pillar 38 may be formed through the alternating stack (32, 42). As an optional structure, the at least one dielectric support pillar 38 may, or may not, be present within the first exemplary structure. In one embodiment, a dielectric support pillar 38 can be formed at each boundary between a first device region in which replacement of the portions of the sacrificial material layers 42 therein with electrically conductive electrodes is desired and a second device region in which replacement of the portions of the sacrificial material layers 42 therein with electrically conductive electrodes is not desired.

A mask layer 36 can be formed over the alternating stack (32, 42), the memory stack structures 55, and the drain regions 63. The mask layer 36 functions as a mask during a subsequent etch process, and as such, can be a hard mask layer. The mask layer 36 can be a dielectric material layer including a material that is different from the second material, i.e., the material of the sacrificial material layers 42. The mask layer 36 can include a dielectric material such as a dielectric metal oxide (such as $Al_2O_3$, $HfO_2$, and $LaO_2$), dopes silicate glass, undoped silicate glass. The mask layer 36 can be deposited, for example, by chemical vapor deposition. The thickness of the mask layer 36 can be in a range from 30 nm to 1,000 nm, although lesser and greater thicknesses can also be employed.

Figure 2:
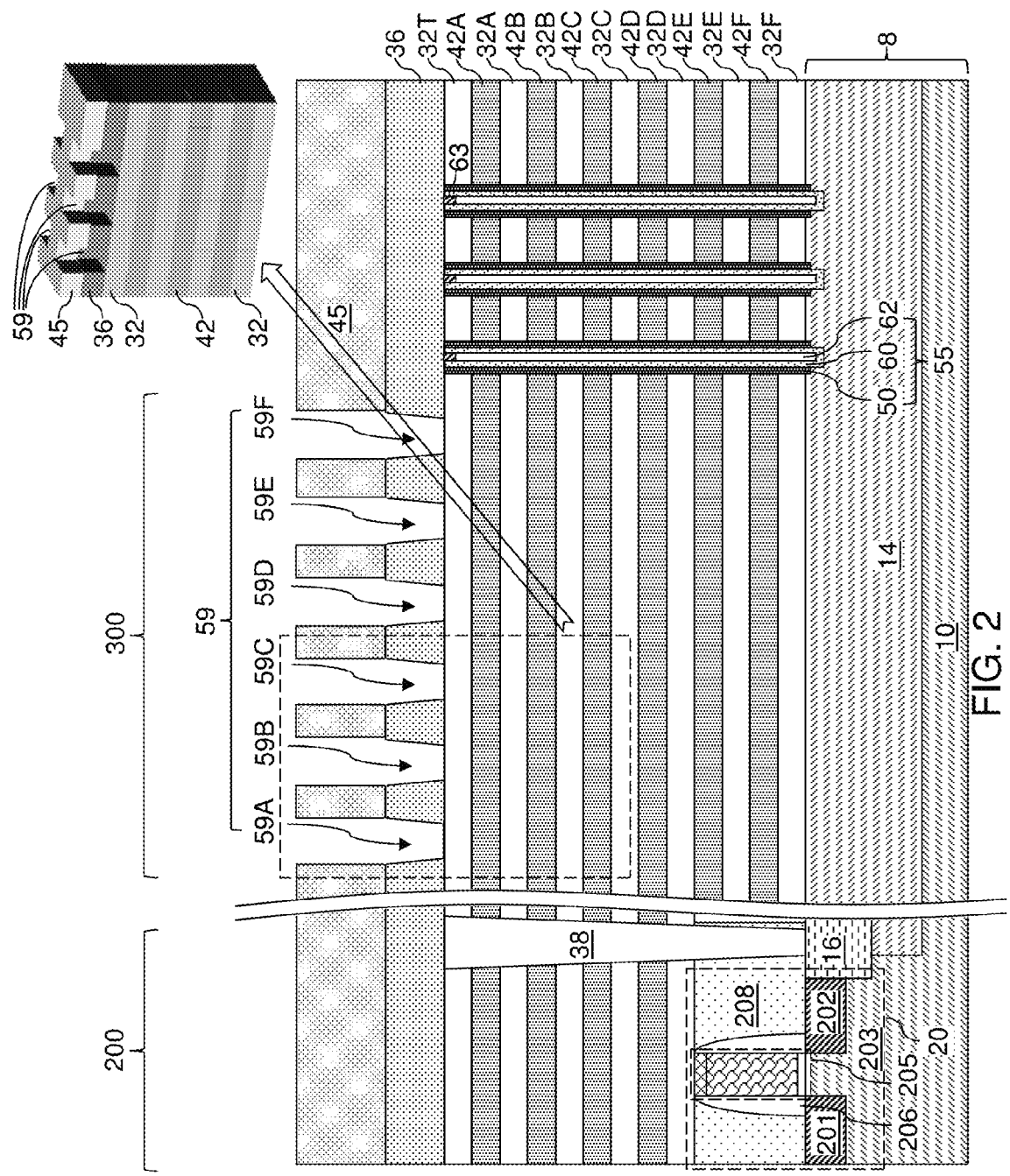

Referring to FIG. 2, a photoresist layer 45 (and optionally additional lithographic material layers such as an organic planarization layer and/or an antireflective coating layer) can be formed over the top surface of the mask layer 36. The photoresist layer 45 can be lithographically patterned to form a plurality of openings therein. The plurality of openings in the photoresist layer 45 can be formed in areas in which formation of contact openings is desired. As used herein, a contact opening refers to a cavity having sidewalls that extend from, and adjoin, a top surface of a structure and extend to a depth within the structure. The bottom of a contact opening may have a surface vertically recessed from the top surface of the structure, or can have an opening that is connected to another cavity underlying the contact opening. A contact opening as initially formed may be a cavity having an opening, and can be subsequently filled with at least one material portion.

The locations of the openings in the photoresist layer 45 can be selected to include areas of the electrically conductive via contacts to be subsequently formed and to extend to different levels of the alternating stack (32, 42). As used herein, a "level" of a structure including alternating layers is defined as the relative position of a unit of repetition, which is a pair of a first material layer and a second material layer, within the structure. Each adjoining pair of a first material layer and a second material layer within a structure containing the alternating layers can be assigned an integer selected from a set of positive integers such that the assigned integer increases by 1, or decreases by one, as one counts each pair of the first and second material layers from one end of the structure to the opposite end of the structure. Each integer corresponds to a level (e.g., level 1) within the structure.

The pattern in the openings of the photoresist layer 45 can be transferred into the mask layer 36 by an etch, which can be an anisotropic etch that employs the photoresist layer 45 as an etch mask. For example, the anisotropic etch can be a reactive ion etch. Upon transfer of the pattern in the photoresist layer 45 through the mask layer 36, a plurality of openings 59 is formed within the mask layer 36. The plurality of openings can form a two dimensional array of openings that extend along two different horizontal directions.

For the purpose of facilitating description of the various embodiments of the present disclosure, the different levels of the material layers of the present disclosure are assigned different level names. The topmost layer among the insulator layers 32 is herein referred to as a topmost insulator layer 32T. In an alternating stack (32, 42) including a total of N sacrificial material layers, the sacrificial material layer 42 contacting the bottom surface of the topmost insulator layer 32T is herein referred to as a first-from-top sacrificial material layer 42A or an N-th-from-bottom sacrificial material layer. The insulator layer 32 contacting the bottom surface of the first-from-top sacrificial material layer 42A (which is the N-th-from-bottom sacrificial material layer) is herein referred to as a first-from-top insulator layer 32A. The first-from-top sacrificial material layer 42A and the first-from-top insulator layer 32A collectively constitute a first-from-top level or an N-th-from-bottom level. For every integer i that is greater than 1 and not greater than the total number N of the sacrificial material layers 42 in the alternating stack (32, 42), the sacrificial material layer 42 contacting the bottom surface of the (i−1)-th insulator layer is herein referred to as the i-th-from-top sacrificial material layer or the (N+1−i)-th-from-bottom sacrificial material layer. Similarly, for every integer i that is greater than 1 and not greater than the total number of the sacrificial material layers 42 in the alternating stack (32, 42), the insulator layer 32 contacting the bottom surface of the i-th sacrificial material layer is herein referred to as the i-th-from-top insulator layer or the (N+1−i)-th-from-bottom insulator layer. If a total of N sacrificial material layers 42 exist in the alternating stack (32, 42), the N-th insulator layer is the insulator layer that is the most proximal to the substrate 8 among the insulator layers 32 in the alternating stack (32, 42).

Thus, the alternating stack (32, 42) includes, from top to bottom, a topmost insulator layer 32T, a first-from-top sacrificial material layer 42A, a first-from-top insulator layer 32A, a second-from-top sacrificial material layer 42B, a second-from-top insulator layer 32B, an alternating stack including at least one intermediate sacrificial material layer 42C and at least one intermediate insulator layer 32C, an (N−2)-th-from-top sacrificial material layer 42D, an (N−2)-th-from-top insulator layer 32D, an (N−1)-th-from-top sacrificial material layer 42E, an (N−2)-th-from-top insulator layer 32E, an N-th-from-top sacrificial material layer 42F, and an N-th-from-top insulator layer 32F. It is understood that an insulator layer 32 can refer to any of, or each of, the various insulator layers (32A, 32B, 32C, 32D, 32E, 32F), and a sacrificial material layer 42 can refer to any of, or each of, the various sacrificial material layers (42A, 42B, 42C, 42D, 42E, 42F). Further, insulator layers 32 can refer to any plurality of, or all of, the various insulator layers (32A, 32B, 32C, 32D, 32E, 32F), and sacrificial material layers 42 can refer to any plurality of, or all of, the various sacrificial material layers (42A, 42B, 42C, 42D, 42E, 42F).

The plurality of openings 59 in the mask layer 36 can include at least one first opening 59A that is formed in each area in which it is desired to form a contact opening that extends to the N-th-from-top sacrificial material layer 42F upon full formation, i.e., at the end of processing steps that completes formation of the contact opening. The N-th-from-top sacrificial material layer 42F is the sacrificial material layer 42 that is most proximal to the substrate 8 and most distal from the top surface of the alternating stack (32, 42). The plurality of openings 59 in the mask layer 36 can further include at least one second opening 59B that is formed in each area in which it is desired to form a contact opening that extends to the (N−1)-th-from-top sacrificial material layer 42E upon full formation. The plurality of openings 59 in the mask layer 36 can further include at least one third opening 59C that is formed in each area in which it is desired to form a contact opening that extends to the (N−2)-th-from-top sacrificial material layer 42D upon full formation. The plurality of openings 59 in the mask layer 36 can further include at least one intermediate-level opening 59D that formed in each area in which it is desired to form a contact opening that extends to a sacrificial material layer 42 located between the (N−2)-th-from-top sacrificial material layer 42D and the second-from-top sacrificial material layer 42B upon full formation. The plurality of openings 59 in the mask layer 36 can further include at least one (N−1)-th opening 59E that formed in each area in which it is desired to form a contact opening that extends to the second-from-top sacrificial material layer 42B upon full formation. The plurality of openings 59 in the mask layer 36 can further include at least N-th opening 59F that formed in each area in which it is desired to form a contact opening that extends to the first-from-top sacrificial material layer 42A upon full formation.

In one embodiment, the plurality of openings 59 can be arranged as a linear array such that each opening in the mask layer 36 that corresponds to a contact opening to extend to a deeper depth upon full formation is located to a predetermined side of the linear array with respect to any opening in the mask layer that corresponds to a contact opening to extend to a shallower depth upon full formation. In one embodiment, the plurality of openings 59 can be periodic along one direction such that the pitch between each neighboring pair of openings 59 is the same. In one embodiment, the pitch between each neighboring pair of openings 59 is can increase along one direction with the increase in the target depth of the corresponding contact openings in order to prevent electrical shorts due to lateral broadening of contact openings with depth.

Figure 3:
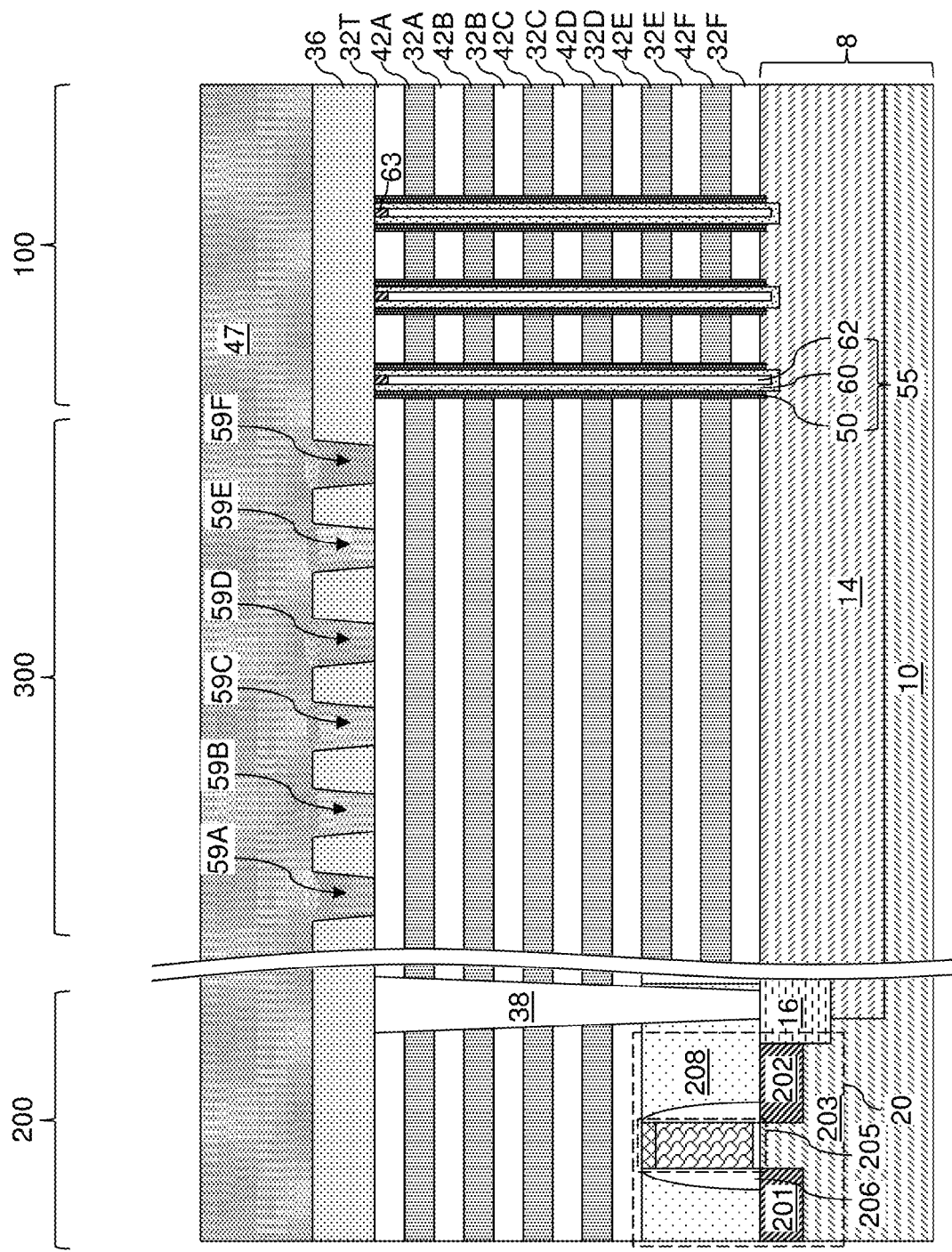

Referring to FIG. 3, a layer of a slimming material is formed over the mask layer 36. The layer of the slimming material is herein referred to as a slimming layer 47. The slimming layer 47 includes a slimming material which refers to a material that can be trimmed in multiple trimming processes. As used herein, a "trimming" process refers to a process in which peripheral portions of a structure is removed while another portion located inside the peripheral portion remains after the end of the process. The slimming layer 47 can be, for example, a photoresist layer, an organic material layer, a dielectric material layer, or a semiconductor material layer. The thickness of the slimming layer 47, as measured from the top surface of the mask layer 36, can be greater than the lateral extent of the plurality of openings 59 along a horizontal direction that encompasses all types of openings (59A, 59B, 59C, 59D, 59E, 59F) that correspond to different depths of contact openings to be subsequently formed.

In one embodiment, the slimming layer 47 can be a photoresist layer. In another embodiment, the slimming layer 47 can be an organic material layer including an organic material that can be trimmed, for example, by a wet etch employing a solvent. In yet another embodiment, the slimming layer 47 can be a dielectric material layer that includes a dielectric material that is different from the materials of the mask layer 36 and the insulator layers 32 and can be uniformly etched or recessed by a wet etch or a dry etch. In still another embodiment, the slimming layer 47 can be a semiconductor material layer that includes a semiconductor material that can be uniformly etched or recessed by a wet etch or a dry etch. The thickness of the slimming layer 47 can be in a range from 1 micron to 10 microns, although lesser and greater thicknesses can also be employed. In one embodiment, the slimming layer 47 can be a photoresist layer having a thickness in a range from 2 microns to 5 microns.

Figure 4:
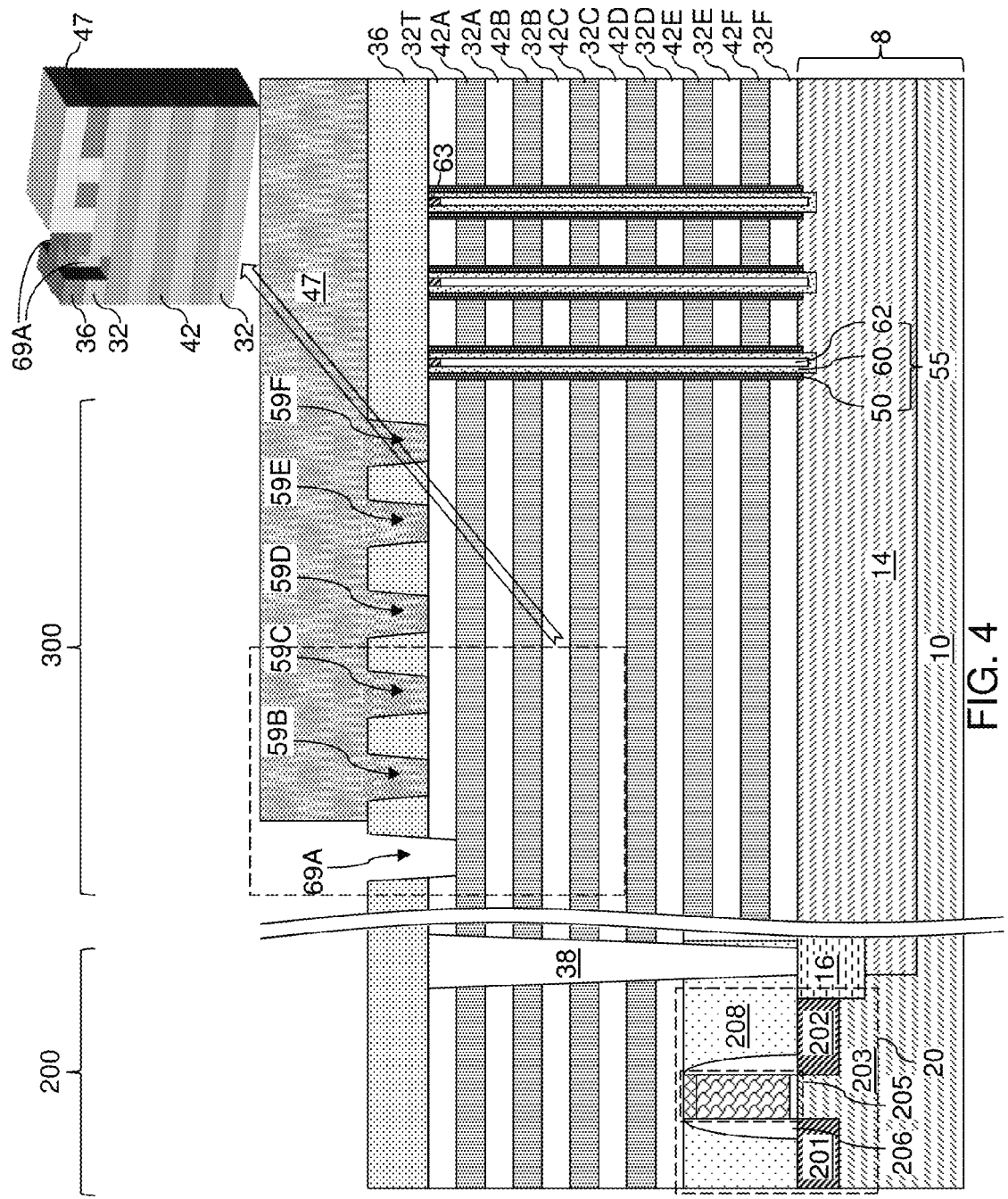

Referring to FIG. 4, the slimming layer 47 can be patterned to physically expose the at least one first opening 59A (See FIG. 3), while all other openings (59B, 59C, 59D, 59E, 59F) are covered by a remaining portion of the slimming layer 47. If the slimming layer 47 is a photoresist layer, the slimming layer 47 can be lithographically patterned, i.e., by a combination of lithographic exposure and development. If the slimming layer 47 is not a photoresist layer, the slimming layer 47 can be patterned by application of a photoresist layer thereupon, lithographic patterning of the photoresist layer, and etching of the portions of the slimming layer 47 that is not covered by the remaining portion of the photoresist layer, for example, by an anisotropic etch. The photoresist layer may be removed after patterning the slimming layer 47. A remaining portion of the slimming layer 47 fills each opening (59B, 59C, 59D, 59E, 59F) in the mask layer 36 except the at least one first opening 59A.

Each portion of the topmost insulator layer 32 underlying the at least one first opening is anisotropically etched employing the combination of the mask layer 36 and the slimming layer 47 as an etch mask. A first contact opening 69A is formed through the mask layer 36 and the topmost insulator layer 32 within each area of the at least one first opening 59A in the mask layer 36. In one embodiment, the chemistry of the anisotropic etch can be selected such that the bottom surface of each first contact opening 69A is formed at the top surface of, or between the top surface and the bottom surface of, or at the bottom surface of topmost insulator layer 32 at the end of the processing steps of FIG. 4. In one embodiment, the chemistry of the anisotropic etch can be selective to the second material, i.e., the material of the sacrificial material layers 42. In this case, the bottom surface of each first contact opening 69A can be formed at the top surface of the first-from-top sacrificial material layer 42A. Alternately, the anisotropic etch process can include multiple steps so that portions of the topmost insulator layer 32 and the first-from-top sacrificial material layer 42A underlying each first opening 59A (See FIG. 3) can be etched by the anisotropic etch. In this case, the bottom surface of each first contact opening 69A can be formed at the top surface of the first-from-top insulator layer 32A, which is coplanar with the bottom surface of the first-from-top sacrificial material layer 42A.

Figure 5:
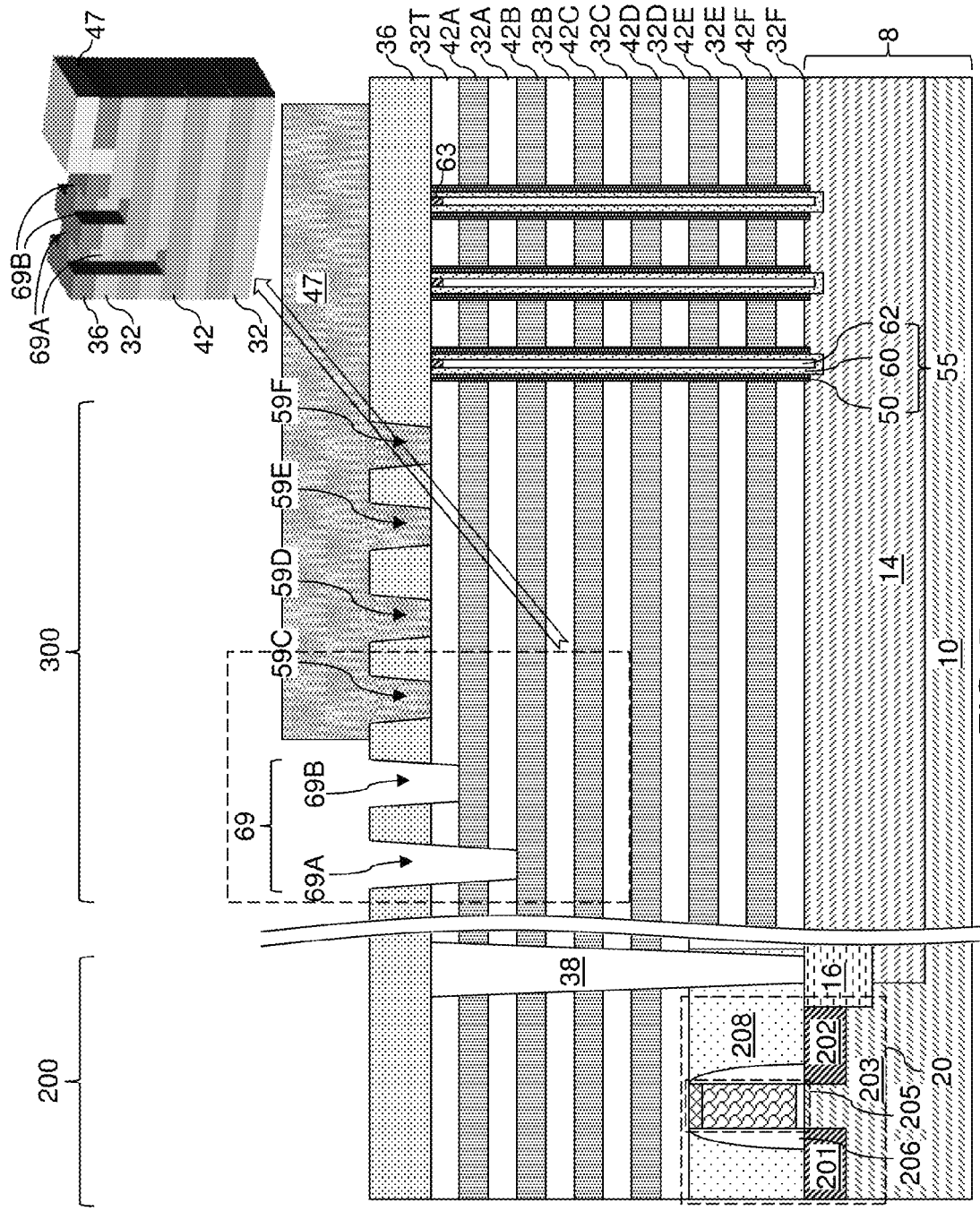

Referring to FIG. 5, a trimming process is performed to trim the slimming layer 47. A physically exposed peripheral portion including a top portion of the slimming layer 47 and a sidewall portion that overlies the at least one second opening 59B (See FIG. 4) can be removed by the slimming process, while all other openings (59C, 59D, 59E, 59F) other than the at least one first and second openings (59A, 59B) are covered by the remaining portion of the slimming layer 47. The trimming process can vary depending on the nature of the slimming material in the slimming layer 47. For example, if the slimming layer 47 includes a photoresist layer, the trimming process can be an ashing process in which the ashing rate is limited by the supply of oxidizing agents (such as oxygen). Alternatively, the trimming process can be a wet etch process or a dry etch process in which the rate of removal of the slimming material is limited by the process time during which the slimming material is physically exposed to an etchant or a solvent. The slimming material is partially removed to reduce a lateral extent thereof and a thickness thereof during the trimming process.

An anisotropic etch process is performed to vertically extend the at least one first contact opening 69A downward through a pair of a sacrificial material layer 42 and an insulator layer 32. If the bottom surface of each first contact opening 69A is located at the top surface of the first-from-top sacrificial material layer 42A at the end of the processing steps of FIG. 4, the bottom surface of each first contact opening 69A is recessed through the first-from-top sacrificial material layer 42A during a first step of the anisotropic etch, and then further recessed through the first-from-top insulator layer 32A during a second step of the anisotropic etch. During the second step, a second contact opening 69B can be formed through the physically exposed openings in the mask layer 36 and the topmost insulator layer 32 concurrently with the recessing of the first contact opening(s) 69A through the first-from-top insulator layer 32A. Each second contact opening 69B can be formed within an area of a second opening 59B within the mask layer 36.

If the bottom surface of each first contact opening 69A is located at the top surface of the first-from-top insulator layer 32A at the end of the processing steps of FIG. 4, the bottom surface of each first contact opening 69A is recessed through the first-from-top insulator layer 32A during a first step of the anisotropic etch, and then further recessed through the second-from-top sacrificial material layer 42B during a second step of the anisotropic etch. During the first step, a second contact opening 69B can be formed through the mask layer 36 and the topmost insulator layer 32 concurrently with the recessing of the first contact opening(s) 69A through the first-from-top insulator layer 32A. During the second step, the second contact opening 69B can be recessed through the first-from-top sacrificial material layer 42A concurrently with the recessing of the first contact opening(s) 69A through the second-from-top sacrificial material layer 42B. Each second contact opening 69B can be formed within an area of a second opening 59B within the mask layer 36. A cycle of a trimming process and an etch process has the effect of increasing the total number of contact openings 69 and extending the depth of each pre-existing contact opening 69. The depth of each contact opening 69 is measured from the periphery of the topmost portion of the contact opening 69, i.e., from the horizontal plane including the top surface of the mask layer 36.

Figure 6:
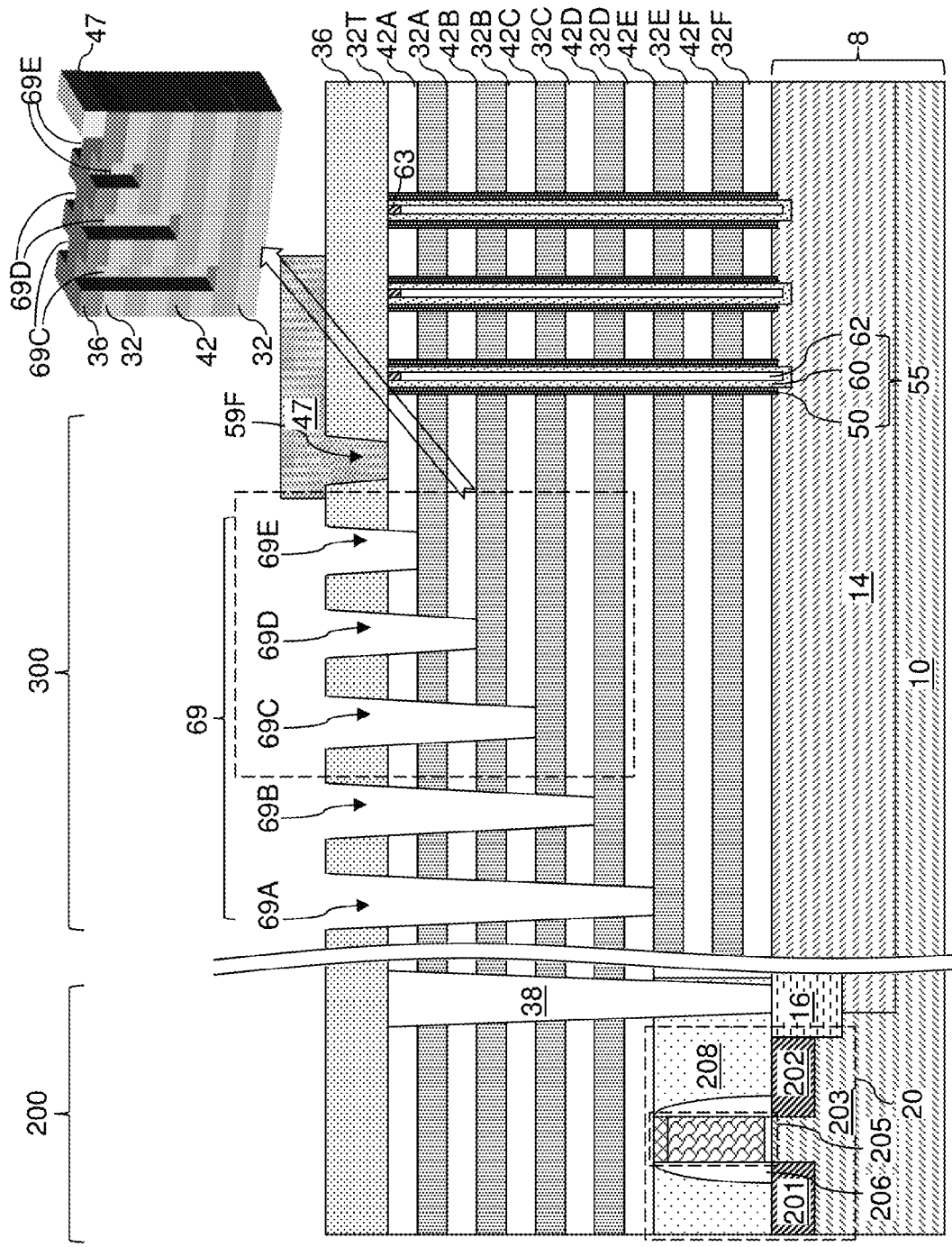

Referring to FIG. 6, additional contact openings (69C, 69D, 69E) can be formed and the depths of pre-existing contact openings (69A, 69B) can be vertically extended by iteratively, and alternately, performing etch processes and trimming processes. The processing conditions of each trimming processes and etch processes can be substantially the same as in the corresponding trimming process and the corresponding etch process of FIG. 5. Portions of the alternating stack (32, 42) located underneath openings 59 (See FIG. 3) that are not covered by the slimming material are etched in each of the etch processes. A total number of openings 59 not covered by the slimming material can increase in each of the trimming processes by partial removal of the slimming material.

Each contact opening 69 that is present at an end of a previous etch process vertically extends downward during the next etch process by the total thickness of a pair of a sacrificial material layer 42 and an insulator layer 32 that is located immediately below the contact opening 69 at the end of the previous etch process. Each etch process extends the depth of each pre-existing contact opening 69 by the total thickness of a pair of a sacrificial material layer 42 and an insulator layer 32 that is located immediately below the respective pre-existing contact opening 69.

In general, the plurality of contact openings 69 can be formed by simultaneously etching a portion of a first insulator layer 32 (e.g., an (i+1)-th-from-top insulator layer 32 in which i is less than N) in the alternating stack (32, 42) within an area of a first contact opening 69A and a portion of a second insulator layer 32 (e.g., an i-th-from-top insulator layer 32) in the alternating stack (32, 42) within an area of a second contact opening 69B. The second insulator layer is vertically spaced from the first insulator layer by at least one sacrificial material layer 42 in the alternating stack (32, 42).

Further, the plurality of contact openings 69 can be formed by simultaneously etching a portion of a first sacrificial material layer 42 (e.g., an (i+1)-th-from-top sacrificial material layer 42 in which i is less than N) in the alternating stack (32, 42) within an area of a first contact opening 69A and a portion of a second sacrificial material layer 42 (e.g., an i-th-from-top sacrificial material layer 42) in the alternating stack (32, 42) within an area of a second contact opening 69B. The second sacrificial material layer 42 is vertically spaced from the first sacrificial material layer 42 by at least one insulator layer 32 in the alternating stack (32, 42).

For example, a portion of a first sacrificial material layer 42 (e.g., the i-th from-top sacrificial material layer 42 in which i is less than N) underlying a first opening 59A (See FIG. 2) and having a top surface that is physically exposed to a first contact opening 69A can be etched during a step of an etch process so that the bottom surface of the first contact opening 69A extends to a top surface of a first insulator layer 32 (e.g., the i-th-from-top insulator material layer 32) that is located under the first sacrificial material layer 42 in the alternating stack (32, 42). In this case, a portion of a second sacrificial material layer (e.g., the (i−1)-th from-top sacrificial material layer 42) underlying a second opening 59B (See FIG. 2) and having a top surface that is physically exposed to a second contact opening 69B can be etched during the same step of the same etch process so that the bottom surface of the second contact opening 69B extends to a top surface of a second insulator layer 32 (e.g., the (i−1)-th-from-top insulator layer 32) that is located under the second sacrificial material layer 42 in the alternating stack (32, 42). Likewise, a portion of a third sacrificial material layer (e.g., the (i−2)-th from-top sacrificial material layer 42) underlying a third opening 59C (See FIG. 2) and having a top surface that is physically exposed to a third contact opening 69C can be etched during the same step of the same etch process so that the bottom surface of the third contact opening 69B extends to a top surface of a third insulator layer 32 (e.g., the (i−2)-th-from-top insulator layer 32) that is located under the third sacrificial material layer 42 in the alternating stack (32, 42).

Further, a portion of the first insulating layer 32 (e.g., the i-th from-top insulator layer 32 in which i is less than N) underlying the first opening 59A (See FIG. 2) and having a top surface that is physically exposed to the first contact opening 69A can be etched during another step of the same etch process within the same cycle so that the bottom surface of the first contact opening 69A extends to a top surface of another sacrificial material layer 42 (e.g., the (i+1)-th-from-top sacrificial material layer 42) that is located under the first insulating layer 32 in the alternating stack (32, 42). In this case, a portion of the second insulating layer 32 (e.g., the (i−1)-th from-top insulator layer 32) underlying the second opening 59B (See FIG. 2) and having a top surface that is physically exposed to the second contact opening 69B can be etched during this step of the same etch process so that the bottom surface of the second contact opening 69B extends to a top surface of the first sacrificial material layer 42 (e.g., the i-th-from-top sacrificial material layer 42) that is located under the second insulating layer 32 in the alternating stack (32, 42). Likewise, a portion of the third insulating layer 32 (e.g., the (i−2)-th from-top insulator layer 32) underlying the third opening 59C (See FIG. 2) and having a top surface that is physically exposed to the third contact opening 69C can be etched during this step of the same etch process so that the bottom surface of the third contact opening 69C extends to a top surface of the second sacrificial material layer 42 (e.g., the (i−1)-th-from-top sacrificial material layer 42) that is located under the third insulating layer 32 in the alternating stack (32, 42).

In one embodiment, the etch chemistry for the step of etching the material of the sacrificial material layers 42 can be selective to the material of the insulator layers 32, and the etch chemistry for the step of etching the material of the insulator layers 32 can be selective to the material of the sacrificial material layers 42. Under such conditions, the recessing of the bottom surfaces of the contact openings 69 during a processing step that etches one type of material, i.e., the first material of the insulator layers 32 or the second material of the sacrificial material layers 42, can be self-stopping on the top surface of the immediately underlying material.

During each trimming process, surface portions of the slimming layer 47 are removed from the top surface and the sidewalls of the slimming layer 47 to physically expose at least one additional opening 59 in the mask layer 36. During the partial removal of the slimming layer 47, the thickness and the lateral extent of the slimming layer 47 can be simultaneously reduced. In one embodiment, the sidewalls of the slimming layer 47 be laterally recessed from all horizontal directions and the top surface of the slimming layer 47 can be recessed at the same rate as the recess rate of a sidewall of the slimming layer 47. In this case, the lateral extent of the slimming layer 47 can be reduced twice at the rate of reduction of the thickness of the slimming layer 47. The rate of trimming of the slimming layer 47 can be selected such that one trimming process physically exposes one new set of openings 59 in the mask layer 36 that correspond to areas of contact openings designed 69 to extend to a same level, e.g., to a same sacrificial material layer 42 upon completion of formation of the respective contact openings 69.

In one embodiment, the plurality of contact openings 69 can be formed as multiple sets of linearly positioned contact openings 69. For example, a plurality of first contact openings 69A can be formed in a first linear configuration, and a plurality of i-th contact openings 69 can be formed in an i-th linear configuration that extends along the horizontal direction of the plurality of first contact openings 69A for every integer i greater than 1 and not greater than N, which is the total number of the sacrificial material layers 42. As used herein, a "linear configuration" refers to a configuration in which multiple elements are located at positions laterally spaced from one another such that a straight line passing through the multiple elements exists.

Multiple linear sets of contact openings 69 can be formed such that each linear set of contact openings 69 has the same depth, while contact openings belonging to different linear sets have different depths. Each linear set of contact openings 69 having the same depth can laterally extend along a first horizontal direction. Different linear sets of contact openings 69 can laterally extend along a second horizontal direction that is different from the first horizontal direction. In one embodiment, the second horizontal direction can be orthogonal to the first horizontal direction.

While the present disclosure has been described employing an embodiment in which a step for etching the second material of the sacrificial material layers 42 precedes a step for etching the first material of the insulator layers 32 in an etch process within each cycle of a trimming process and an etch process, an alternative embodiment is expressly contemplated herein, in which a step for etching the first material of the insulator layers 32 precedes a step for etching the second material of the sacrificial material layers 42 in an etch process within each cycle of a trimming process and an etch process. In this case, the last etch process that follows the last trimming process may include only the step of etching the first material of the insulator layers 32, i.e., may not include a step for etching the second material of the sacrificial material layers 42.

A plurality of contact openings 69 is formed within the alternating stack (32, 42). Each of the plurality of contact openings 69 extends at least from the topmost surface of the alternating stack (32, 42), and specifically from the top surface of the mask layer 36, to a surface of a respective material layer. The respective material layers can include sacrificial material layers 42 located at different levels within the alternating stack (32, 42) in case each etch process terminates with a step that etches the second material of the sacrificial material layers 42. Alternatively, the respective material layers can include insulator layers 32 located at different levels within the alternating stack (32, 42) in case each etch process terminates with a step that etches the first material of the insulator layers 32.

Figure 7:
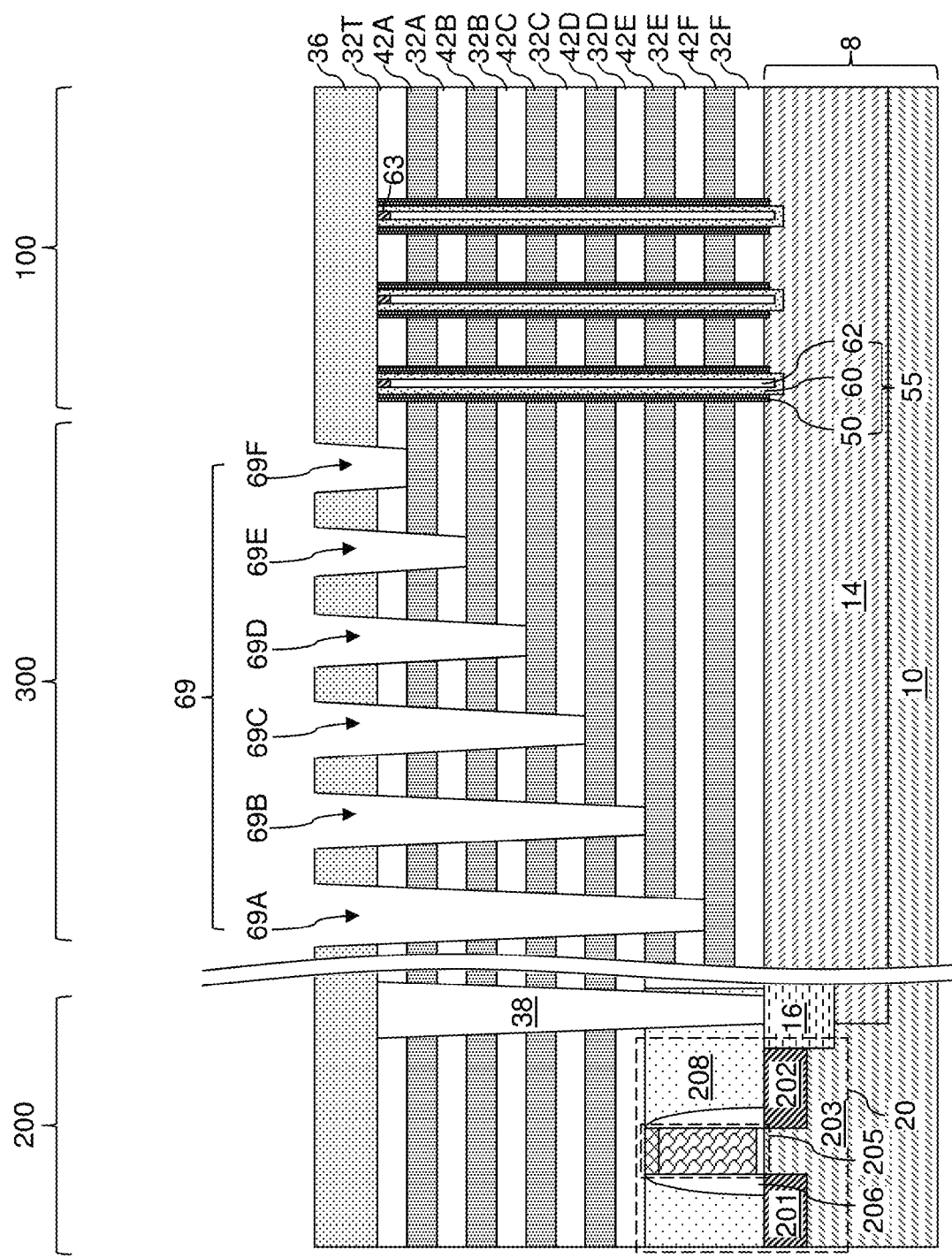

Referring to FIG. 7, the cycles of alternating processes that include a trimming process and an etch process continues until the entire set of openings 59 (See FIG. 2) in the mask layer 36 are physically exposed after the trimming process of the last cycle, and the at least one N-th contact opening 69F is formed through the topmost insulator layer 32. The entirety of the remaining portion of the slimming layer 47 can be removed during the last trimming process. In one embodiment, all of the openings 59 in the mask layer 36 can be physically exposed. Upon completion of the etch process after the last trimming process, a plurality of contact openings 69 extend through a respective opening in the mask layer 36 from the top surface of the mask layer to a respective one of the plurality of sacrificial material layers 42.

Upon termination of the processing steps of FIG. 7, any remaining portion of the slimming material layer 47, if present, is removed. Each of the plurality of contact openings 69 can extend at least from the topmost surface of the alternating stack (32, 42), and specifically from the top surface of the mask layer 36, to a surface of a respective sacrificial material layer 42. In one embodiment, the bottom surface of each contact opening 69 is a top surface a respective sacrificial material layer 42. The top surface the respective sacrificial material layer 42 can be the topmost surface of the respective sacrificial material layer 42 or a recessed surface of the respective sacrificial material layer 42 that is vertically offset from the topmost surface of the respective sacrificial material layer 42 due to an overetch or a finite selectivity of the last etch step that etches the first material of the insulator layers 32.

Thus, a first contact opening 69A among the plurality of contact openings 69 has a bottom surface that is a top surface of a first sacrificial material layer 42 (e.g., the N-th-from-top sacrificial material layer 42F) in the alternating stack (32, 42), a second contact opening 69B among the plurality of contact openings 69 has a bottom surface that is a top surface of a second sacrificial material layer 42 (e.g., the (N−1)-th-from-top sacrificial material layer 42E) in the alternating stack (32, 42), in which the second sacrificial material layer 42 is different from the first sacrificial material layer 42. In general, an i-th contact opening 69 can have a bottom surface that is a top surface of the (N+1-i)-th-from-top sacrificial material layer 42 in the alternating stack (32, 42).

The sidewall of the contact openings 69 can be vertical, substantially vertical, or tapered depending on the chemistries of the anisotropic etch processes employed during the cycles of a trimming process and an etch process. In one embodiment, the sidewalls of each contact opening 69 can be smooth surfaces without substantial protrusions or recesses. The sidewalls of each first contact opening 69A include sidewalls of the topmost insulator layer 32, sidewalls of each i-th-from-top sacrificial material layer 42 for each integer index i beginning from 1 and ending with N−1, and sidewalls of each j-th-from-top sacrificial material layer 42 for each integer index j beginning from 1 and ending with N−1. For every positive integer k less than N, the sidewalls of each k-th contact opening 69 include sidewalls of the topmost insulator layer 32, sidewalls of each i-th-from-top sacrificial material layer 42 for each integer index i beginning from 1 and ending with N-k, and sidewalls of each j-th-from-top sacrificial material layer 42 for each integer index j beginning from 1 and ending with N-k. The sidewalls of each N-th contact opening 69F include sidewall of the topmost insulator layer 32.

In one embodiment, at least one of the plurality of contact opening 69 (e.g., a first contact opening 69A) can have a first periphery contained entirety within a sidewall of one of the sacrificial material layers 42 (e.g., the N-th-from-top sacrificial material layer 42F) and a second periphery contained entirely within a sidewall of another of the sacrificial material layers 42 (e.g., the (N−1)-th-from-top sacrificial material layer 42E). As used herein, a periphery is a closed line that is topologically homeomorphic to a circle. In one embodiment, at least one of the plurality of contact opening 69 (e.g., a first contact opening 69A) can have a first periphery contained entirety within a sidewall of one of the insulator layers 32 (e.g., the (N−1)-th-from-top insulator layer 32E) and a second periphery contained entirely within a sidewall of another of the insulator layer 32 (e.g., the (N−2)-th-from-top sacrificial material layer 42D).

Figure 8:
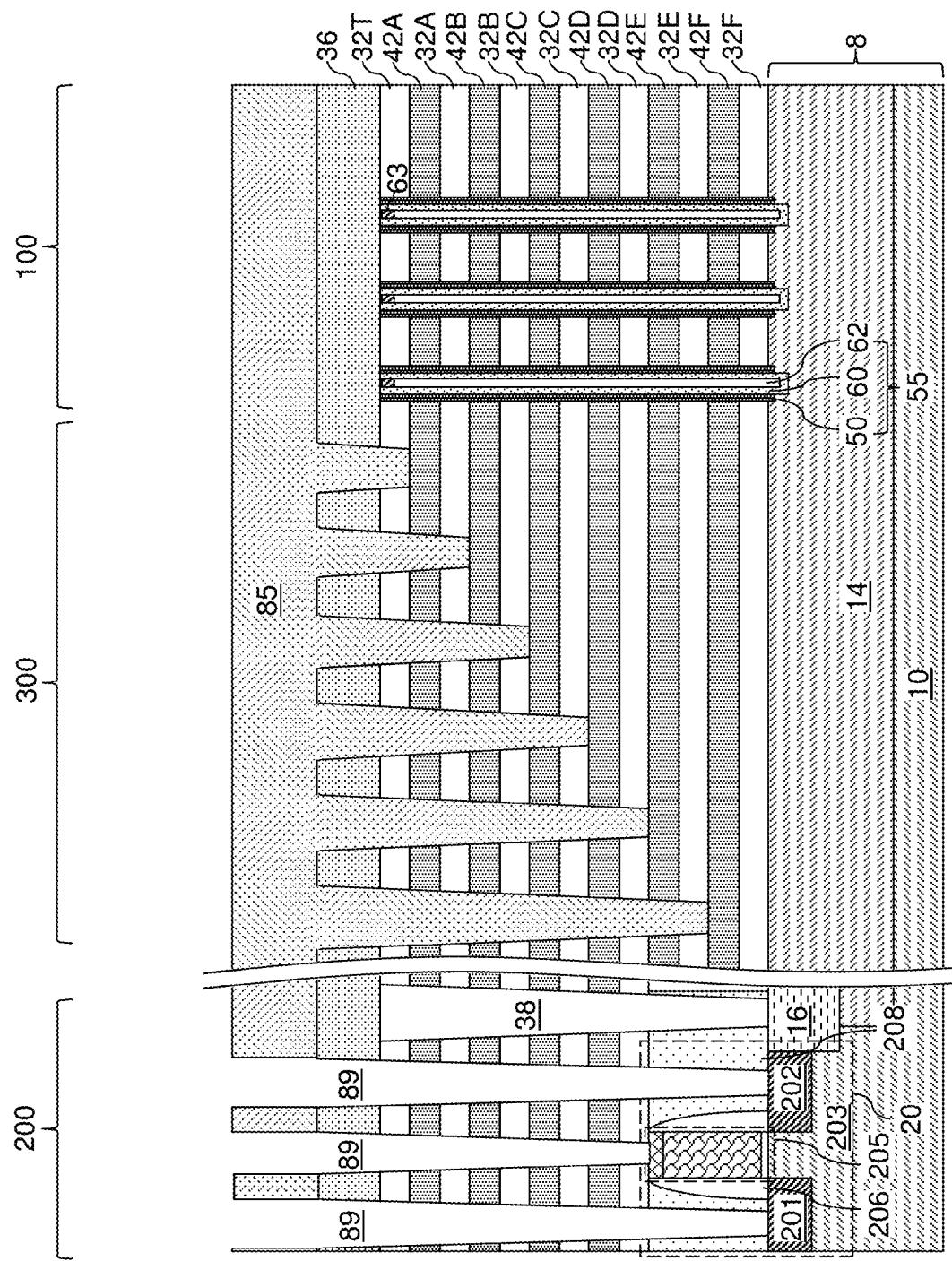

Referring to FIG. 8, a photoresist layer 85 can be applied over the mask layer 36 and lithographically patterned to form openings in areas in which formation of peripheral device electrically conductive via contacts 86 (See FIG. 15) is desired. The photoresist layer 85 can be a conformal photoresist layer that fills, partially or completely, all openings under the topmost surface of the mask layer 36. The pattern in the photoresist layer 85 can be transferred through the mask layer 36 and the alternating stack (32, 42) and optionally through the planarization material layer 208 employing an anisotropic etch to form via trenches that extend to various conductive components that constitute electrical nodes of the at least one peripheral device 20. Each via trench that extends to the various components of the at least one peripheral device 20 is a contact opening, and is herein referred to as a peripheral contact opening 89. The photoresist layer 85 can be subsequently removed, for example, by ashing.

Figure 9:
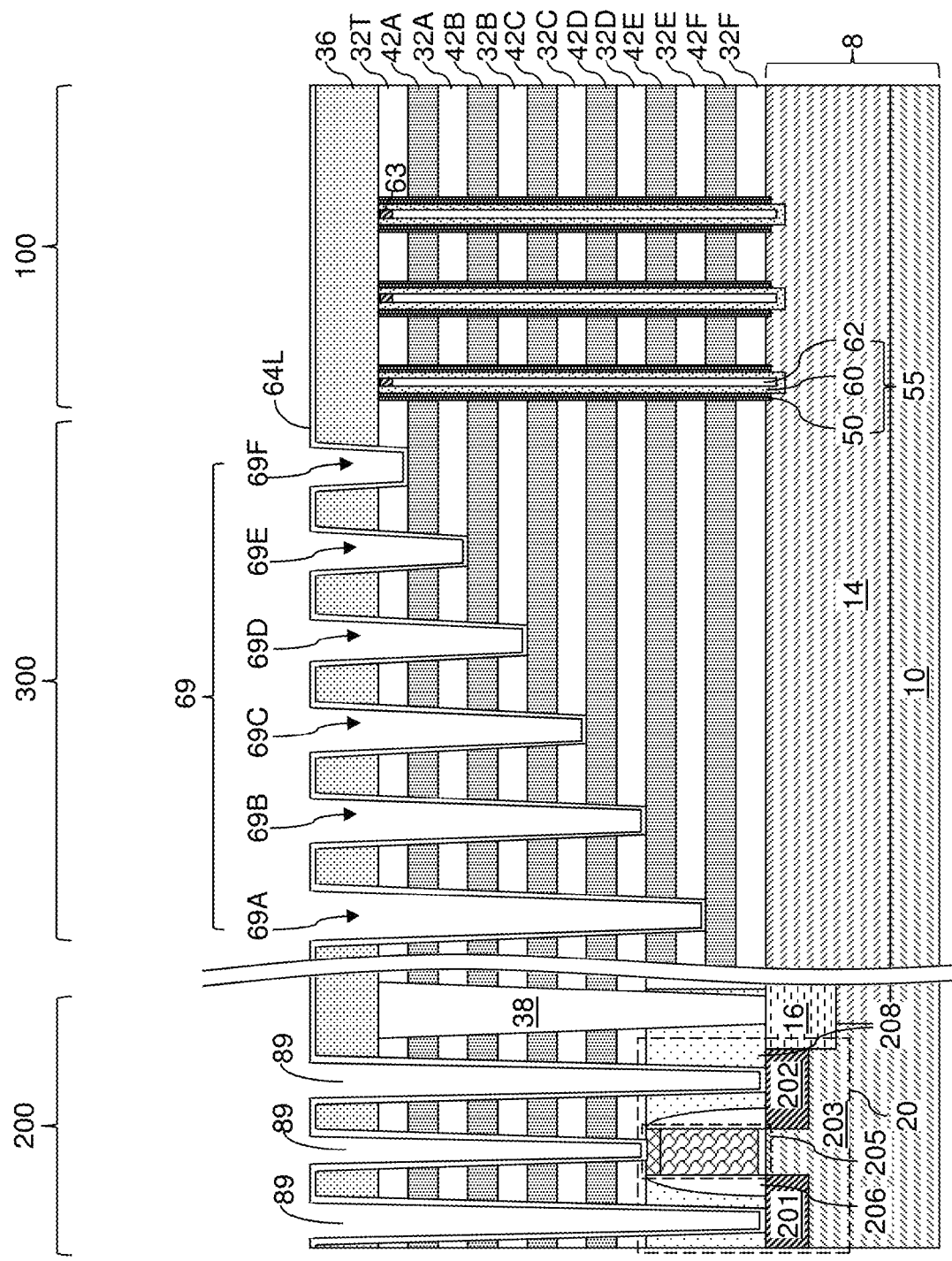

Referring to FIG. 9, a continuous insulating material layer 64L can be formed on physically exposed surfaces on an upper side of the first exemplary structure, which include the top surface of the mask layer 36, the sidewalls of the plurality of contact openings 69, and the surfaces of the various sacrificial material layers 42 underneath the plurality of contact openings 69 (i.e., the bottom surfaces of the contact openings 69), the various sidewalls and bottom surfaces of the peripheral contact openings 89. The continuous insulating material layer 64L includes an insulating material that is different from the second material, i.e., the material of the sacrificial material layers 42. For example, the continuous insulating material layer 64L can include silicon oxide or a dielectric metal oxide such as aluminum oxide, tantalum oxide, and/or hafnium oxide. The continuous insulating material layer 64L can be deposited, for example, by a conformal deposition method such as chemical vapor deposition (CVD) or atomic layer deposition (ALD). The thickness of the continuous insulating material layer 64L, as measured at a bottom portion of a first contact opening 69A, can be in a range from 1 nm to 60 nm, although lesser and greater thicknesses can also be employed. In one embodiment, the thickness of the continuous insulating material layer 64L can be in a range from 3 nm to 30 nm.

Figure 10:
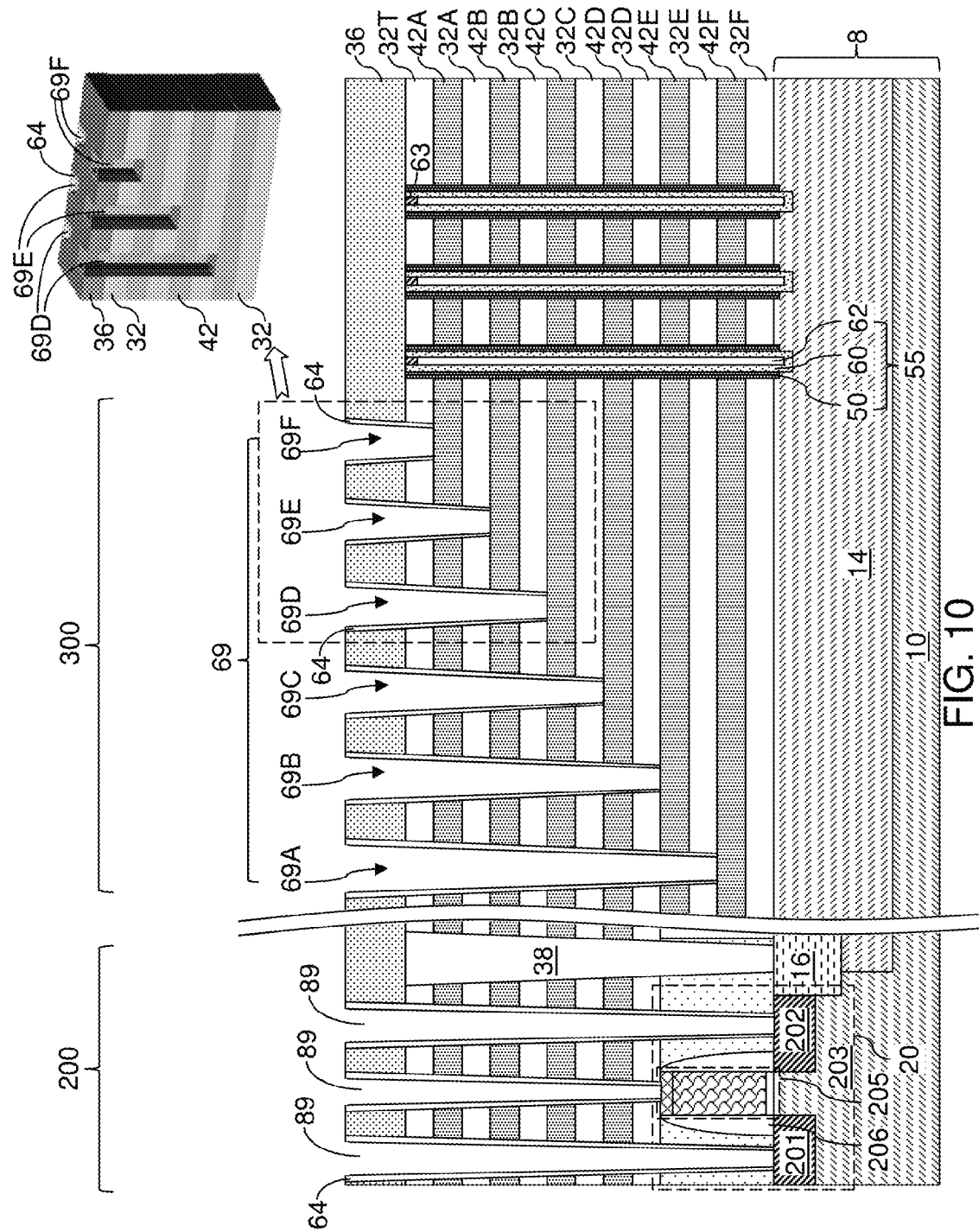

Referring to FIG. 10, insulating liners 64 can be formed on each sidewall of the plurality of contact openings 69 and on each sidewall of the peripheral contact openings 89 by performing an anisotropic etch of the continuous insulating material layer 64L. Specifically, upon anisotropically etching the continuous insulating material layer 64L, each remaining portion of the continuous insulating material layer 64L constitutes an insulating liner 64. The insulating material of the continuous insulating material layer 64L is removed from each bottom portion of the plurality of contact openings 69 and the peripheral contact openings 89. Thus, a portion of a top surface of a sacrificial material layer 42 is physically exposed at the bottom of each of the plurality of contact openings 69. Further, a top surface of a conductive element (e.g., a source region 201, a drain region 202, and a gate silicide within a gate stack 205) can be physically exposed at the bottom of each of the peripheral contact openings 89. The insulating liners 64 can be formed simultaneously directly on the sidewalls of the plurality of contact openings 69 and directly on the sidewalls of the peripheral contact openings 89. Each insulating liner 64 can be topologically homeomorphic to a torus.

Figure 11:
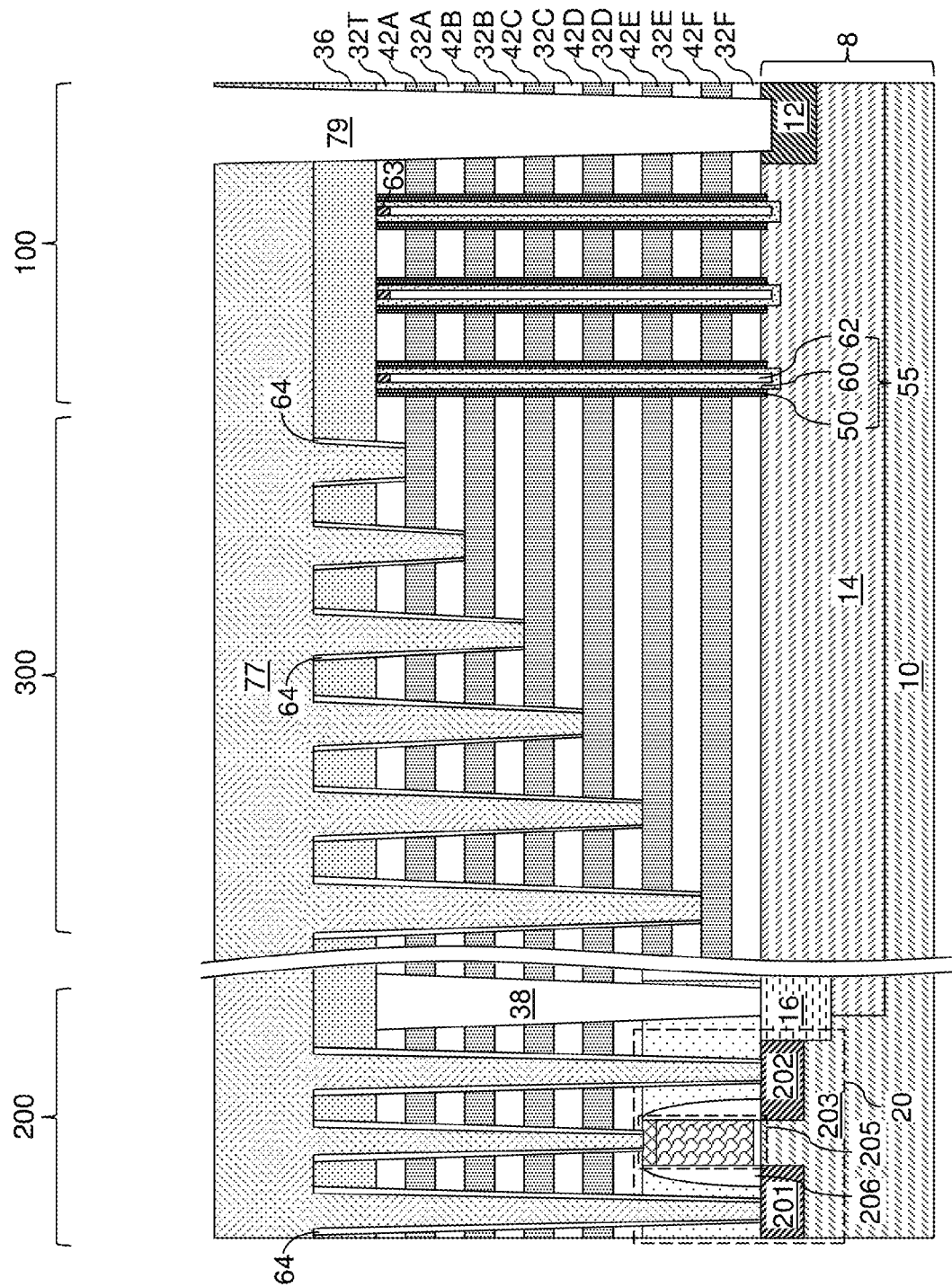

Referring to FIG. 11, a photoresist layer 77 can be applied over the mask layer 36 and lithographically patterned to form at least one backside contact trench 79 in an area in which formation of a backside contact 76 (See FIG. 15) is desired. The photoresist layer 77 can be a conformal photoresist layer that fills, partially or completely, all openings under the topmost surface of the mask layer 36. The pattern in the photoresist layer 77 can be transferred through the mask layer 36 and the alternating stack (32, 42) employing an anisotropic etch to form a trench that extends at least to the top surface of the substrate 8. The trench that extends at least to the top surface of the substrate 8 is a contact opening, and can be a source contact opening. In one embodiment, electrical dopants (i.e., p-type dopants or n-type dopants) can be implanted into the portion of the doped well 14 (or the substrate semiconductor layer 10) to form a source region 12 for vertical memory devices including the memory stack structures 55. The photoresist layer 77 can be subsequently removed, for example, by ashing.

Figure 12:
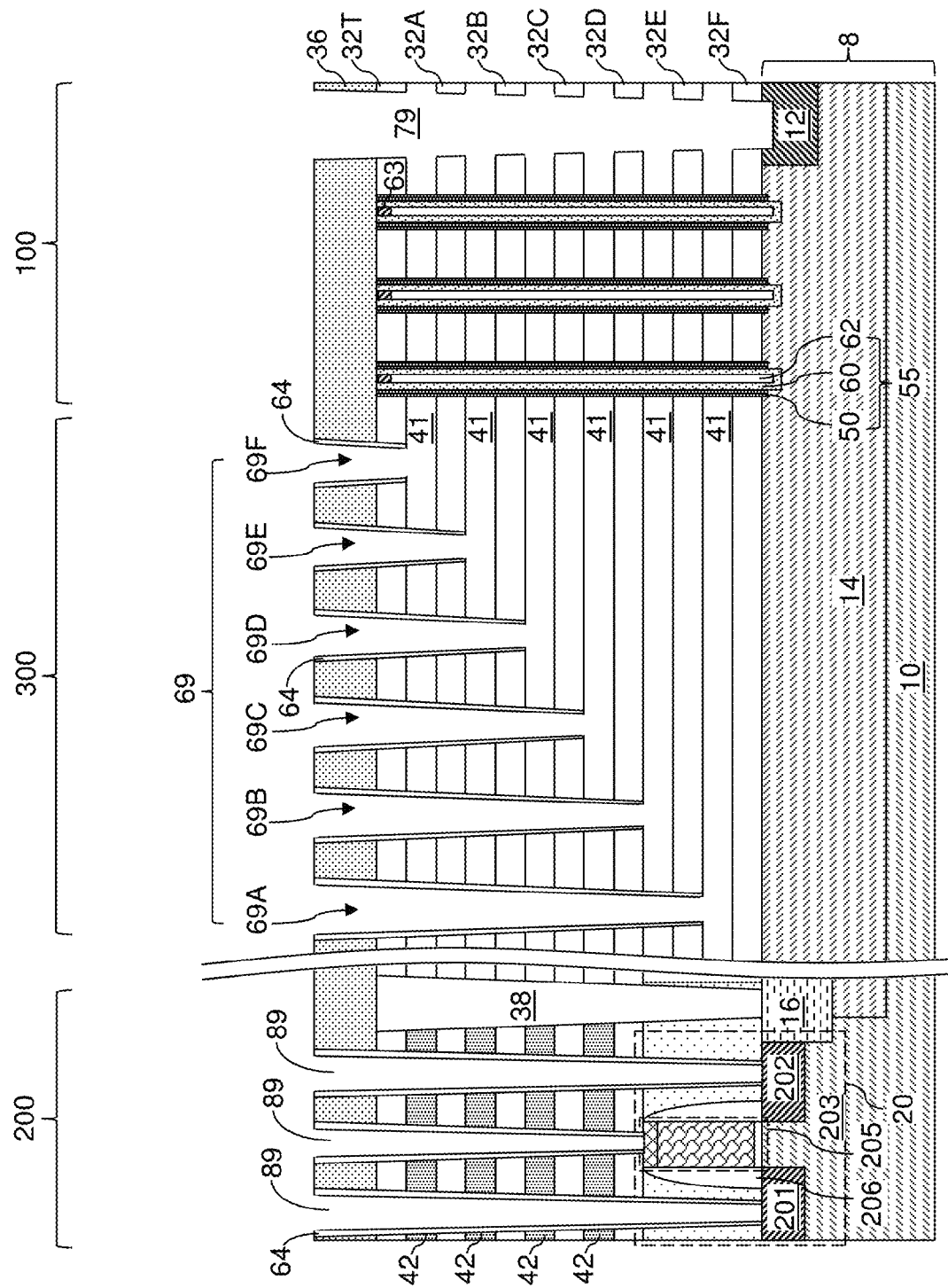

Referring to FIG. 12, an etchant that selectively etches the second material of the sacrificial material layers 42 with respect to the first material of the insulator layers 32 can be introduced into the plurality of contact openings 69 and the at least one backside contact trench 79, for example, employing an etch process. The removal of the second material of the sacrificial material layers 42 can be selective to the materials of the insulating liners 64, the first material of the insulator layers 32, and the material of the outermost layer of the memory films 50. Optionally, the removal of the second material of the sacrificial material layers 42 can be selective to the material of the mask layer 36, and the various conductive materials that are present underneath the peripheral contact openings 89. The insulating liners 64 protect the sidewalls of each of the plurality of contact openings 69 from an etchant used to remove at least a portion of each sacrificial material layer 42.

The etch process that removes the second material selective to the first material and the outermost layer of the memory films 50 can be a wet etch process employing a wet etch solution, or can be a gas phase (dry) etch process in which the etchant is introduced in a vapor phase into the plurality of contact openings 69 and the at least one backside contact trench 79. For example, if the sacrificial material layers 42 include silicon nitride, the etch process can be a wet etch process in which the first exemplary structure is immersed within a wet etch tank including phosphoric acid, which etches silicon nitride selective to silicon oxide, silicon, and various other materials employed in the art. The insulating liners 64, the at least one dielectric support pillar 38 (if present), the memory stack structures 55, and the insulating layers 32 structurally support the first exemplary structure. The at least one dielectric support pillar 38 may, or may not, be present.

Each continuous portion of the sacrificial material layers 42 having a top surface that is physically exposed to one of the plurality of contact openings 69 can be removed during the etch process to form a recess 41. Each recess 41 can be a laterally extending cavity having a lateral dimension that is greater than the vertical extent of the cavity. A plurality of recesses 41 can be formed in the volumes from which the second material of the sacrificial material layer 42 is removed. The memory openings in which the memory stack structures 55 are formed are herein referred to as front side cavities, and the recesses 41 are herein referred to as back side cavities. In one embodiment, the device region comprises an array of monolithic three dimensional NAND strings having a plurality of device levels disposed above the substrate 8. In this case, each recess 41 can define a space for receiving a respective word line of the array of monolithic three dimensional NAND strings.

Each of the plurality of recesses 41 can extending substantially parallel to the top surface of the substrate 8. In one embodiment, each recess 41 can be vertically bounded by a top surface of an underlying insulator layer 32 and a bottom surface of an overlying insulator layer 32 except in regions at which the recess is connected to one of the contact openings 69. In one embodiment, each recess 41 can have a uniform height throughout. A bottom portion of each of the plurality of contact openings 69 can be connected to an underlying recess 41. During the etch process that forms the plurality of recesses 41, the insulating liners 64 can protect the sidewalls of the plurality of contact openings 69. Thus, an insulating liner 64 can laterally separate a contact opening 69 from all recesses 41 that are located above the recess 41 to which the contact opening 69 is continuously connected to through a bottom opening of the contact opening 69. The recesses 41 are formed across multiple levels, and as a result, a first recess 41 formed by removal of a portion of a first sacrificial material layer 42 can be located at a different level than a second recess 41 formed by removal of a portion of a second sacrificial material layer 42 that is different from the first sacrificial material layer 42.

Figure 13:
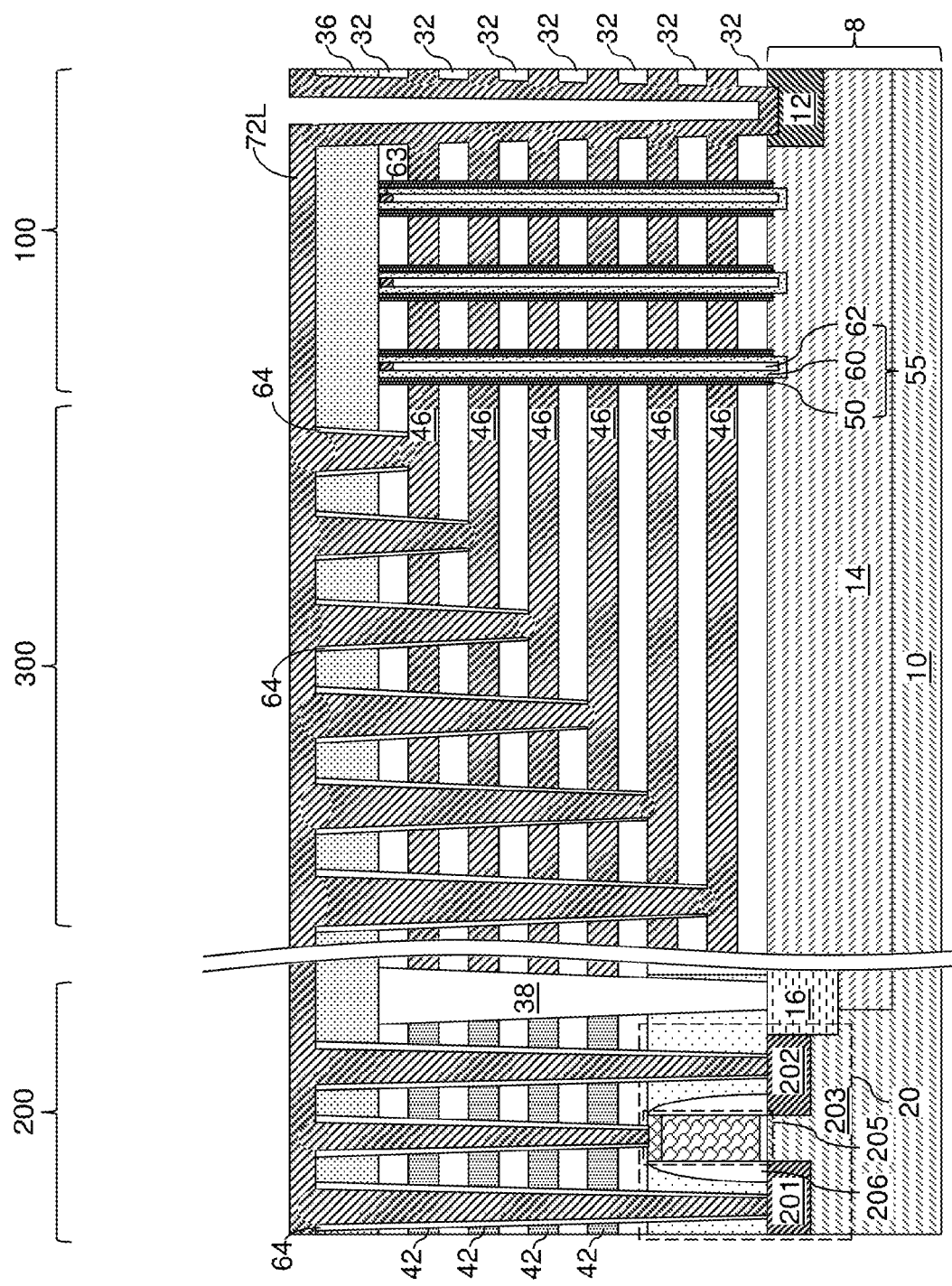

Referring to FIG. 13, a conductive material can be simultaneously deposited in the plurality of contact openings 69 and the plurality of recesses 41, the backside contact trench 79, and the peripheral contact openings 89, and over the top surface of the mask layer 36. The conductive material is herein referred to as a first conductive material, or an electrically conductive electrode material. The first conductive material can be deposited by a conformal deposition method, which can be, for example, chemical vapor deposition (CVD), atomic layer deposition (ALD), electroless plating, electroplating, or a combination thereof. The conductive material can be an elemental metal, an intermetallic alloy of at least two elemental metals, a conductive nitride of at least one elemental metal, a conductive metal oxide, a conductive doped semiconductor material, a conductive metal-semiconductor alloy such as a metal silicide, alloys thereof, and combinations or stacks thereof. Non-limiting exemplary conductive materials that can be deposited in the plurality of contact openings 69 and the plurality of recesses 41 include tungsten, tungsten nitride, titanium, titanium nitride, tantalum, and tantalum nitride. In one embodiment, the electrically conductive electrode material can comprise a metal such as tungsten and/or metal nitride. In one embodiment, the conductive material for filling the plurality of contact openings 69, the plurality of recesses 41, and the peripheral contact openings 89 can be selected from tungsten and a combination of titanium nitride and tungsten. In one embodiment, the conductive material can be deposited by chemical vapor deposition.

Simultaneous deposition of the conductive material in the plurality of contact openings 69 (See FIG. 12), in the plurality of recesses 41 (See FIG. 12), on the sidewalls and the bottom surface of the backside contact trench 79 (See FIG. 12), and over the top surface of the mask layer 36 forms a plurality of electrically conductive electrodes 46 in the plurality of recesses 41 and a continuous conductive material layer 72L. Each electrically conductive electrode 46 can be a conductive line structure. The continuous conductive material layer 72L includes portions that fill all of the plurality of contact openings 69, a portion formed on the sidewalls of the bottom surface of the backside contact trench 79, and a portion overlying the top surface of the mask layer 36. The continuous conductive material layer 72L and the plurality of electrically conductive electrodes 46 are formed as an integral structure, i.e., a single continuous structure.

Figure 14:
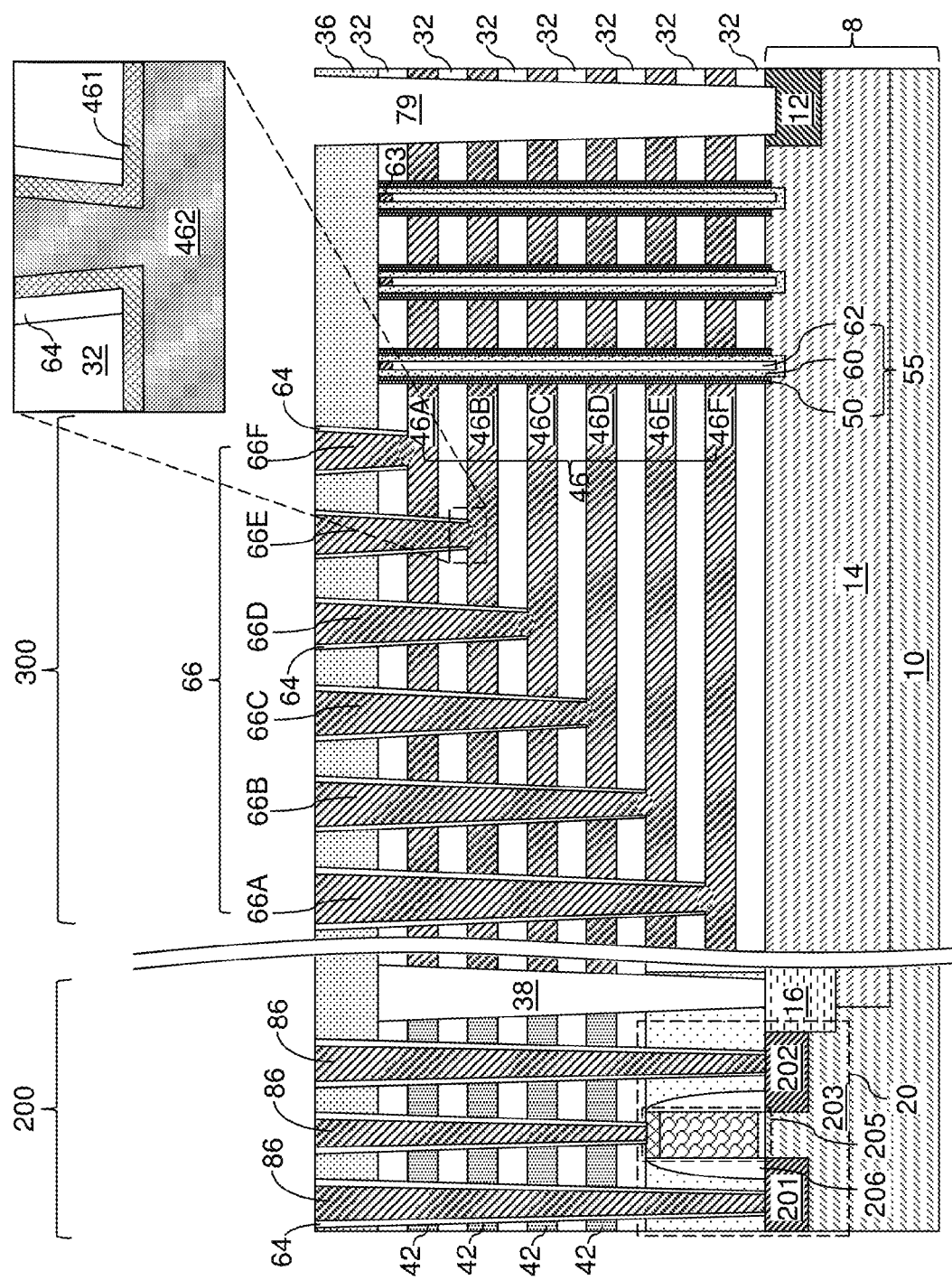

Referring to FIG. 14, the deposited conductive material is etched back, for example, by an isotropic etch. The portion of the continuous conductive material layer 72L overlying the top surface of the mask layer 36 and the portion of the continuous conductive material layer 72L located within the backside contact trench 79 is removed. Each remaining portion of the deposited conductive material in the plurality of contact openings 69 (See FIG. 12) constitutes an electrically conductive via contact 66. Each remaining portion of the deposited conductive material in the recesses 41 (See FIG. 12) constitutes an electrically conductive electrode 46. Each electrically conductive electrode 46 can be a conductive line structure. Each remaining portion of the deposited conductive material in a peripheral contact opening 89 (See FIG. 12) constitutes a peripheral device electrically conductive via contact 86.

Each of the plurality of electrically conductive via contacts 66 is electrically shorted to an electrically conductive electrode 46, and can be electrically isolated from all other electrically conductive electrodes 46. Each electrically conductive electrode 46 can be electrically isolated from any other electrically conductive electrodes 46 located at a different level, i.e., from any other electrically conductive electrode 46 that overlies the electrically conductive electrode 46 and from any other electrically conductive electrode 46 that underlies the electrically conductive electrode 46.

Each electrically conductive electrode 46 can function as a combination of a plurality of control gate electrodes and a word line electrically connecting, i.e., electrically shorting, the plurality of control gate electrodes. The plurality of control gate electrodes within each electrically conductive electrode 46 can include control gate electrodes located at the same level for the vertical memory devices including the memory stack structures 55. In other words, each electrically conductive electrode 46 can be a word line that functions as a common control gate electrode for the plurality of vertical memory devices.

The plurality of electrically conductive via contacts 66 include at least one first electrically conductive via contact 66A that is located within the volume of a first contact opening 69A (See FIG. 12) and is electrically shorted to an electrically conductive electrode 46, which contacts the top surface of the N-th-from-top insulator layer 32F and the bottom surface of the (N−1)-th-from-top insulator layer 32E, and is herein referred to as an N-th-from-top electrically conductive electrode 46F or a first-from-bottom electrically conductive electrode.

The plurality of electrically conductive via contacts 66 can further include at least one second electrically conductive via contact 66B that is located within the volume of a second contact opening 69B (See FIG. 12) and is electrically shorted to an electrically conductive electrode 46, which contacts the top surface of the (N−1)-th-from-top insulator layer 32E and the bottom surface of the (N−2)-th-from-top insulator layer 32D, and is herein referred to as an (N−1)-th-from-top electrically conductive electrode 46E or a second-from-bottom electrically conductive electrode. The plurality of electrically conductive via contacts 66 can further include at least one third electrically conductive via contact 66C that is located within the volume of a third contact opening 69C (See FIG. 12) and is electrically shorted to an electrically conductive electrode 46, which contacts the top surface of the (N−2)-th-from-top insulator layer 32D and the bottom surface of the (N−3)-th-from-top insulator layer, and is herein referred to as an (N−2)-th-from-top electrically conductive electrode 46D or a third-from-bottom electrically conductive electrode. The plurality of electrically conductive via contacts 66 can further include at least one intermediate level electrically conductive via contact 66D that is located within the volume of an intermediate contact opening 69D (See FIG. 12) and is electrically shorted to an electrically conductive electrode 46, which contacts the top surface of an immediately underlying insulator layer 32 and the bottom surface of an immediately overlying insulator layer 32, and is herein referred to as an intermediate electrically conductive electrode. The plurality of electrically conductive via contacts 66 can further include at least one (N−1)-th electrically conductive via contact 66E that is located within the volume of an (N−1)-th contact opening 69E (See FIG. 12) and is electrically shorted to an electrically conductive electrode 46, which contacts the top surface of the second-from-top insulator layer 32B and the bottom surface of the first-from-top insulator layer 32A, and is herein referred to as a second-from-top electrically conductive electrode 46B or an (N−1)-th-from-bottom electrically conductive electrode. The plurality of electrically conductive via contacts 66 further includes at least one N-th electrically conductive via contact 66F that is located within the volume of a first contact opening 69A (See FIG. 12) and is electrically shorted to a topmost electrically conductive electrode 46, which contacts the top surface of the first-from-top insulator layer 32A and the bottom surface of the topmost insulator layer 32, and is herein referred to as the first-from-top electrically conductive electrode 46A or an N-th-from-bottom electrically conductive electrode.

A first electrically conductive electrode 46 can be formed into a first recess 41 (e.g., the recess 41 located directly above the N-th-from-top insulator layer 32F) through the backside contact trench 79 and the first contact opening 69A. A second electrically conductive electrode 46 can be deposited into a second recess 41 (e.g., the recess 41 located directly above the (N−1)-th-from-top insulator layer 32E) through the backside contact trench 79 and the second contact opening 69B in the same deposition step as depositing the first and the second electrically conductive via contacts (66A, 66B). The first electrically conductive electrode 46 extends around the first contact opening 69A and the first electrically conductive via contact 66A is located in the first contact opening 69A. An insulating liner 64 located on the sidewall of the first contact opening 69A electrically isolates the second electrically conductive electrode 46 from the first electrically conductive via contact 66A located in the first contact opening 69A. The first electrically conductive via contact 66A extends deeper than the second electrically conductive via contact 66B such that bottom surfaces of the plurality of electrically conductive via contacts (66A, 66B, 66C, 66D, 66E, 66F) form a step pattern.

Thus, the alternating stack (32, 46) includes, from top to bottom, a topmost insulator layer 32T, a first-from-top electrically conductive electrode 46A, a first-from-top insulator layer 32A, a second-from-top electrically conductive electrode 46B, a second-from-top insulator layer 32B, an alternating stack including at least one intermediate electrically conductive electrode 46C and at least one intermediate insulator layer 32C, an (N−2)-th-from-top electrically conductive electrode 46D, an (N−2)-th-from-top insulator layer 32D, an (N−1)-th-from-top electrically conductive electrode 46E, an (N−2)-th-from-top insulator layer 32E, an N-th-from-top electrically conductive electrode 46F, and an N-th-from-top insulator layer 32F. It is understood that an insulator layer 32 can refer to any of, or each of, the various insulator layers (32A, 32B, 32C, 32D, 32E, 32F), and an electrically conductive electrode 46 can refer to any of, or each of, the various sacrificial material layers (46A, 46B, 46C, 46D, 46E, 46F). Further, insulator layers 32 can refer to any plurality of, or all of, the various insulator layers (32A, 32B, 32C, 32D, 32E, 32F), and electrically conductive electrodes 46 can refer to any plurality of, or all of, the various electrically conductive electrodes (46A, 46B, 46C, 46D, 46E, 46F).

Remaining continuous portions of the deposited conductive material include a plurality of integrated line and via structures (46, 66). Specifically, each electrically shorted pair of an electrically conductive via contact 66 and an electrically conductive electrode 46 constitutes an integrated line and via structure (46, 66). The first device structure includes a plurality of integrated line and via structures (46, 66) having coplanar topmost surfaces (that are within the horizontal plane including the top surface of the mask layer 36) and bottommost surfaces located at different distances from the horizontal plane including the top surface of the alternating stack (32, 46) of the insulator layers 32 and the electrically conductive electrodes 46. In one embodiment, each instance of the electrically conductive electrodes 46 can be a portion of a respective one of the plurality of integrated line and via structures (46, 66).

Optionally, each integrated line and via structure (46, 66) can include a metallic liner 461 that coats the entire surfaces of a continuous cavity including a corresponding contact opening 69 and a corresponding recess 41. For example, the metallic liners 461 can be a continuous layer of titanium nitride. Each integrated line and via structure (46, 66) can include a conductive material portion 462 that can be embedded within the metallic liner 461, or can contact the surfaces of insulator layers 32, or can contact a dielectric material liner (not shown) such as a blocking dielectric layer that can be formed within the recesses 41 and the dielectric liners 64 prior to formation of the integrated line and via structures (46, 66). In one embodiment, the conductive material portion 462 can include tungsten. Each conductive material portion 462 can be a structure of integral construction, i.e., a single continuous structure. Each conductive material portion 462 can include a vertical conductive material portion and a horizontal conductive material portion that do not have any interface there between, but can be divided only geometrically by a discontinuous change in the horizontal cross-sectional area of the conductive material portion as a function of a vertical distance from the top surface of the alternating stack (32, 46).

Each integrated line and via structure (46, 66) can include a continuous material portion that is continuous throughout the entirety thereof and does not include any interface therein. Specifically, each of the plurality of integrated line and via structures (46, 66) can comprise an electrically conductive electrode 46 and an electrically conductive via contact 66 that adjoins, and overlies, the electrically conductive electrode 46 such that a continuous material portion without an interface therein continuously extends through the electrically conductive electrode 46 and the electrically conductive via contact 66. As used herein, an "interface" refers to any microscopic continuous surface at which different materials contact each other or a same material is spaced by a microscopic cavity or an impurity layer that is inherently present when one material is formed on another material in any environment that can introduce impurity materials. Because the same material is deposited simultaneously to form each continuous material portion of the electrically conductive via contact 66 and the electrically conductive electrode within each integrated line and via structure (46, 66), each continuous material portion in an integrated line and via structure (46, 66) is free of any interface that divides the continuous material portion into two portions.

In one embodiment, each conductive material portion 462 can be a continuous material portion within a respective integrated line and via structure (46, 66). In other words, each conductive material portion 462 can be free of any interface therein and continuously extend through the electrically conductive electrode 46 and the electrically conductive via contact 66 within a respective integrated line and via structure (46, 66). If a metallic liner 461 is present within a line and via structure (46, 66), the metallic liner 461 can be a continuous material portion that is free of any interface therein and continuously extends through the electrically conductive electrode 46 and the electrically conductive via contact 66 within the integrated line and via structure (46, 66). Each conductive material portion 462 within an integrated line and via structure (46, 66) can continuously extend at least from a horizontal plane including the topmost surface of the alternating stack (32, 46) to a sidewall of the conductive material portion 462 located underneath another horizontal plane including a top surface of the electrically conductive electrode 46 within the integrated line and via structure (46, 66).

In one embodiment, each of the plurality of integrated line and via structures (46, 66) can have a topmost surface that is coplanar with the top surface of the alternating stack (32, 46), and electrically conductive electrodes 46 within the plurality of integrated line and via structures (32, 46) can be located at different levels within the alternating stack (32, 46). The different levels are vertically spaced by at least one insulator layer 32. In one embodiment, a dielectric liner 46 can laterally surround each electrically conductive contact 66 within the plurality of integrated line and via structures (46, 66). Each of the plurality of integrated line and via structures (46, 66) can be electrically isolated from one another by the insulator layers 32 and the dielectric liners 64.

Figure 15:
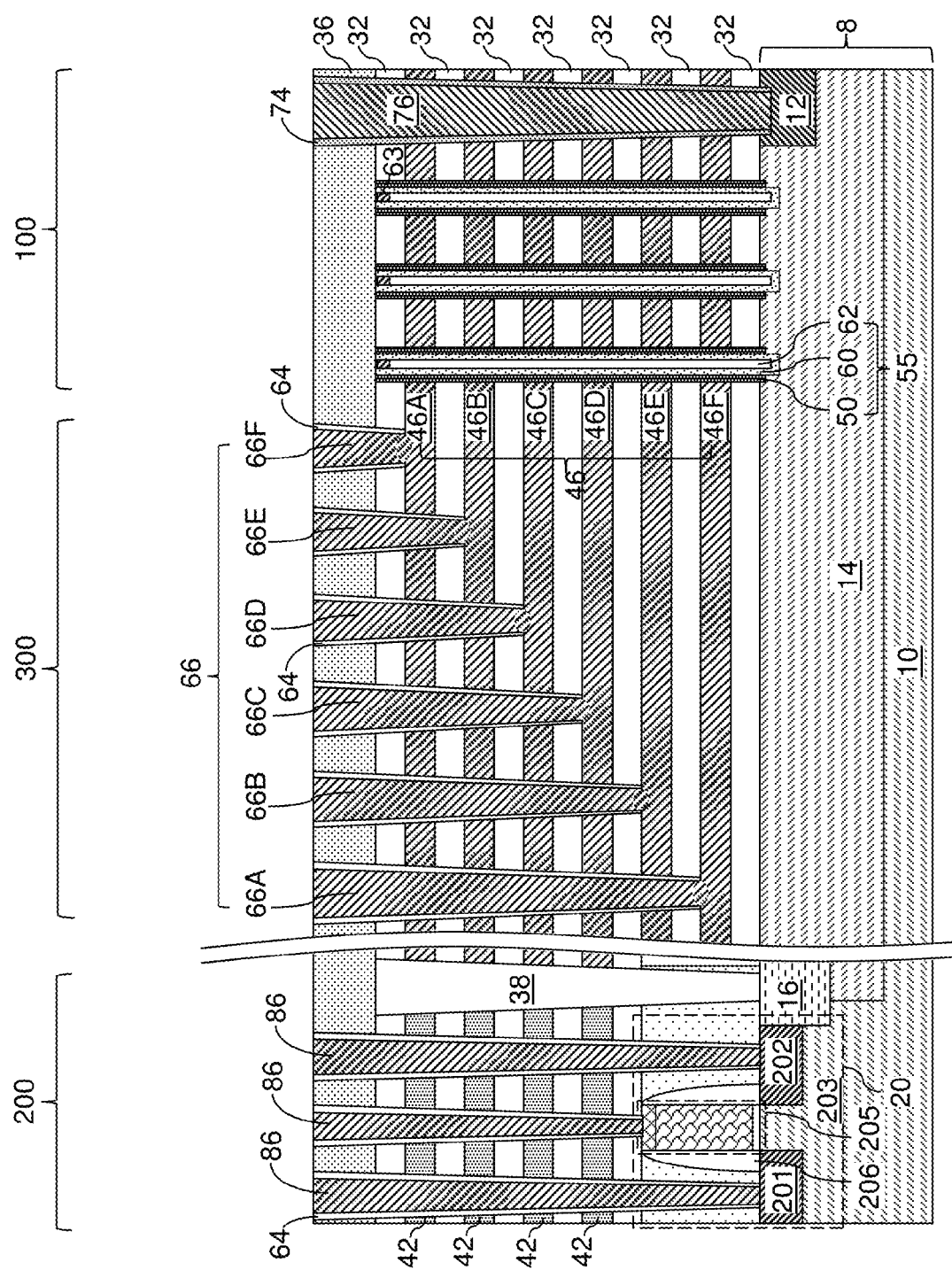

Referring to FIG. 15, an insulating spacer 74 can be formed on the sidewalls of the backside contact trench 79 (See FIG. 11) by deposition of a continuous dielectric material layer and an anisotropic etch. The insulating spacer 74 includes a dielectric material that can be the same as, or different from, the dielectric material of the insulating liners 64. For example, the insulating spacer 74 can include silicon oxide, silicon nitride, a dielectric metal oxide, a dielectric metal oxynitride, or a combination thereof. The thickness of the insulating spacer 74, as measured at a bottom portion thereof, can be in a range from 1 nm to 50 nm, although lesser and greater thicknesses can also be employed. In one embodiment, the thickness of the insulating spacer 74 can be in a range from 3 nm to 10 nm.

The backside contact trench 79 can be subsequently filled with a fill layer of another conductive material, which is herein referred to as a second conductive material. The second conductive material can be the same as, or can be different from, the first conductive material, i.e., the conductive material of the integrated line and via structures (46, 66). The second conductive material can be an electrically conducting material, and can include a metal such as tungsten and/or a metal nitride. The deposited second conductive material can be planarized employing the mask layer 36 as a stopping layer for the planarization process. Specifically, the portion of the conductive material formed over a horizontal plane including the top surface of the mask layer 36 can be removed, for example, by chemical mechanical planarization, a recess etch, or a combination of a recess etch and chemical mechanical planarization. Remaining portions of the second conductive material after the planarization process constitutes a backside contact 76, which can provide a vertically conductive electrical path to an electrical node of a device component within, or on, the substrate 8 and underneath the alternating stack (32, 46). The backside contact 76 can be a source line electrically connected to a source region in the substrate 8. The top surface of the backside contact 76 can be coplanar with the top surface of the mask layer 36.

In one embodiment, each electrically conductive electrode 46 among the plurality of line and via structures (46, 66) can comprise a word line that function as a common control gate electrode for the plurality of stacked memory devices including the memory stack structures 55. In one embodiment, at least one of the plurality of contact opening 69 (e.g., a first contact opening 69A) can have a first periphery contained entirety within a sidewall of one of the sacrificial material layers 42 (e.g., the N-th-from-top sacrificial material layer 42F) and a second periphery contained entirely within a sidewall of another of the sacrificial material layers 42 (e.g., the (N−1)-th-from-top sacrificial material layer 42E). In one embodiment, at least one of the plurality of contact opening 69 (e.g., a first contact opening 69A) can have a first periphery contained entirety within a sidewall of one of the insulator layers 32 (e.g., the (N−1)-th-from-top insulator layer 32E) and a second periphery contained entirely within a sidewall of another of the insulator layer 32 (e.g., the (N−2)-th-from-top sacrificial material layer 42D).

The first exemplary structure of FIG. 15 includes a memory device, which comprises at least one memory cell (12, 55, 63) located on a substrate 8. Each of the at least one memory cell contains a semiconductor channel 60 including a vertical portion extending substantially perpendicular to a top surface of the substrate 8 and further includes a memory film 50 contacting an outer sidewall of the semiconductor channel 60. The memory device further comprises an alternating stack (32, 46) of insulator layers 32 and electrically conductive electrodes 46 that laterally surrounds portions of the at least one memory cell (12, 55, 63). The memory device further comprises a plurality of integrated line and via structures (46, 66) embedded within the insulator layers 32. Each of the plurality of integrated line and via structures (32, 46) comprises a respective one of the electrically conductive electrodes 46 and an electrically conductive via contact 66 that adjoins, and overlies, the respective electrically conductive electrode 46 such that a conductive material portion 462 without an interface therein continuously extends through the respective electrically conductive electrode 46 and the electrically conductive via contact 66. Each instance of the electrically conductive electrodes 46 is a portion of a respective one of the plurality of integrated line and via structures (46, 66).

In one embodiment, each instance of the electrically conductive electrodes 46 can include a control gate electrode for the at least one memory cell (12, 55, 63). The memory device can further include a source region 12 located within, or on, the substrate 8 and contacting a bottom surface of the at least one semiconductor channel 60. The memory device can further include a drain region 63 located on a top surface of one of the at least one semiconductor channel 60.

The memory device can include a dielectric liner 64 (e.g., the dielectric liner 64 in contact with a first electrically conductive via contact 66A) having an outer sidewall and an inner sidewall. The outer sidewall can contact a first electrically conductive electrode (e.g., the (N−2)-th-from-top electrically conductive electrode 46D) within a first integrated line and via structure (66A, 46F) (e.g., the integrated line and via structure including a third electrically conductive via contact 66C and the (N−2)-th-from-top electrically conductive electrode 46D), and a second electrically conductive electrode (e.g., the (N−1)-th-from-top electrically conductive electrode 46E) within a second integrated line and via structure (66B, 46E) (e.g., the integrated line and via structure including a second electrically conductive via contact 66B and the (N−1)-th-from-top electrically conductive electrode 46E). The second line structure (e.g., the (N−1)-th-from-top electrically conductive electrode 46E) underlies the first line structure (e.g., the (N−2)-th-from-top electrically conductive electrode 46D). The inner sidewall can contact an electrically conductive via contact (e.g., a first electrically conductive via contact 66A) within a third integrated line and via structure (66C, 46D) (e.g., the integrated line and via structure including the first electrically conductive via contact 66A and the N-th-from-top electrically conductive electrode 46F) that contains a third line structure (e.g., the N-th-from-top electrically conductive electrode 46F) underlying the second line structure (e.g., the (N−1)-th-from-top electrically conductive electrode 46E).

Figure 16:
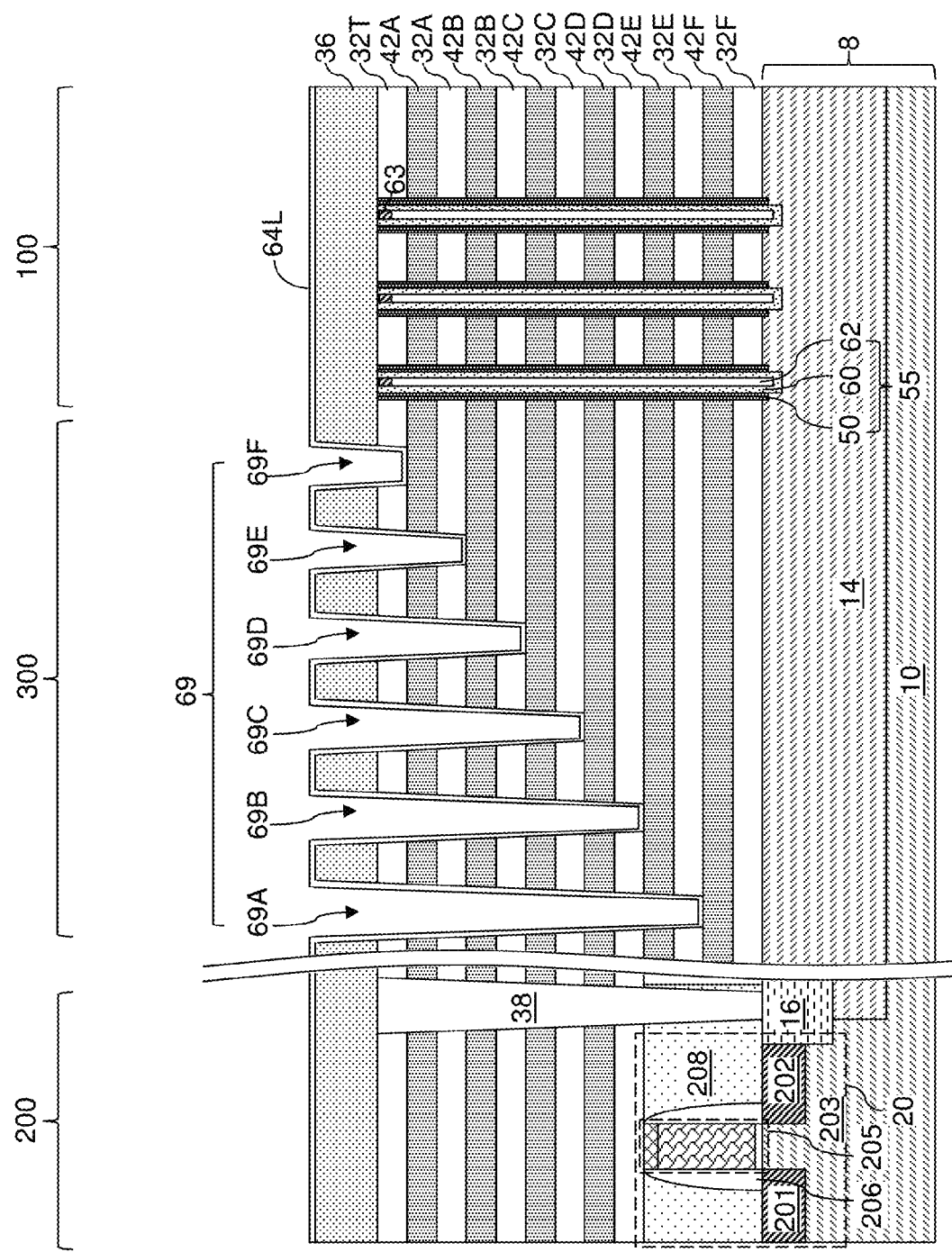
FIGS. 16-26 illustrate sequential vertical cross-sectional views of a second exemplary structure employed to fabricate a device structure containing vertical NAND memory devices according to a second embodiment of the present disclosure.

Referring to FIG. 16, a second exemplary structure according to a second embodiment of the present disclosure can be derived from the first exemplary structure of FIG. 7 by omitting the processing steps of FIG. 8 and by performing the processing steps of FIG. 9 to form a continuous insulating material layer 64L.

Figure 17:
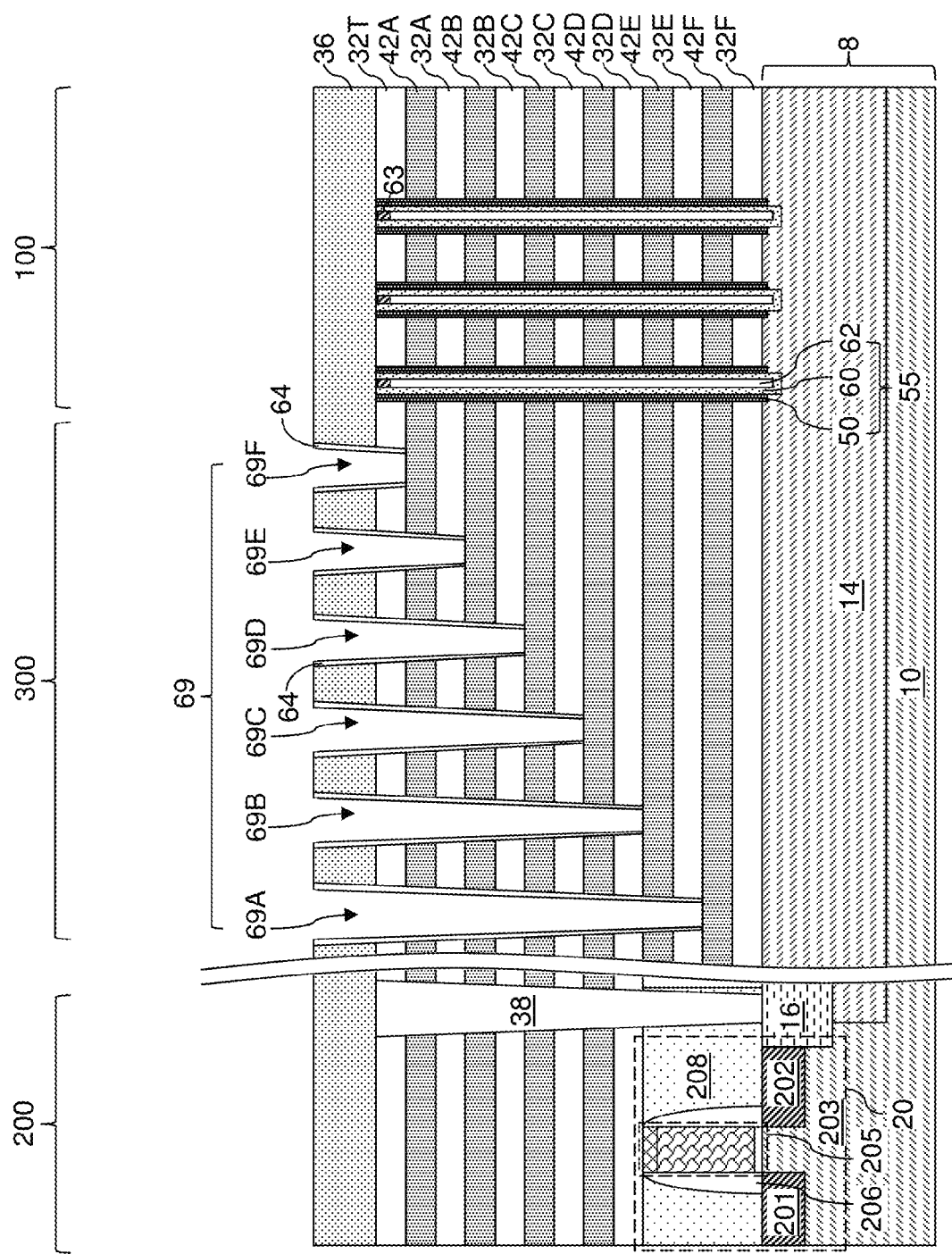

Referring to FIG. 17, the processing steps of FIG. 9 are performed to form insulating liners 64 on the sidewalls of the plurality of contact openings 69. The insulating liners 64 can be formed on each sidewall of the plurality of contact openings 69 by performing an anisotropic etch of the continuous insulating material layer 64L. Specifically, upon anisotropically etching the continuous insulating material layer 64L, each remaining portion of the continuous insulating material layer 74L constitutes an insulating liner 64. A portion of a top surface of a sacrificial material layer 42 is physically exposed at the bottom of each of the plurality of contact openings 69. Each insulating liner 64 can be topologically homeomorphic to a torus.

Figure 18:
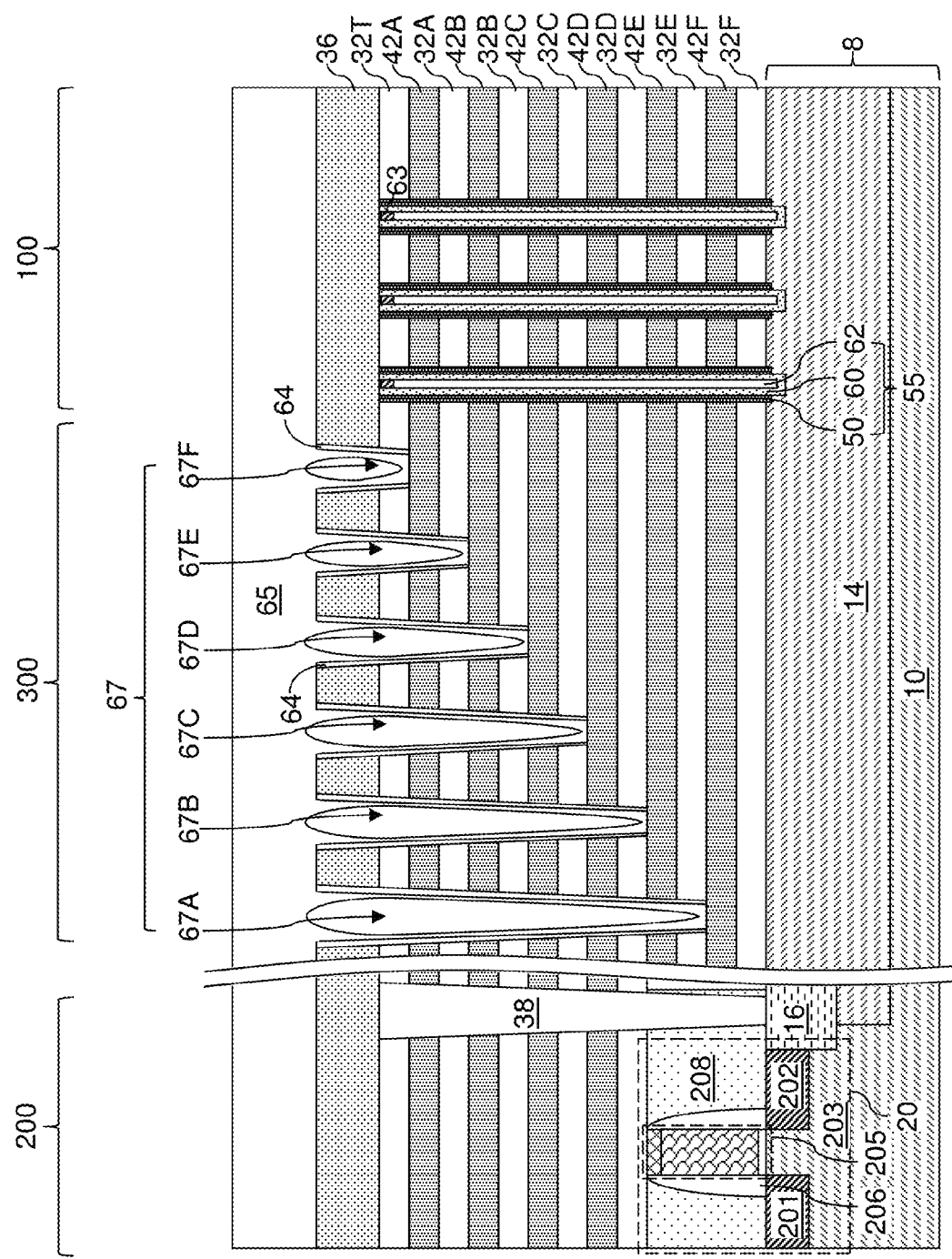

Referring to FIG. 18, a continuous material layer 65 is formed by deposition of a disposable material. The continuous material layer 65 is a non-conformal layer formed non-conformal deposition of the dielectric material. As used herein, a "non-conformal deposition" or an "anisotropic deposition" refers to a deposition process in which a material is non-conformally deposited, i.e., with different thicknesses at different locations. As used herein, a "disposable material" refers to a material that is temporarily present and is removed in a subsequent processing step. The disposable material is different from the second material, i.e., the material of the sacrificial material layers 42.

In one embodiment, the disposable material can be a dielectric material such as a doped silicate glass, an undoped silicate glass, an organosilicate glass (which is also referred to as a SiCOH dielectric material), amorphous carbon, diamond-like carbon (DLC), or a combination thereof. In another embodiment, the disposable material can be a semiconductor material such as an elemental semiconductor material, an alloy of at least two elemental semiconductor materials, a compound semiconductor material, an organic semiconductor material, or a combination thereof. For example, the disposable material can include amorphous silicon or polycrystalline silicon. The non-conformal deposition process can be, for example, plasma enhanced chemical vapor deposition (PECVD), physical vapor deposition (PVD), molecular beam deposition, cluster beam ion implantation, or any other deposition method that can provide a directional impingement of molecules or clusters of a deposited material along the direction substantially normal to the top surface of the substrate 8.

The disposable material is deposited into, and over, the plurality of contact openings 69 (See FIG. 22) and over the mask layer 36 with such an angular distribution in the direction of impingement of the deposited molecules or material clusters that induces formation of a plurality of encapsulated unfilled cavities 67, which are herein referred to as "air gaps" or "contact opening air gaps." As used herein, an "encapsulated cavity" refers to a volume defined by a set of surfaces of at least one condensed phase material such that the set of surfaces collectively constitutes a closed surface in a three-dimensional space. As used herein, an "encapsulated unfilled cavity" refers to an encapsulated cavity devoid of any condensed phase material. As used herein, a "condensed phase material" refers to any of a solid material and a liquid material. As used herein, a "closed surface" refers to a surface that does not have any hole therein. In one embodiment, each encapsulated unfilled cavity 67 can be topologically homeomorphic to a sphere. In general, the less the angular spread in the distribution in the direction of impingement of the deposited molecules or material clusters, the lower the step coverage (the ability of the deposited material to fill voids having a high aspect ratio) of the deposited material, and the greater the size of the encapsulated unfilled cavities 67 formed by the deposition of the deposited material. It is understood that "air gaps" of the present disclosure may include air or an inert gas, or may contain vacuum.

The disposable material of the continuous material layer 65 can be deposited non-conformally on the surfaces of the insulating liners 64. The plurality of encapsulated unfilled cavities 67 include volumes of the plurality of contact openings 69 that are not filled with the non-conformally deposited material. The plurality of encapsulated unfilled cavities 67 can additionally include volumes above the top surface of the mask layer 36 and underneath bottom surfaces of the horizontally extending portion of the continuous material layer 65, which is located above the horizontal plane including the top surface of the mask layer 36. Due to the variations in the depths of the contact openings 69, the vertical dimension (as measured from the bottommost portion to the topmost portion) of each encapsulated unfilled cavity 67 can be different. For example, at least one first encapsulated unfilled cavity 67A including a volume of a first contact opening 69A (See FIG. 22) can have a first vertical dimension, and at least one second encapsulated unfilled cavity 67B including a volume of a second contact opening 69B (See FIG. 22) can have a second vertical dimension that is less than the first vertical dimension. In one embodiment, a pair of an i-th encapsulated unfilled cavity (67A, 67B, 67C, 67D, 67E, or 67F) including a volume of an i-th contact opening (69A, 69B, 69C, 69D, 69E, or 69F) and a j-th encapsulated unfilled cavity (67A, 67B, 67C, 67D, 67E, or 67F) including a volume of a j-th contact opening (69A, 69B, 69C, 69D, 69E, or 69F), for which each of the positive integers i and j does not exceed N and is different from each other, can have different vertical dimensions. In one embodiment, the plurality of encapsulated unfilled cavities 67 can include a set of encapsulated unfilled cavities 67 that extend vertically over a different number of the sacrificial material layers 42 and/or over a different number of the insulator layers 32.

Each encapsulated unfilled cavity 67 is formed underneath the horizontally extending portion of the continuous material layer 65 including the non-conformally deposited material. The portions of the continuous material layer 65 located below the horizontal plane including the top surface of the mask layer 36 and extending into volumes of the contact openings 69 constitute encapsulating liner portions. Surfaces of the encapsulating liner portions constitute surfaces of the plurality of encapsulated unfilled cavities 67.

After the processing steps of FIG. 18, an in-process device structure is formed. As used herein, an "in-process" device structure refers to a transitory device structure that is formed at one step during a series of processing sequences, and can be subsequently altered upon performance of additional processing steps in the series of processing steps. The in-process device structure includes a stack (32, 42) including an alternating plurality of material layers (e.g., the sacrificial material layers 42) and insulator layers 32 and located over a top surface of a substrate 8. The in-process device structure further includes a plurality of contact openings 69 (See FIG. 22) located within the stack (32, 42). Each of the plurality of contact openings 69 extends at least from a topmost surface of the alternating stack (32, 42) to a surface of a respective material layer (i.e., the various sacrificial material layers 42) among the material layers. The respective material layers are located at different levels. The in-process device structure further includes a continuous material layer 65 overlying the stack (32, 42). A plurality of encapsulated unfilled cavities 67 is present underneath surfaces of the continuous material layer 65 that extend downward from above a horizontal plane including the top surface of the stack (32, 42) into the plurality of contact openings 69. Each of the plurality of encapsulated unfilled cavities 67 occupies a portion of a volume of a respective one of the plurality of contact openings 69.

In one embodiment, the alternating plurality of material layers can include the sacrificial material layers 42, which can include a dielectric material such as silicon nitride. A bottom surface of each portion of the continuous material layer 65 in the plurality of contact openings can be in contact with a respective sacrificial material layer 42.

At least one in-process memory cell (12, 55, 63) can be located on the substrate 8. Each of the at least one in-process memory cell (12, 55, 63) can include a semiconductor channel 60 including a vertical portion extending substantially perpendicular to a top surface of the substrate 8, and a memory film 50 contacting an outer sidewall of the semiconductor channel 60. In one embodiment, at least one of the plurality of contact opening 69 (e.g., a first contact opening 69A) can have a first periphery contained entirely within a sidewall of one of the sacrificial material layers 42 (e.g., the N-th-from-top sacrificial material layer 42F) and a second periphery contained entirely within a sidewall of another of the sacrificial material layers 42 (e.g., the (N−1)-th-from-top sacrificial material layer 42E). In one embodiment, at least one of the plurality of contact opening 69 (e.g., a first contact opening 69A) can have a first periphery contained entirely within a sidewall of one of the insulator layers 32 (e.g., the (N−1)-th-from-top insulator layer 32E) and a second periphery contained entirely within a sidewall of another of the insulator layer 32 (e.g., the (N−2)-th-from-top sacrificial material layer 42D).

Figure 19:
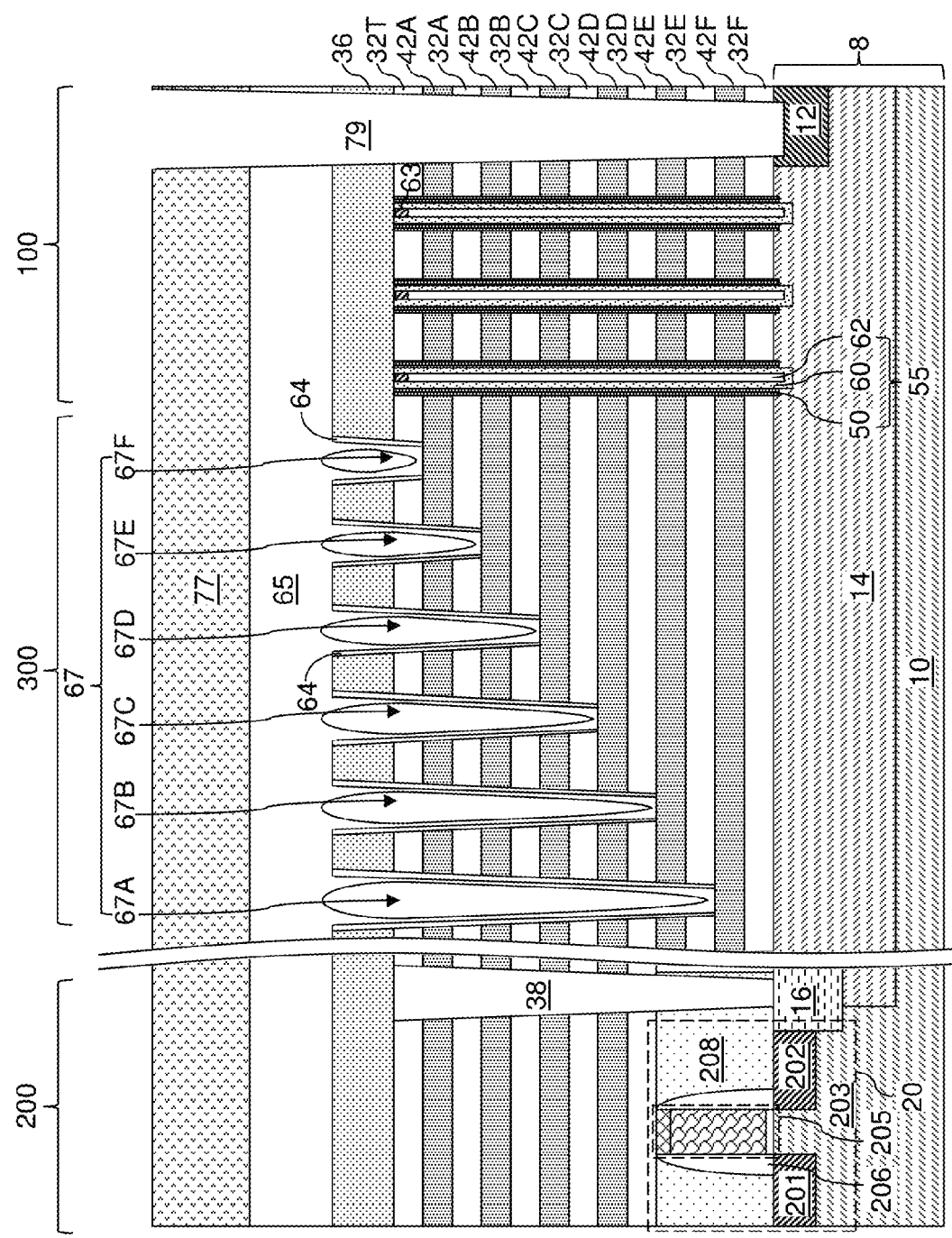

Referring to FIG. 19, a photoresist layer 77 can be applied over the stack of the mask layer 36 and the continuous material layer 65, and lithographically patterned to form at least one opening in an area in which formation of a backside contact 76 (See FIG. 32) is desired. The pattern in the photoresist layer 77 can be transferred through the continuous material layer 65, the mask layer 36, and the alternating stack (32, 42) employing an anisotropic etch to form a via trench that extends at least to the top surface of the substrate 8. The via trench that extends at least to the top surface of the substrate 8 is a contact opening, and is herein referred to as a backside contact trench 79. In one embodiment, the surface that is physically exposed at the bottom of the backside contact trench 79 can be implanted with electrical dopants, such as p-type dopants or n-type dopants, to form a source region 12 for vertical memory devices including the memory stack structures 55. The photoresist layer 77 can be subsequently removed, for example, by ashing. Sidewalls of the sacrificial material layers 42 and sidewalls of the insulator layers 32 are physically exposed as surfaces of the backside contact trench 79.

Figure 20:
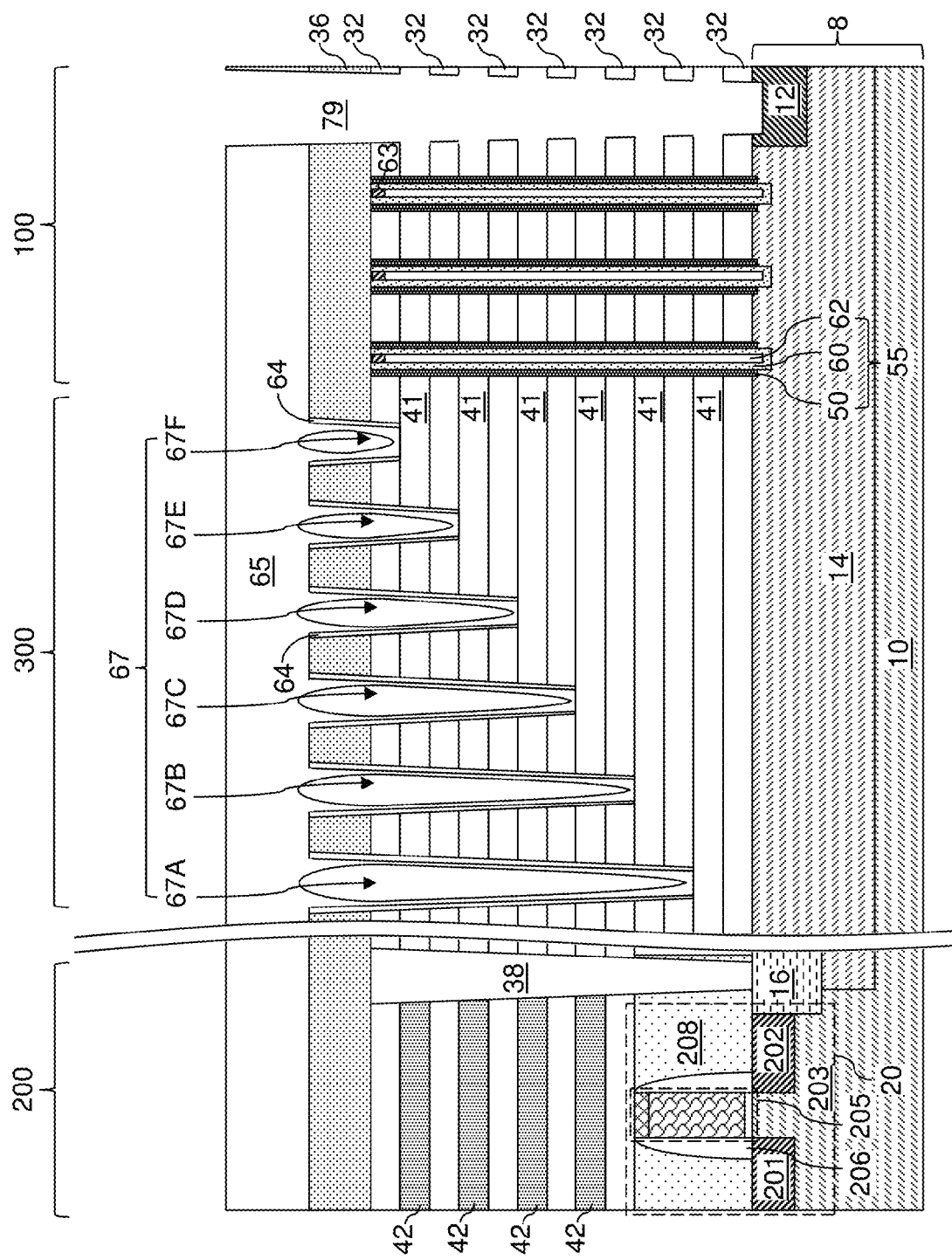

Referring to FIG. 20, the processing steps of FIG. 12 are performed to form a plurality of recesses 41. The sacrificial material layers 42 (See FIG. 19) can be removed selective to the insulator layers 32 to form a plurality of recesses 41 while the plurality of encapsulated unfilled cavities 67 is present. The backside contact trench 79 can be employed as a conduit that introduces etchants for removing the second material of the sacrificial material layers 42 during the selective etch process that forms the plurality of recesses 41. In this case, the removal of the etched portions of the sacrificial material layers 42 selective to the insulator layers 32 can be performed by introducing an etchant to the sacrificial material layers 42 through the backside contact trench 79. The insulating liners 64 protect the sidewalls of each of the plurality of contact openings 69 from an etchant used to remove at least a portion of each sacrificial material layer 42.

The plurality of recesses 41 can extend substantially parallel to the top surface of the substrate 8. Because a bottom portion of the continuous material layer 65 is present at the bottom of each contact opening 69, a surface of each of the plurality of recesses 41 can be a bottom surface of a respective portion of the non-conformally deposited material, i.e., a respective portion of the continuous material layer 65.

Figure 21:
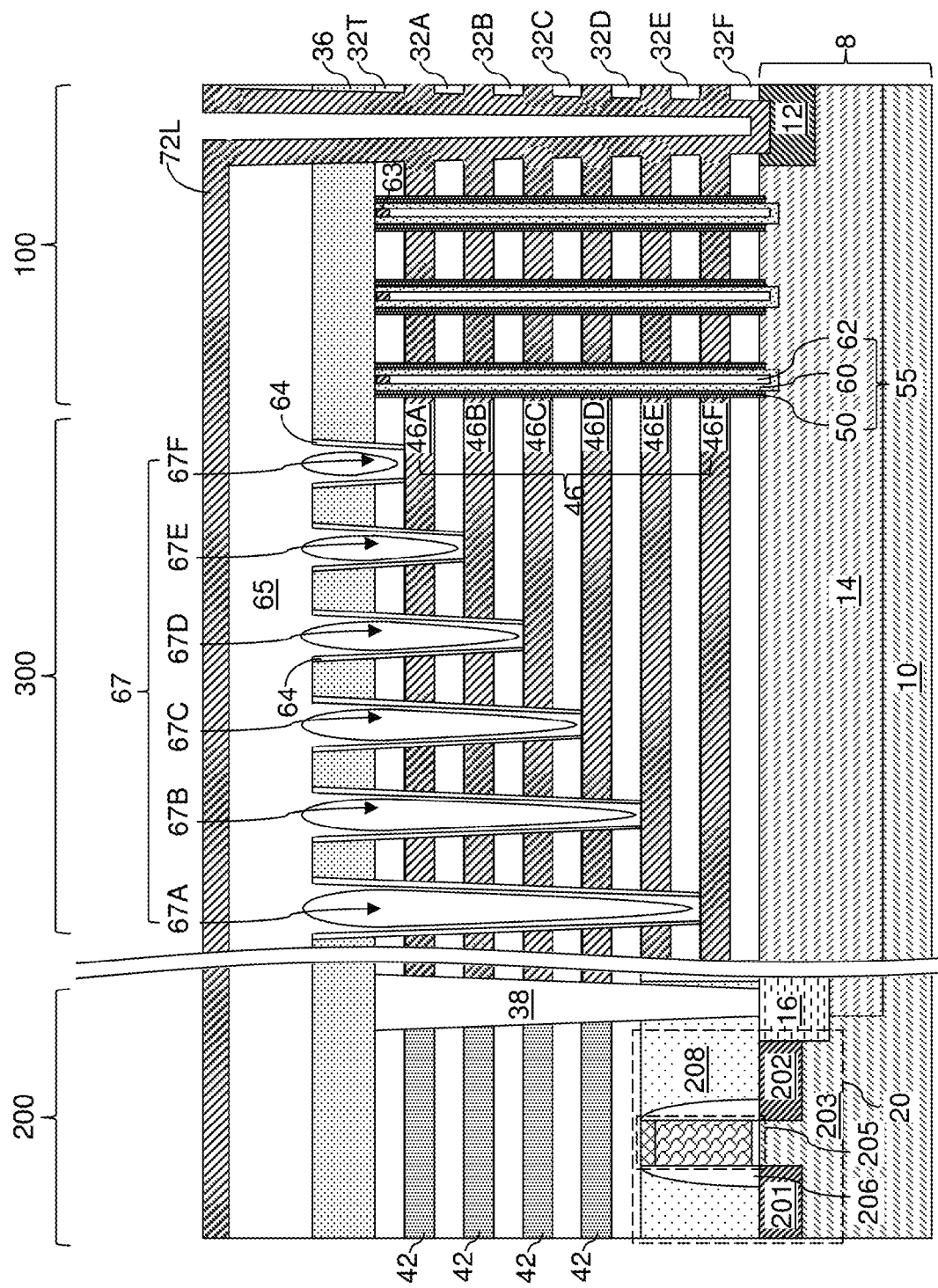

Referring to FIG. 21, the processing steps of FIG. 13 can be subsequently performed to simultaneously deposit a conductive material in the plurality of recesses 41 and the backside contact trench 79, and over the top surface of the continuous material layer 65. The conductive material is herein referred to as a first conductive material, or an electrically conductive electrode material. The first conductive material can be deposited employing the same type of processing steps as in the processing steps of FIG. 18. The backside contact trench 79 can be employed as a conduit that introduces the first conductive material into the plurality of recesses 41. In this case, the deposition of the first conductive material into the plurality of recesses 41 can be performed by introducing of the deposited conductive material into the plurality of recesses 41 through the backside contact trench 79. The insulating liners 64 and continuous material layer 65 (which is a non-conformal layer) substantially prevent the electrically conductive electrode material from covering (i.e., contacting) the sidewalls of each contact opening 69.

Simultaneous deposition of the conductive material in the plurality of recesses 41, on the sidewalls and the bottom surface of the backside contact trench 79 (See FIG. 17), and over the top surface of the continuous material layer 65 forms a plurality of electrically conductive electrodes 46 in the plurality of recesses 41 and a continuous conductive material layer 72L. Each electrically conductive electrode 46 can be a conductive line structure. The continuous conductive material layer 72L includes a portion formed on the sidewalls of the bottom surface of the backside contact trench 79, and a portion overlying the top surface of the mask layer 36. The continuous conductive material layer 72L and the plurality of electrically conductive electrodes 46 are formed as an integral structure, i.e., a single continuous structure.

After the processing steps of FIG. 21, an in-process device structure is formed. The in-process device structure includes a stack (32, 46) including an alternating plurality of material layers (e.g., the electrically conductive electrodes 46) and insulator layers 32 and located over a top surface of a substrate 8. The in-process device structure further includes a plurality of contact openings 69 (See FIG. 22) located within the stack (32, 46). Each of the plurality of contact openings 69 extends at least from a topmost surface of the alternating stack (32, 46) to a surface of a respective material layer (i.e., the various electrically conductive electrodes 46) among the material layers. The respective material layers are located at different levels. The in-process device structure further includes a continuous material layer 65 overlying the stack (32, 46). A plurality of encapsulated unfilled cavities 67 is present underneath surfaces of the continuous material layer 65 that extend downward from above a horizontal plane including the top surface of the stack (32, 46) into the plurality of contact openings 69. Each of the plurality of encapsulated unfilled cavities 67 occupies a portion of a volume of a respective one of the plurality of contact openings 69.

In one embodiment, the alternating plurality of material layers can include the electrically conductive electrodes 46, which can include a conductive material such as tungsten. A bottom surface of each portion of the continuous material layer 65 in the plurality of contact openings can be in contact with a respective electrically conductive electrode 46.

Figure 22:
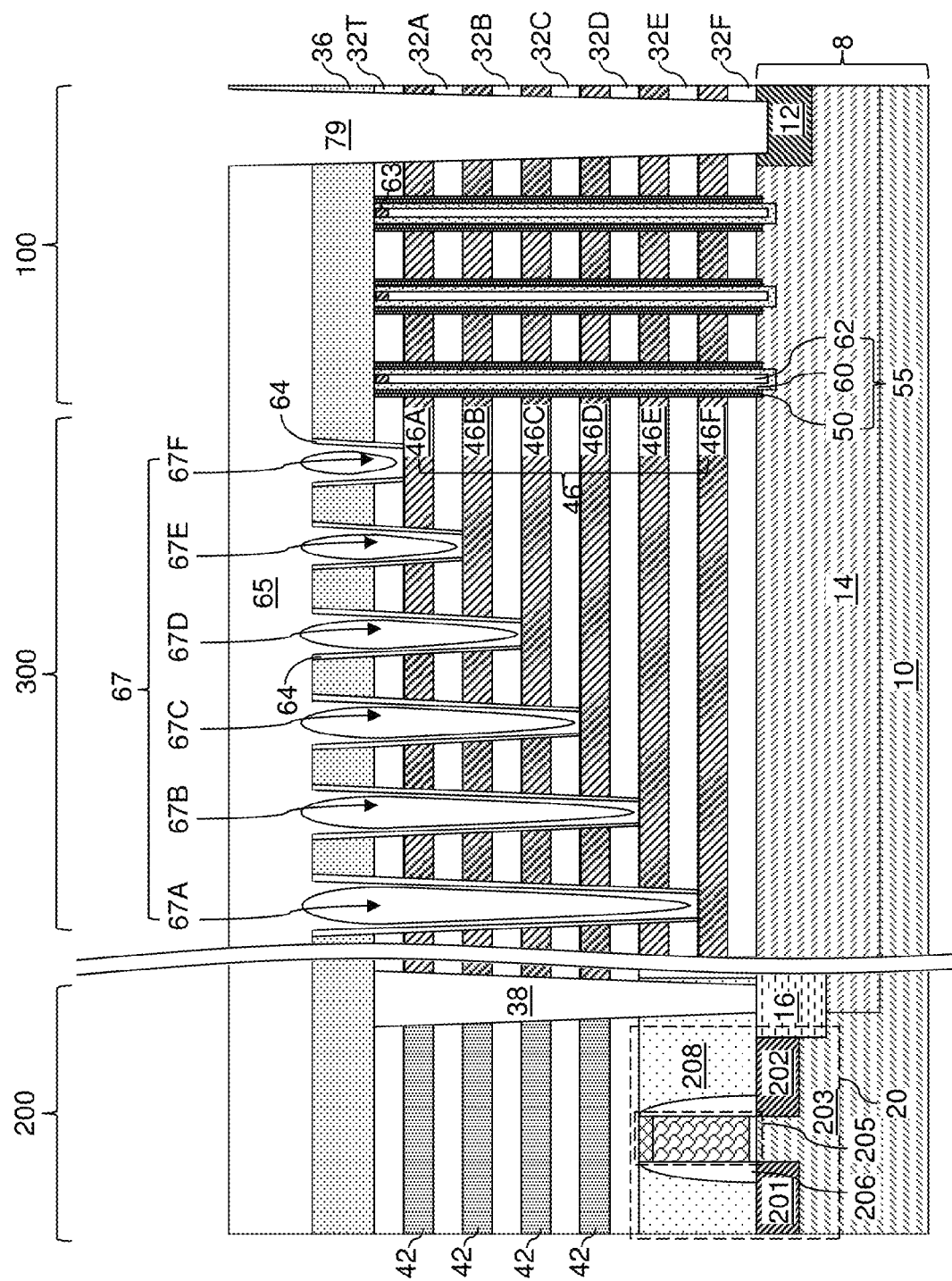

Referring to FIG. 22, the deposited conductive material is etched back, for example, by an isotropic etch. The processing steps of FIG. 14 can be employed. The conductive material layer 72L can be removed by the etch-back process. Remaining continuous portion of the deposited conductive material include a plurality of integrated line and via structures (46, 66).

Figure 23:
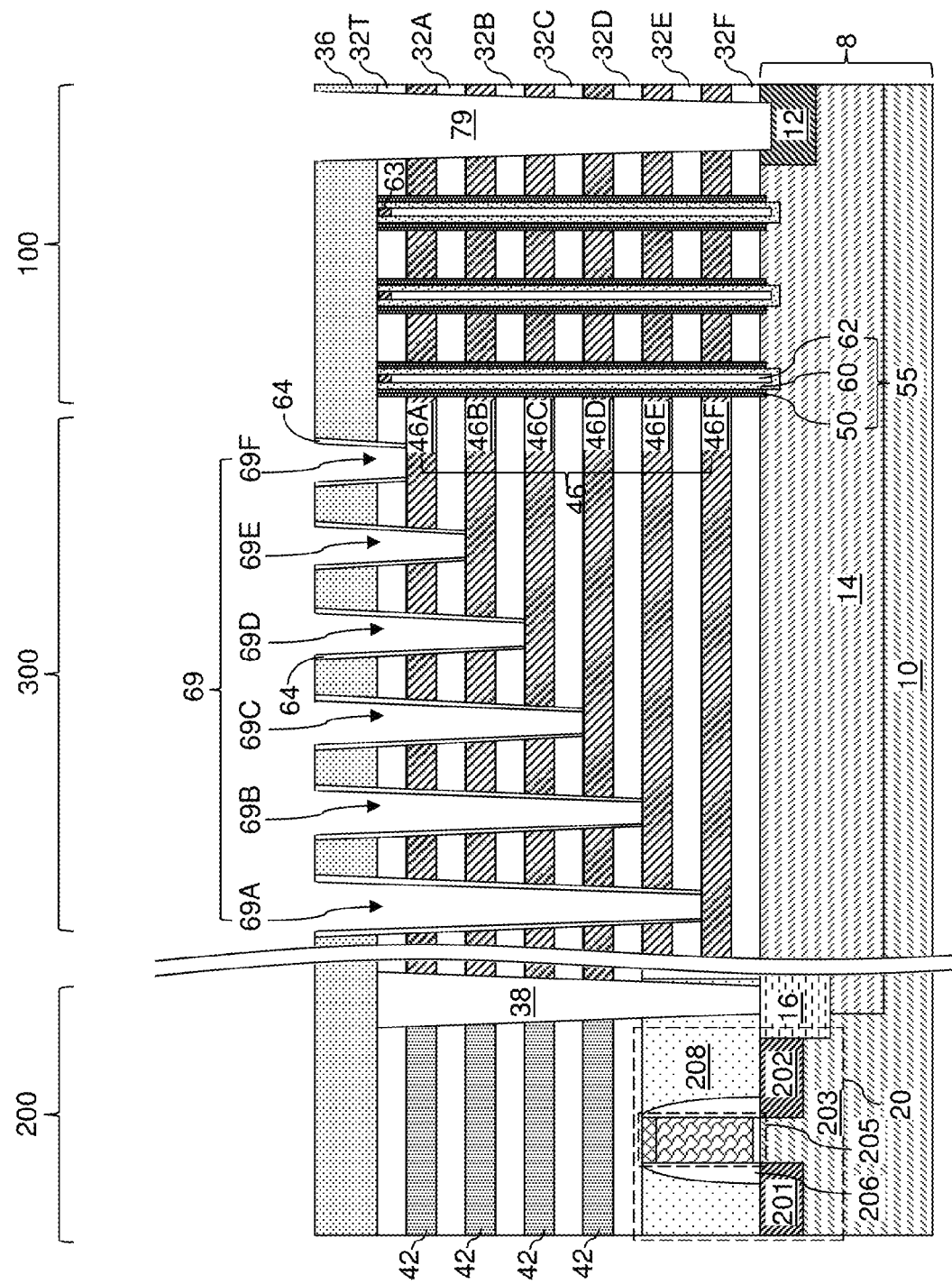

Referring to FIG. 23, the continuous material layer 65 can be removed from above the top surface of the mask layer 36 and from inside the plurality of contact openings 69 without forming a hole in the insulating liners 64. In one embodiment, the continuous material layer 65 can include a material that is different from the material of the insulating liners 64. In this case, the continuous material layer 65 can be removed selective to the material of the insulating liners 64. In another embodiment, the continuous material layer 65 can include the same material as the insulating liners 64. In this case, the horizontally extending portion of the continuous material layer 65 above the top surface of the mask layer 36 can be removed, for example, by a recess etch and/or chemical mechanical planarization, and each bottom portion of the continuous material layer 65 in contact with a top surface of an electrically conductive electrodes 46 can be removed by an anisotropic etch to physically expose a top surface of an underlying electrically conductive electrode 46 within each contact opening 69.

Figure 24:
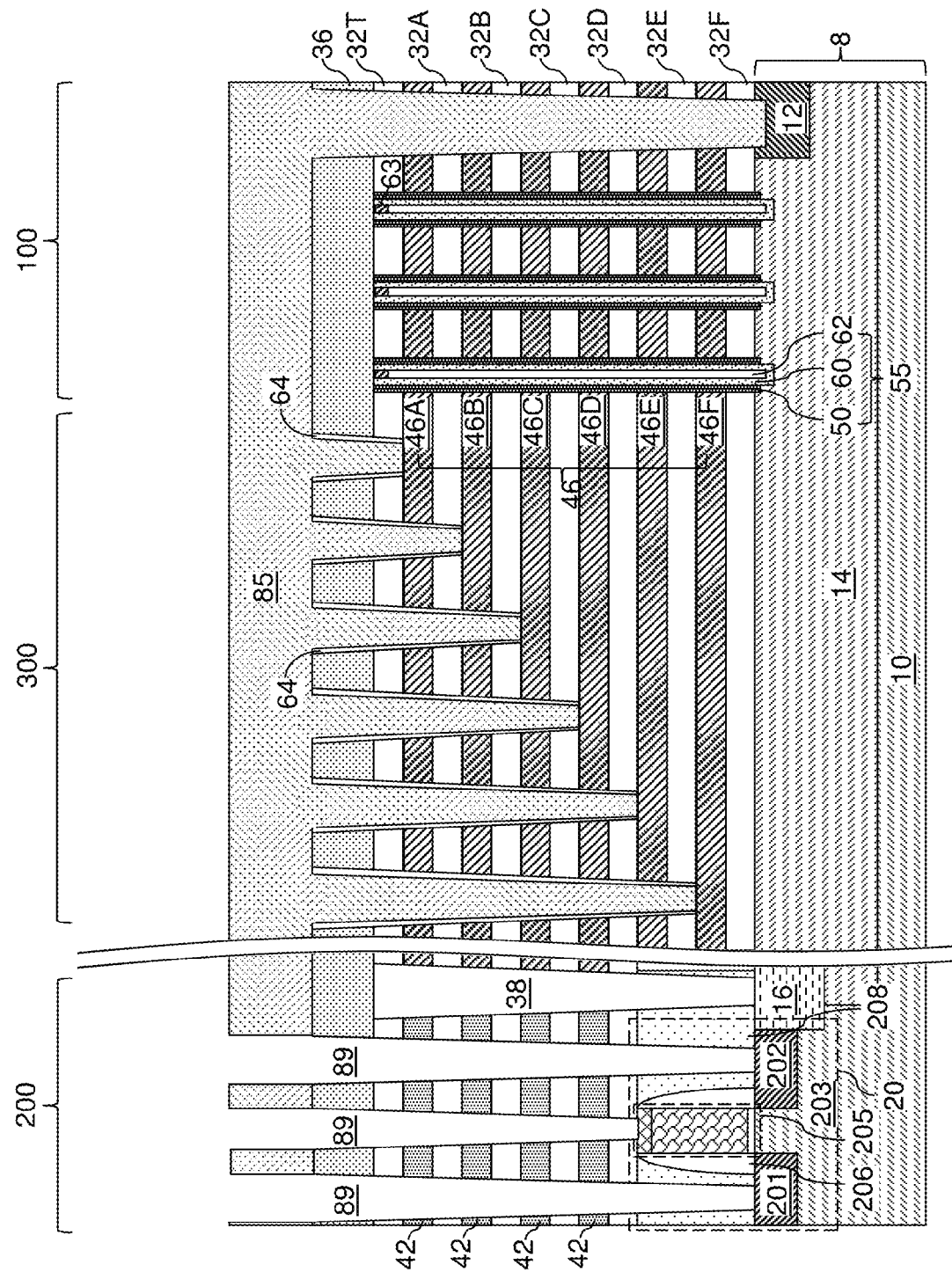

Referring to FIG. 24, the processing steps of FIG. 8 can be performed to form peripheral contact openings 89.

Figure 25:
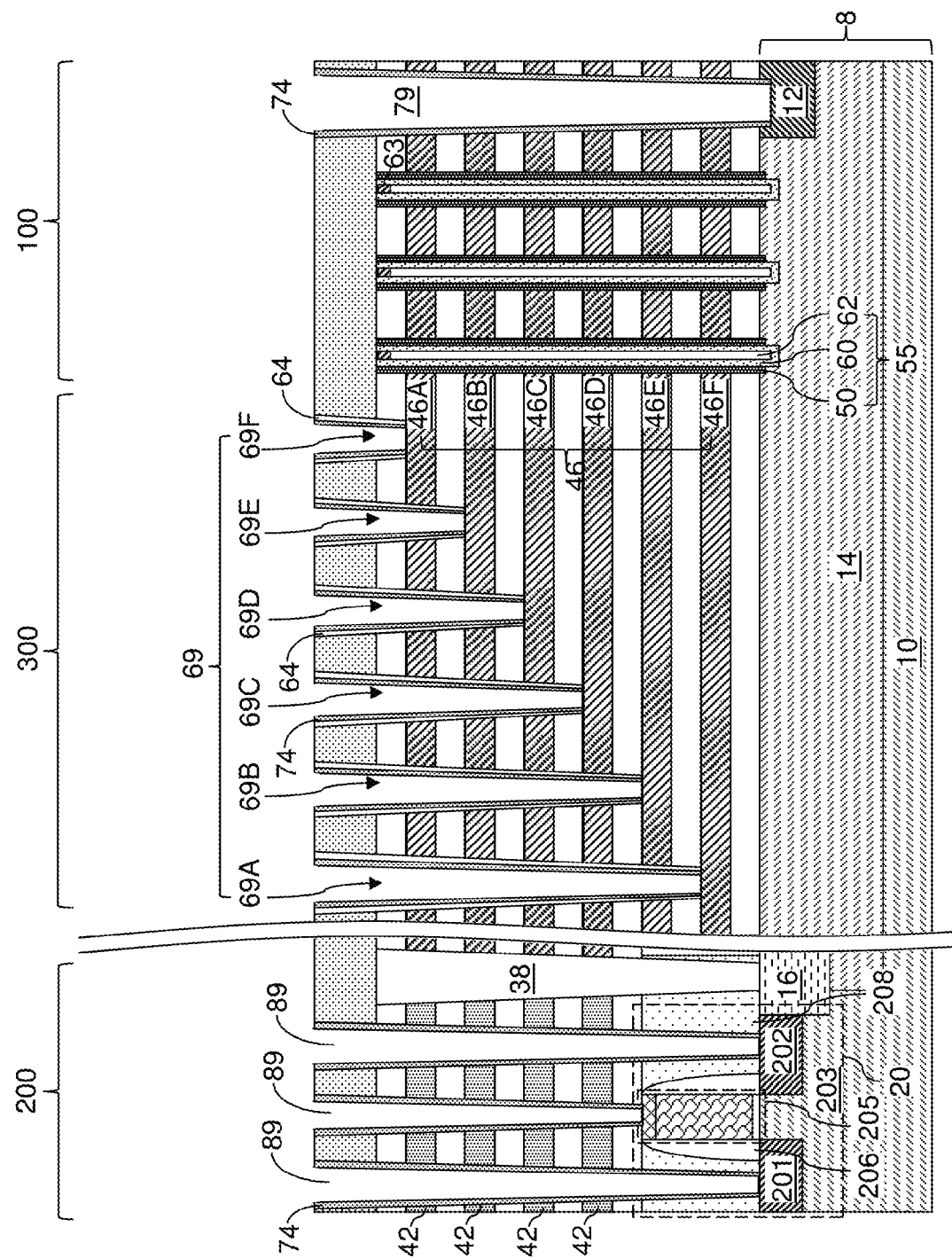

Referring to FIG. 25, insulating spacers 74 can be formed on the sidewalls of the backside contact trench 79, the plurality of contact via trenches 69, and the peripheral contact openings 89. The insulating spacers 74 can be formed by deposition of a continuous dielectric material layer and an anisotropic etch. The insulating spacers 74 includes a dielectric material that can be the same as, or different from, the dielectric material of the insulating liners 64. For example, the insulating spacers 74 can include silicon oxide, silicon nitride, a dielectric metal oxide, a dielectric metal oxynitride, or a combination thereof. The thickness of the insulating spacers 74, as measured at a bottom portion thereof, can be in a range from 1 nm to 50 nm, although lesser and greater thicknesses can also be employed. In one embodiment, the thickness of the insulating spacer 74 can be in a range from 3 nm to 10 nm.

Figure 26:
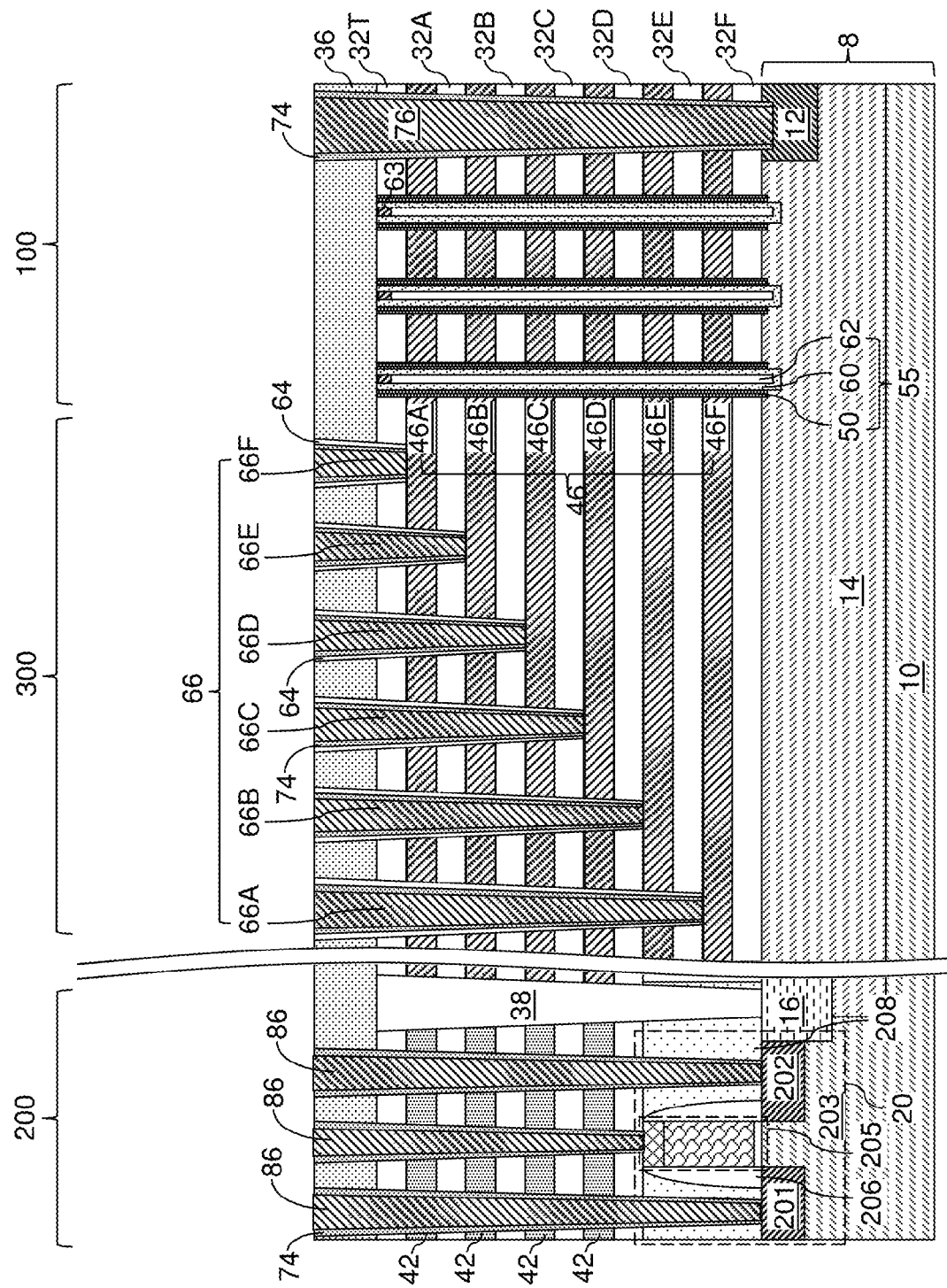

Referring to FIG. 26, the backside contact trench 79, the plurality of contact via trenches 69, and the peripheral contact openings 89 can be subsequently filled with a fill layer of another conductive material, which is herein referred to as a second conductive material. The second conductive material can be the same as, or can be different from, the first conductive material, i.e., the conductive material of the integrated line and via structures (46, 66). The second conductive material can be an electrically conducting material, and can include a metal such as tungsten and/or a metal nitride. The deposited second conductive material can be planarized employing the mask layer 36 as a stopping layer for the planarization process. Specifically, the portion of the conductive material formed over a horizontal plane including the top surface of the mask layer 36 can be removed, for example, by chemical mechanical planarization, a recess etch, or a combination of a recess etch and chemical mechanical planarization. Remaining portions of the second conductive material after the planarization process constitutes a plurality of electrically conductive via contacts 66, a backside contact 76, and peripheral device electrically conductive via contacts 86. The backside contact 76 can be a source line electrically connected to a source region in the substrate 8.

In one embodiment, each electrically conductive electrode 46 among the plurality of line and via structures (46, 66) can comprise a word line that function as a common control gate electrode for the plurality of stacked memory devices including the memory stack structures 55. In one embodiment, at least one of the plurality of contact opening 69 (e.g., a first contact opening 69A) can have a first periphery contained entirety within a sidewall of one of the sacrificial material layers 42 (e.g., the N-th-from-top sacrificial material layer 42F) and a second periphery contained entirely within a sidewall of another of the sacrificial material layers 42 (e.g., the (N−1)-th-from-top sacrificial material layer 42E). In one embodiment, at least one of the plurality of contact opening 69 (e.g., a first contact opening 69A) can have a first periphery contained entirety within a sidewall of one of the insulator layers 32 (e.g., the (N−1)-th-from-top insulator layer 32E) and a second periphery contained entirely within a sidewall of another of the insulator layer 32 (e.g., the (N−2)-th-from-top sacrificial material layer 42D).

The exemplary device of the present disclosure can include a vertical NAND device containing a plurality of semiconductor channels 60. At least one end portion of each of the plurality of semiconductor channels 60 extends substantially perpendicular to the major surface of the substrate 8. The vertical NAND device further contains a plurality of charge storage regions. Each charge storage region located in a memory film 50 and adjacent to a respective one of the plurality of semiconductor channels 60. The vertical NAND device contains a plurality of control gate electrodes, embodied as the electrically conductive electrodes 46, that extend substantially parallel to the major surface of the substrate 8. The plurality of control gate electrodes comprise at least a first control gate electrode (e.g., the first-from-top electrically conductive electrode 46A) located in the first device level and a second control gate electrode (e.g., the second-from-top electrically conductive electrode 46B) located in the second device level below the first device level. The first control gate electrode can comprises an end portion of a first word line of the plurality of word lines, and the second control gate electrode can comprise an end portion of a second word line of the plurality of word lines. The first and the second word lines extend from the memory array region 100 to the contact region 300. In one embodiment, the plurality of word lines can comprise tungsten or titanium nitride and tungsten word lines deposited by chemical vapor deposition.

In one embodiment, a source line 76 extends through a dielectric insulated trench in the stack to electrically contact the semiconductor channels 60. A bit line (not shown) can be electrically connected to the drain regions 63 via at least one contact via structures (not shown). A source select gate electrode (not shown) may be located adjacent to the semiconductor channels 60 between the major surface of the substrate 8 and the plurality of control gate electrodes embodied as the electrically conductive electrodes 46. A drain select gate electrode (not shown) can be located adjacent to the semiconductor channels 60 above the plurality of control gate electrodes.

In the various embodiments of the present disclosure, a total of two photolithography steps can be used during the steps of forming the mask layer 36 with the plurality of openings, forming the plurality of contact openings 69, selectively removing the sacrificial material layers 42, and depositing the plurality of electrically conductive via contacts 46 and the plurality of electrically conductive electrodes 66. Specifically, a first lithography step is employed to pattern the mask layer 36 at a processing step of FIG. 2, and the second lithography step is employed to initially pattern the slimming layer prior to etching the topmost insulator layer 32 at a processing step of FIG. 4. The peripheral contact openings 89 (See, e.g., FIG. 8) can be formed employing only one photolithographic process.

Unlike the prior art methods, sacrificial material layers 42 need not be in a step pattern in the contact region. Thus, in some embodiments of the present disclosure, the sacrificial material layers 42 are not in a step pattern in the contact region, and laterally contact the same sidewall of a dielectric support pillar 38.

In one embodiment, chemical mechanical polishing is not used during the steps of forming the mask layer 36 with the plurality of openings, forming the plurality of contact openings 69, selectively removing the sacrificial material layers 32, and depositing the plurality of electrically conductive via contacts 66 and the plurality of electrically conductive electrodes 46. In one embodiment, unlike the prior art methods, an insulating support pillar is not formed through the stack prior to the step of selectively removing the sacrificial material layers 42.

According to an aspect of the present disclosure, a method of making multi-level contacts is provided. An in-process multilevel device is provided, which comprises a device region and a contact region including a stack of plurality of alternating sacrificial material layers and insulating layers located over a major surface of a substrate. A plurality of contact openings is formed, each of which extends substantially perpendicular to the major surface of the substrate to the plurality of sacrificial material layers. Each of the plurality of contact openings extends through the stack to a respective one of the sacrificial material layers. The sacrificial material layer are selectively removed from the stack to form a plurality of recesses extending substantially parallel to the major surface of the substrate between the insulating layers. A plurality of electrically conductive via contacts is deposited in the plurality of the contact openings and a plurality of electrically conductive electrodes in the plurality of recesses in one deposition step.

According to an aspect of the present disclosure, a method of forming a patterned structure is provided. A stack is formed over a top surface of a substrate. The stack includes an alternating plurality of insulator layers and sacrificial material layers. A plurality of contact openings is formed within the stack. Each of the plurality of contact openings extends from a topmost surface of the stack to a surface of a respective material layer. The respective material layers include sacrificial material layers located at different levels or insulator layers located at different levels. A plurality of recesses is formed by removing the sacrificial material layers selective to the insulator layers. The plurality of recesses extends substantially parallel to the top surface of the substrate. A conductive material is simultaneously deposited in the plurality of contact openings and the plurality of recesses. A plurality of electrically conductive via contacts is formed the plurality of the contact openings and a plurality of electrically conductive electrodes is formed in the plurality of recesses.

According to another aspect of the present disclosure, another method of forming a patterned structure is provided. A stack is formed over a top surface of a substrate. The stack includes an alternating plurality of insulator layers and sacrificial material layers. A mask layer with a plurality of openings is formed over the stack. A layer of a slimming material is formed over the mask layer. Etch processes and trimming processes are alternately performed. Portions of the stack located underneath openings that are not covered by the slimming material are etched in each of the etch processes. A total number of openings not covered by the slimming material increases in each of the trimming processes by partial removal of the slimming material. A plurality of contact openings is formed within the stack by the alternately performed etch processes and trimming processes. Each of the plurality of contact openings extends from a topmost surface of the stack to a surface of a respective material layer. The respective material layers includes sacrificial material layers located at different levels or insulator layers located at different levels.

According to yet another aspect of the present disclosure, a memory device is provided, which includes at least one memory cell located on a substrate. Each of the at least one memory cell contains a semiconductor channel including a vertical portion extending substantially perpendicular to a top surface of the substrate and further including a memory film contacting an outer sidewall of the semiconductor channel. The memory device further includes an alternating stack of insulator layers and electrically conductive electrodes that laterally surrounds portions of the at least one memory cell. The memory device further includes a plurality of integrated line and via structures embedded within the insulator layers. Each of the plurality of integrated line and via structures comprises a respective one of the electrically conductive electrodes and an electrically conductive via contact that adjoins, and overlies, the respective electrically conductive electrode such that a conductive material portion without an interface therein continuously extends through the respective electrically conductive electrode and the electrically conductive via contact. Each instance of the electrically conductive electrodes is a portion of a respective one of the plurality of integrated line and via structures.

According to even another embodiment of the present disclosure, a method of forming a patterned structure is provided. A stack is formed over a top surface of a substrate. The stack includes an alternating plurality of insulator layers and sacrificial material layers. A plurality of contact openings is formed within the stack. Each of the plurality of contact openings extends from a topmost surface of the stack to a surface of a respective material layer. The respective material layers include sacrificial material layers located at different levels or insulator layers located at different levels. A material is non-conformally deposited over the plurality of contact openings. A plurality of encapsulated unfilled cavities is formed underneath a horizontally extending portion of a continuous material layer including the non-conformally deposited material. The plurality of encapsulated unfilled cavities includes volumes of the plurality of contact openings that are not filled with the non-conformally deposited material.

According to still another embodiment of the present disclosure, an in-process device structure is provided. The in-process device structure comprises a stack including an alternating plurality of material layers and insulator layers and located over a top surface of a substrate. The in-process device structure further includes a plurality of contact openings located within the stack. Each of the plurality of contact openings extends from a topmost surface of the stack to a surface of a respective material layer among the material layers. The respective material layers are located at different levels. The in-process device structure further comprises a continuous material layer overlying the stack and including encapsulating liner portions that extend downward from above the topmost surface of the stack into the plurality of contact openings to define a plurality of encapsulated unfilled cavities. Each of the plurality of encapsulated unfilled cavities is in a volume defined by a continuous surface of a respective one of the encapsulating liner portions.

Figure 27:
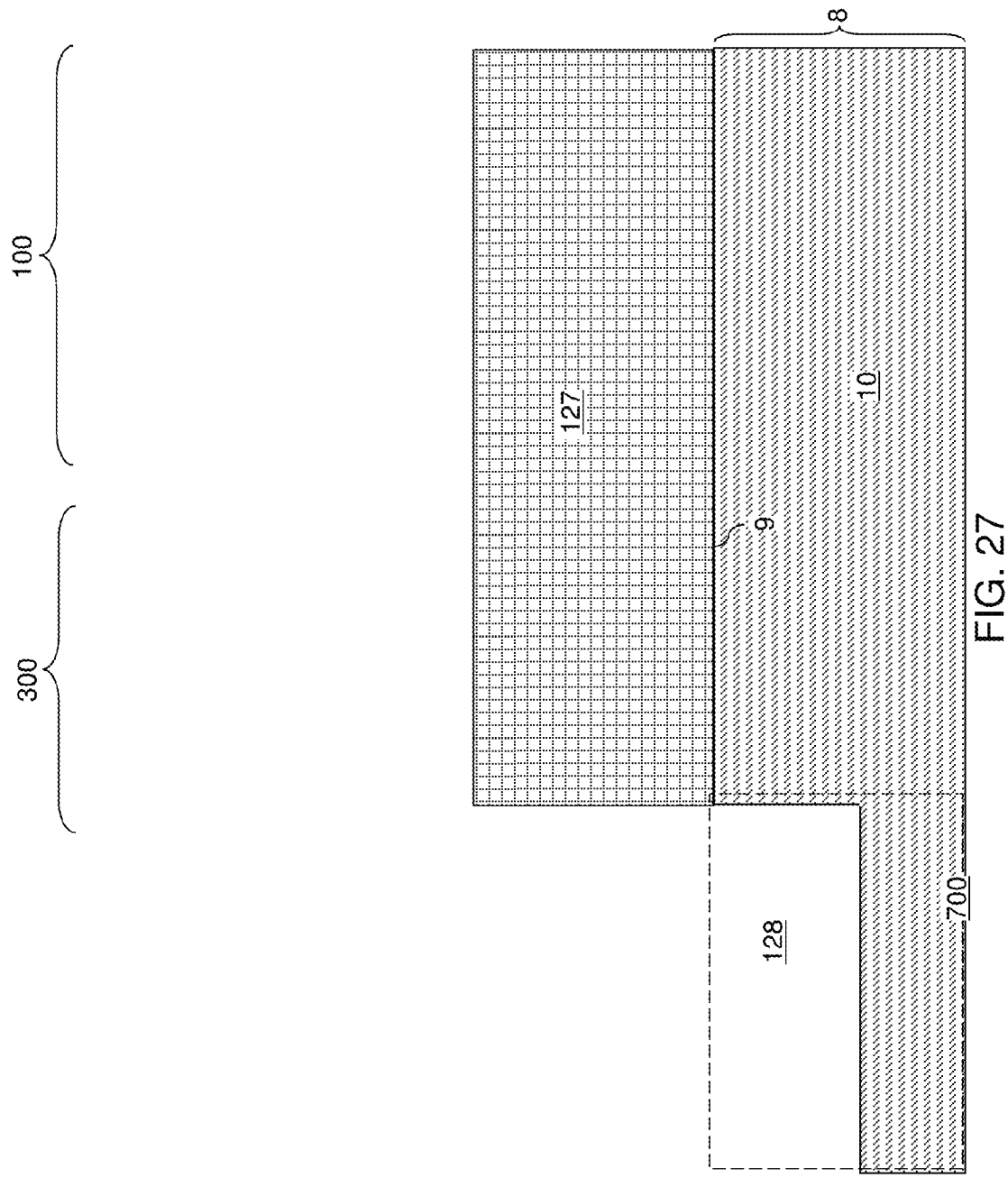
FIGS. 27-48 illustrate sequential vertical cross-sectional views of a third exemplary structure employed to fabricate a device structure containing vertical NAND memory devices at corresponding processing steps according to a third embodiment of the present disclosure.

Referring to FIG. 27, a third exemplary structure according to a third embodiment of the present disclosure includes a substrate 8, which can be a semiconductor substrate. The substrate 8 can include a substrate semiconductor layer 10 at least at an upper portion thereof. The substrate semiconductor layer 10 is a semiconductor material layer, and can include at least one elemental semiconductor material, such as silicon, at least one III-V compound semiconductor material, at least one II-VI compound semiconductor material, at least one organic semiconductor material, or other semiconductor materials known in the art. The substrate 8 has a major surface 9, which can be, for example, a topmost surface of the substrate semiconductor layer 10. The major surface 9 can be a semiconductor surface. In one embodiment, the major surface 9 can be a single crystalline semiconductor surface, such as a single crystal silicon surface.

A patterned masking layer 127 (which can be a patterned photoresist layer) can be formed over the substrate semiconductor layer 10. The patterned masking layer 127 can cover the memory array region 100 in which a memory array is subsequently formed, and a contact region 300 in which contacts to word lines of a three-dimensional memory device are to be subsequently formed. A region of the substrate semiconductor layer 10 not covered by the patterned masking layer 127 is vertically recessed outside the area covered by the patterned masking layer 127 to form a trench 128, which can have substantially vertical sidewalls or tapered sidewalls. An anisotropic etch or an isotropic etch can be performed to vertically recess the region of the substrate semiconductor layer 10 not covered by the patterned masking layer 127. A recessed horizontal surface is formed, which is vertically recessed from the top surface of the substrate semiconductor layer 10, in the region outside of the area of the patterned masking layer 127.

The region (e.g., trench) 128 in which a recessed horizontal surface of the substrate semiconductor layer 10 is formed includes a peripheral device region 700, which is a region in which peripheral semiconductor devices are subsequently formed. The peripheral semiconductor devices may comprise row decoder circuits, sense amplifier circuits or any other word line and/or bit line driver circuits. The depth of recess (e.g., the depth of the trench 128), as measured by the vertical distance between the recessed horizontal surface in the peripheral device region 700 and the topmost surface of the substrate semiconductor layer 10, can be greater than the maximum height of the semiconductor devices to be formed in the peripheral device region 700. For example, the recess depth can be in a range from 100 nm to 1,000 nm, although lesser and greater recess depths can also be employed. In case an anisotropic etch is employed, a periphery of the peripheral device region 700 can include a vertical sidewall that connects the recessed horizontal surface of the substrate semiconductor layer 10 in the peripheral device region 700 to a topmost horizontal surface of the substrate semiconductor layer 10 outside the peripheral device region 700. The patterned masking layer 127 can be removed, for example, by ashing.

Figure 28:
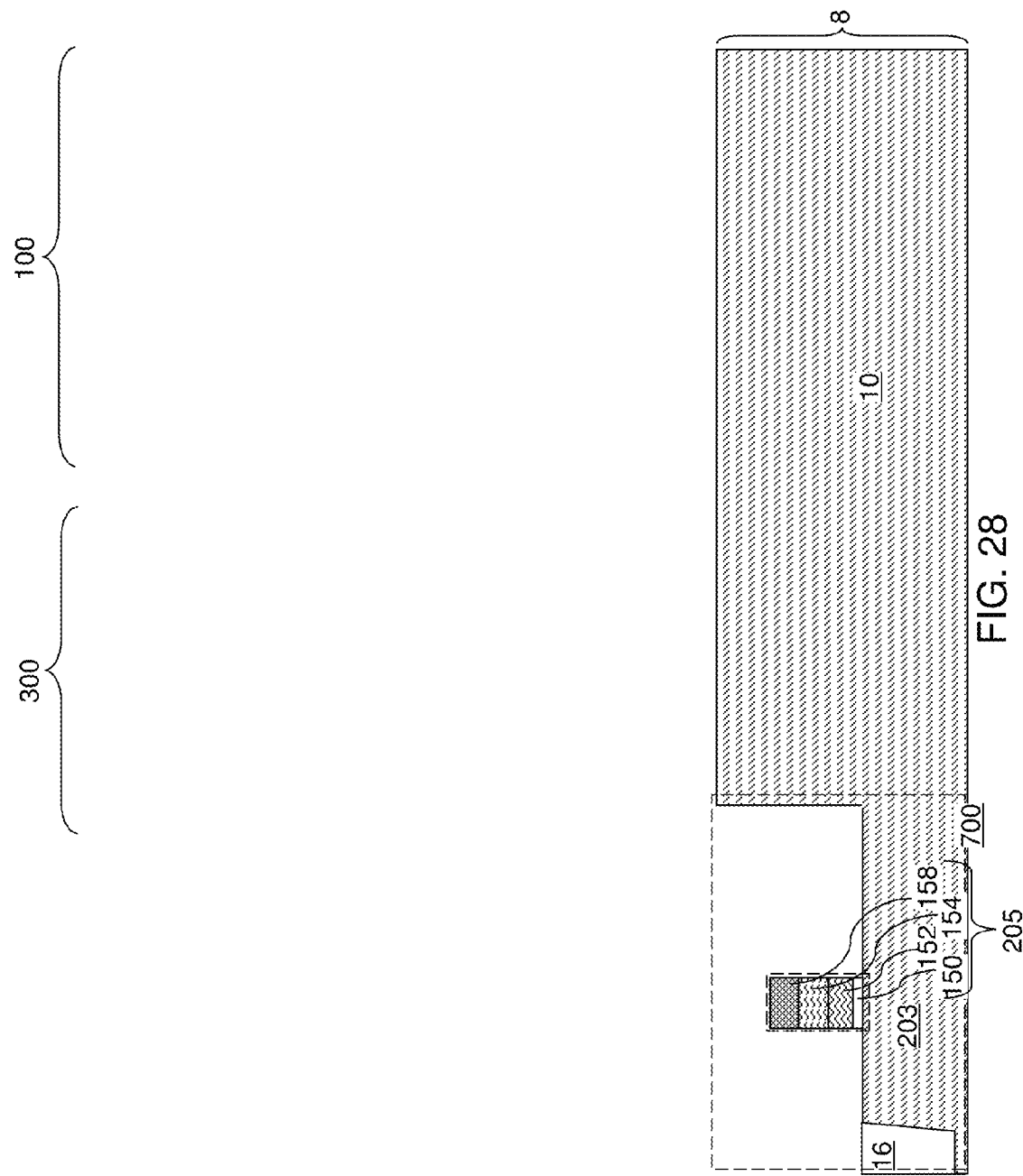

Referring to FIG. 28, various semiconductor devices can be formed on, or over, the substrate 8 in the peripheral device region 700. The semiconductor devices can be formed directly on the recessed horizontal surface of the substrate 8 in the peripheral device region 700. For example, at least one shallow trench isolation structure 16 and/or at least one deep trench isolation structure (not shown) extending downward from the recessed planar surface of the substrate semiconductor layer 10 can be formed in the peripheral device region 700. The at least one peripheral device formed in the peripheral device region 700 can include any device known in the art and needed to support the operation of the semiconductor devices in the memory array region 100. The at least one peripheral device can include a driver circuit (e.g., word line and/or bit line driver circuit) associated with the array of the memory devices in the memory array region 100. The at least one peripheral device can comprise transistor device in the driver circuit. In one embodiment, the at least one peripheral device can include one or more field effect transistors, such as transistors in a CMOS configuration. A gate stack 205 can be formed for each field effect transistor. Each gate stack 205 can be formed over a respective body region 203, which includes a channel of the respective field effect transistor. Each gate stack 205 can include any type of gate stack known in the art. For example, each gate stack 205 can include, from bottom to top, a gate dielectric 150, a gate electrode (152, 154), and an optional gate cap dielectric 158, such as a silicon nitride layer. Each gate electrode (152, 154) may include a single conductive material portion or a plurality of conductive material portions such as a conductive semiconductor gate electrode layer 152 (e.g., heavily doped polysilicon) and a metallic gate electrode layer 154 (e.g., titanium, tungsten or silicide thereof). Generally speaking, semiconductor devices can be formed directly on the recessed horizontal surface of the substrate in the peripheral device region 700. Each gate stack 205 may be formed by depositing layers (152, 154, 158) in the trench 128 and over layer 10 outside the trench, followed by forming a photoresist mask over the layers, and patterning the layers using the mask to form the gate stack 205.

Figure 29:
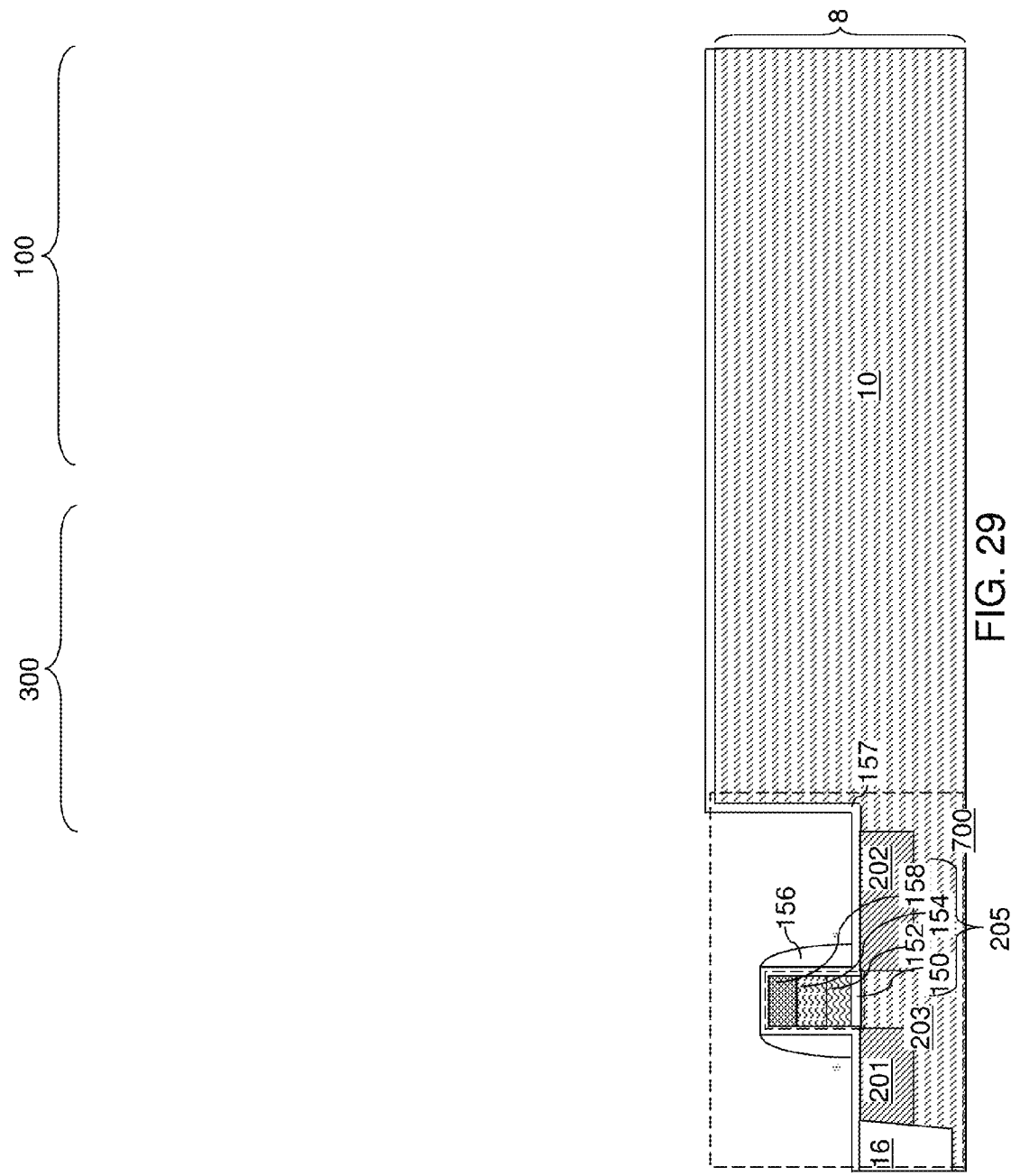

Referring to FIG. 29, a first silicon oxide liner 157 can be optionally deposited over each gate stack 205 and on physically exposed surfaces of the substrate semiconductor layer 10. A gate spacer 156, a source region 201 and a drain region 202 can be formed for each field effect transistor. The gate spacer 156 may be formed by depositing a spacer layer (e.g., silicon oxide) over the liner 157 and gate stack 205 followed by an anisotropic sidewall spacer etch to form the gate spacers 156. The source and drain regions (201, 202) are then implanted into the substrate 8 using the gate stack 205 and the gate spacers 156 as a mask.

Figure 30:
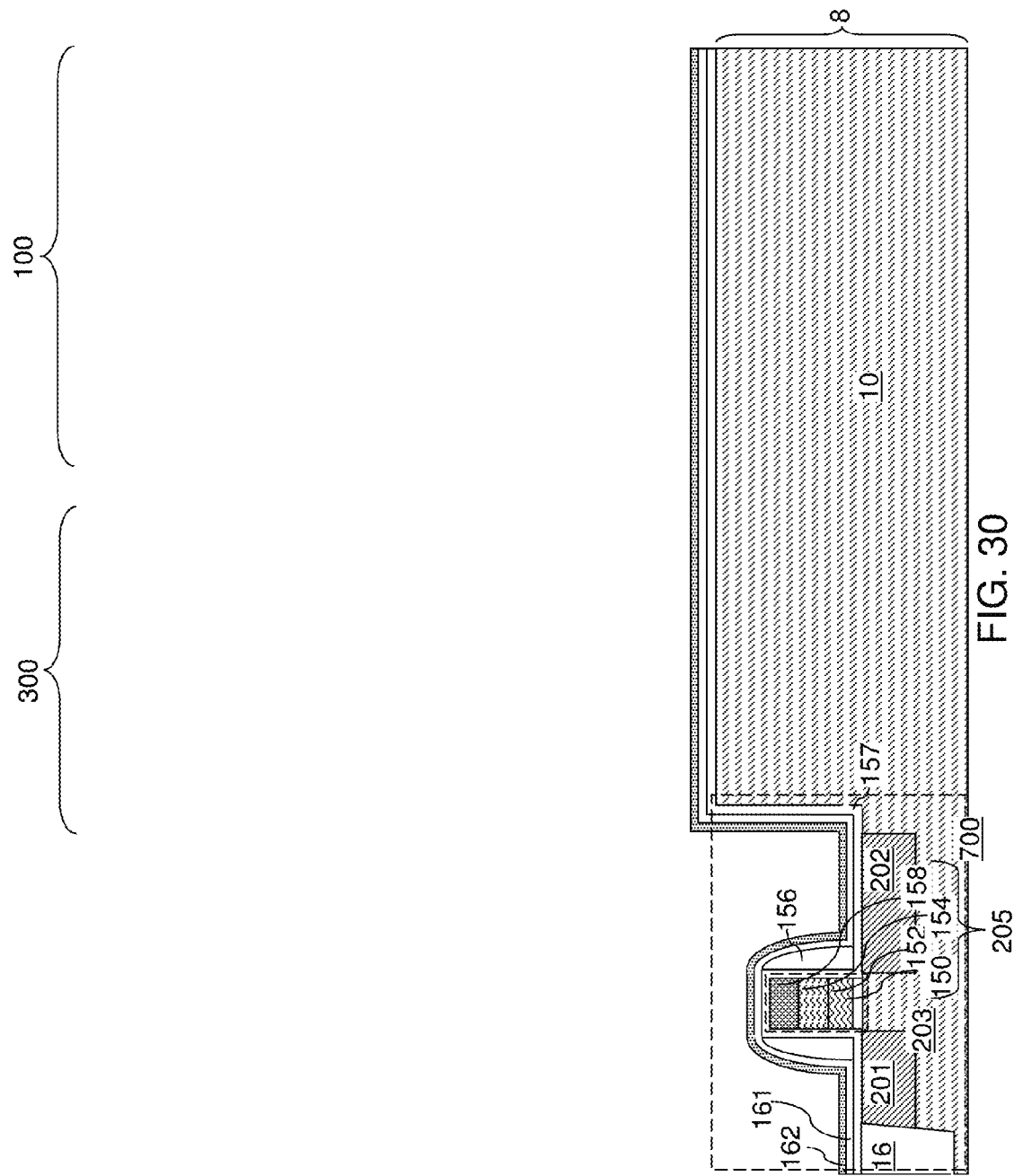

Referring to FIG. 30, a second silicon oxide liner 161 and/or a silicon nitride liner 162 can be optionally deposited over the gate spacers 156 and the first silicon oxide liner 157. While the present disclosure is described with a particular set of liners (157, 161, 162), any set of at least one dielectric liner or no liner may be employed to provide optimal performance to each of the field effect transistors.

Figure 31:
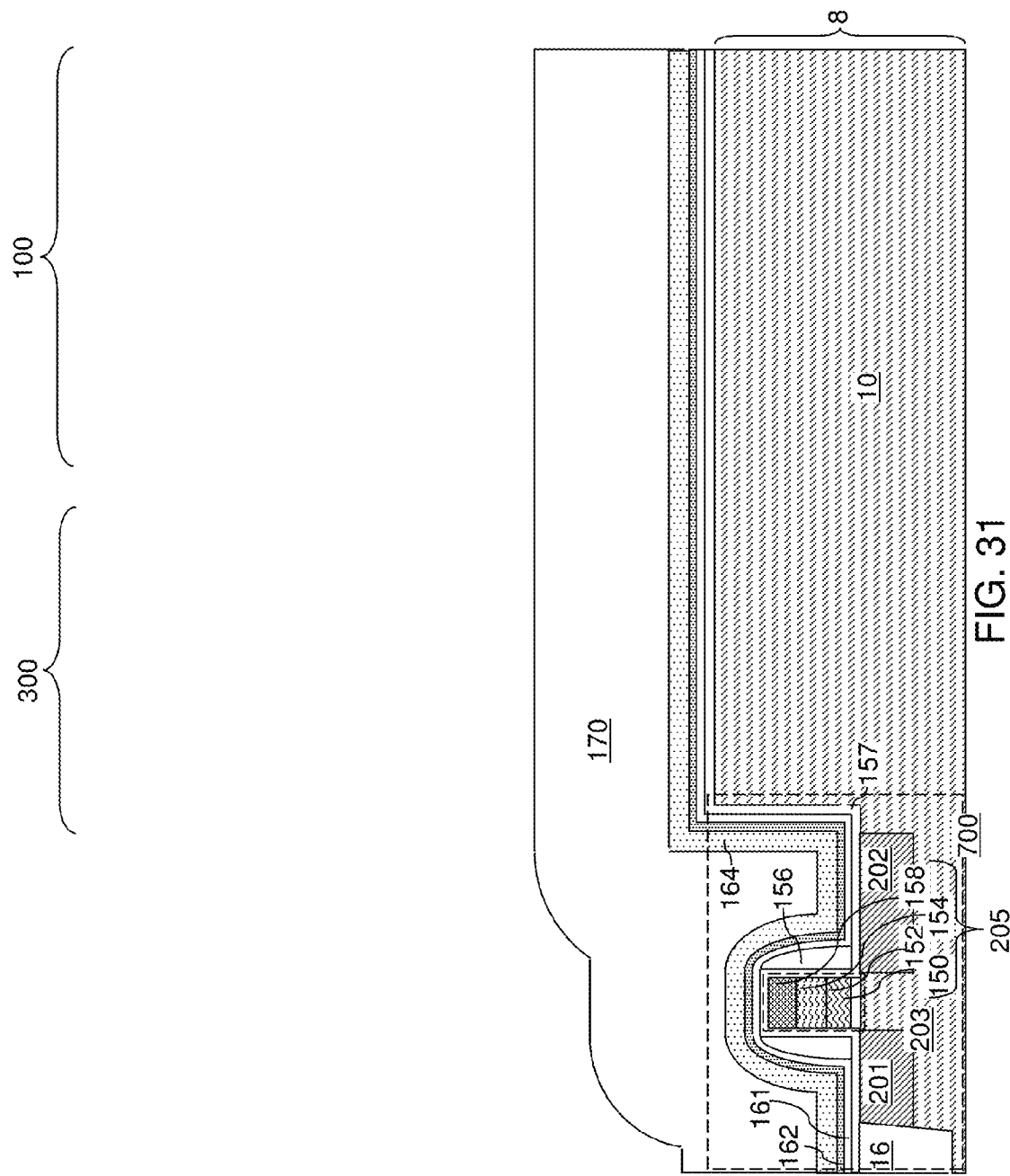

Referring to FIG. 31, an optional planarization stop dielectric layer 164 and a planarization dielectric layer 170 can be formed over the at least one dielectric liner (157, 161, 162). The optional planarization stop dielectric liner 164 includes a dielectric material (such as silicon nitride) that can be employed as a stopping layer during a subsequent planarization process. The thickness of the planarization stop dielectric liner 164 can be in a range from 10 nm to 100 nm, although lesser and greater thicknesses can also be employed. The planarization dielectric layer 170 is formed over the semiconductor devices in the peripheral device region 700, and includes a dielectric material that can be planarized, for example, by chemical mechanical planarization. For example, the planarization dielectric layer 170 can include undoped silicon oxide (e.g., silicon oxide deposited using a TEOS source) or a doped silicate glass, which may be borosilicate glass, phosphosilicate glass, borophosphosilicate glass, fluorosilicate glass, or a combination thereof. The thickness of the planarization dielectric layer 170 is selected such that the bottommost portion of the top surface of the planarization dielectric layer 170 is located above a horizontal plane including the topmost surface of the substrate semiconductor layer 10.

Figure 32:
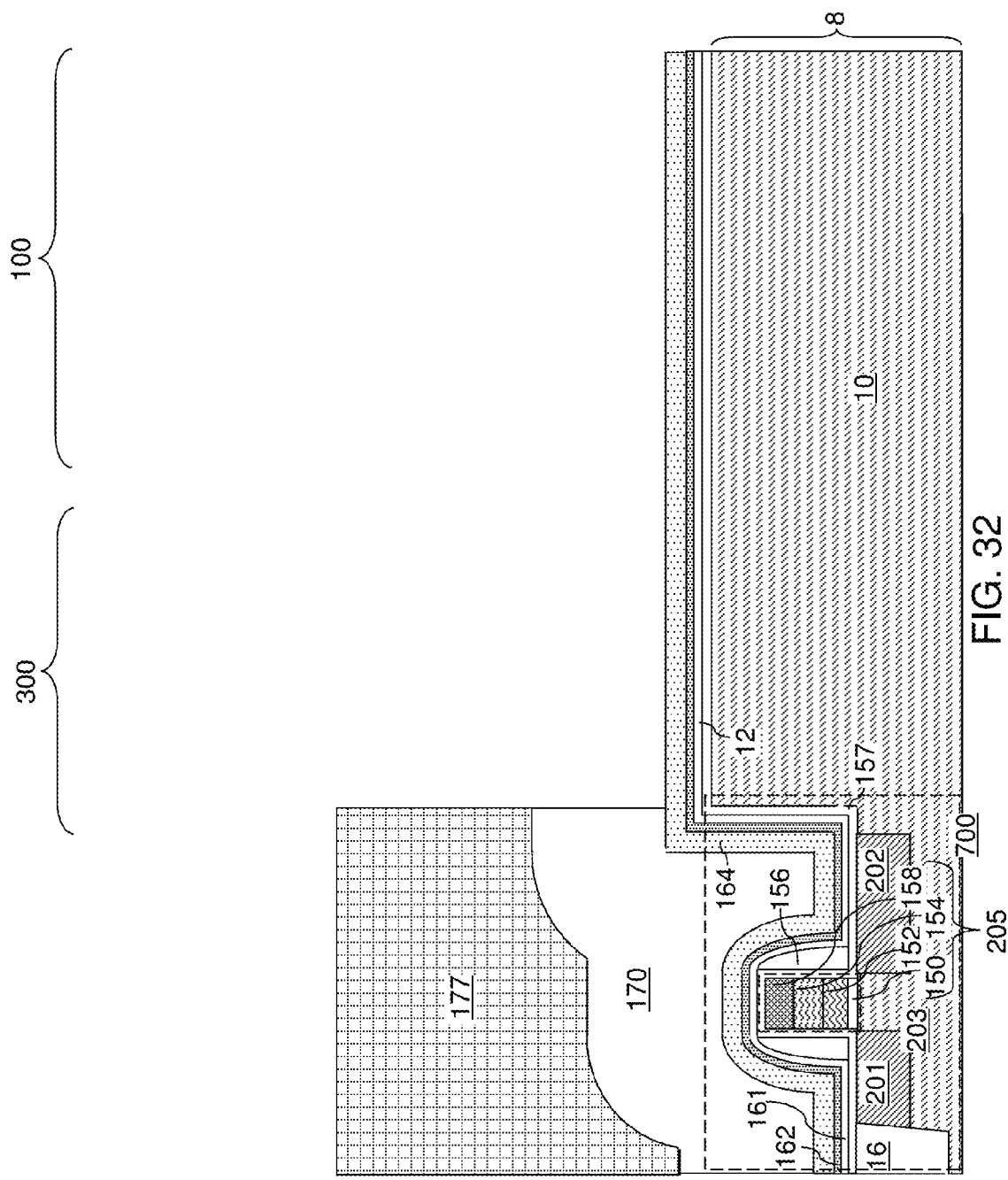

Referring to FIG. 32, an optional photoresist layer 177 can be formed over the planarization dielectric layer 170, and can be patterned to cover the portion of the planarization dielectric layer 170 overlying the semiconductor devices in the peripheral device region 700, while not covering the portion of the planarization dielectric layer 170 in the memory array region 100 and the contact region 300. An optional etch process, such as an isotropic etch process or an anisotropic etch process, can be performed to remove all or part of the portion of the planarization dielectric layer 170 in the memory array region 100 and the contact region 300. In one embodiment, any of the layers (164, 162, 161, 157) can be employed as a stopping layer during removal of the portion of the planarization dielectric layer 170 from the memory array region 100 and the contact region 300. The photoresist layer 177 can be subsequently removed, for example, by ashing.

Figure 33:
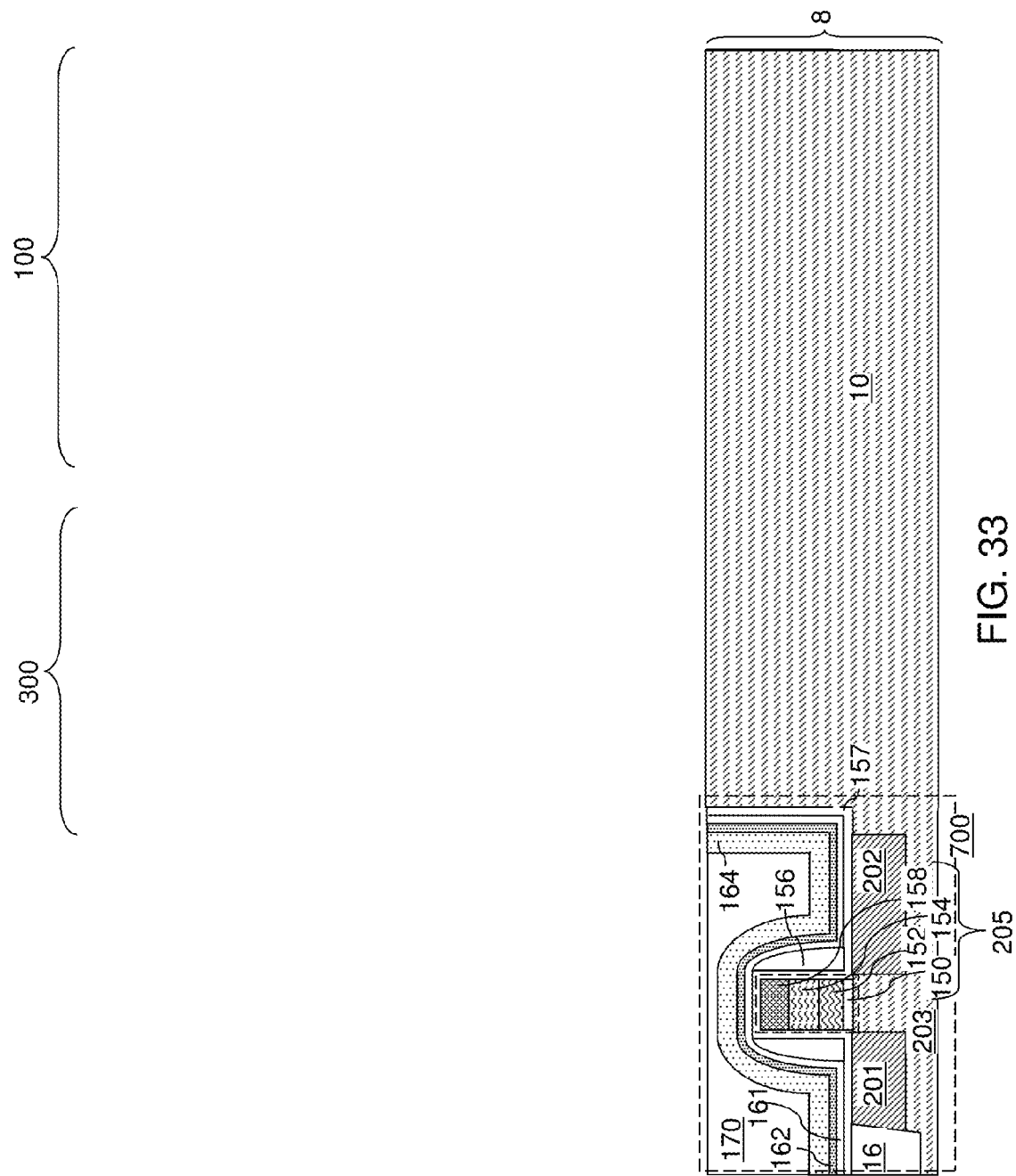

Referring to FIG. 33, a planarization process (e.g., CMP) can be performed to remove portions of the planarization dielectric layer 170 from above the planarization stop dielectric layer 164 in regions 100 and 300 (if any remains after the optional etching step of FIG. 32) and to reduce the height of the planarization dielectric layer 170 in the peripheral region 700 such that the top of layer 170 is even with the exposed top of surface of the planarization stop dielectric layer 164 in regions 100 and 300. After the CMP step, the exposed planarization stop dielectric layer 164 and the at least one dielectric liner (157, 161, 162) are removed from above a horizontal plane including the topmost surface of the substrate 8, e.g., from the topmost surface of the substrate semiconductor layer 10 in regions 100 and 300. The planarization stop dielectric layer 164 and the at least one dielectric liner (157, 161, 162) are removed from the memory array region 100 and the contact region 300 by selective etching. The top edge surfaces of the vertical parts of the planarization stop dielectric layer 164 and the at least one dielectric liner (157, 161, 162) located on the sidewall of the trench 128 can be within the same horizontal plane as the top surface of the substrate semiconductor layer 10 in regions 100 and 300. After the steps shown in FIG. 10, the top of the substrate semiconductor layer 10 in regions 100 and 300 is planar with the top of the planarization dielectric layer 170 located in the trench 128 in the peripheral region 700.

Figure 34:
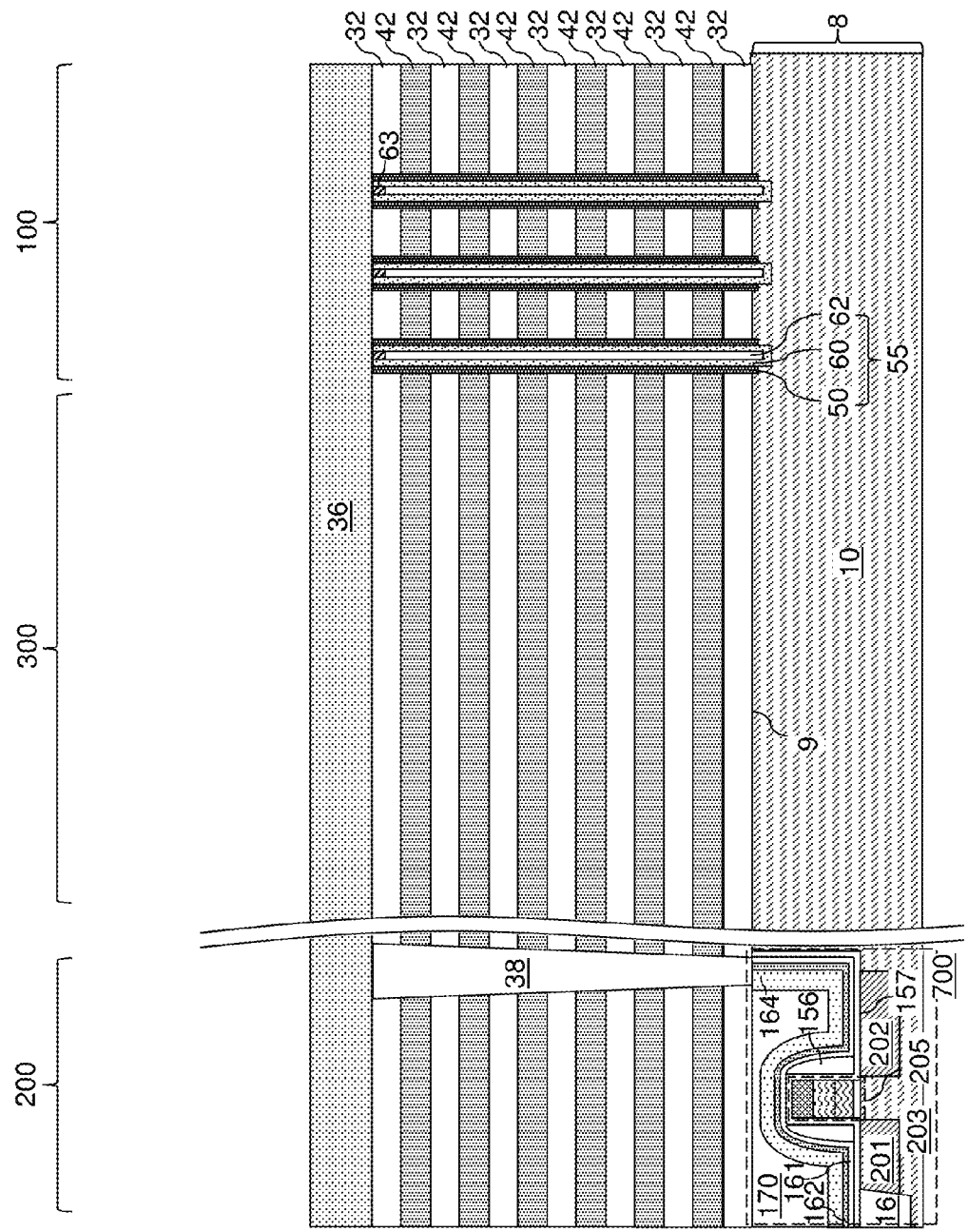

Referring to FIG. 34, a stack of alternating layers of a first material and a second material different from the first material is formed over a top surface of the substrate 8. The top surface of the substrate 8 can include the top surface of a source electrode (if present) and/or a surface of a body region of a field effect transistor (e.g., horizontal channel portion of the NAND memory device). In one embodiment, the stack can include an alternating plurality of insulator layers 32 and sacrificial material layers 42. The processing steps of FIG. 1 can be employed to form an alternating stack (32, 34) including insulator layers 32 composed of the first material and sacrificial material layers 42 composed of a second material different from that of insulator layers 32.

A lithographic material stack (not shown) including at least a photoresist layer can be formed over the alternating stack (32, 42), and can be lithographically patterned to form openings therein. The pattern in the lithographic material stack can be transferred through the entirety of the alternating stack (32, 42) by at least one anisotropic etch that employs the patterned lithographic material stack as an etch mask. Portions of the alternating stack (32, 42) underlying the openings in the patterned lithographic material stack are etched to form memory openings as in the first embodiment. The sidewalls of the memory openings can be substantially vertical, or can be tapered. The patterned lithographic material stack can be subsequently removed, for example, by ashing.

A memory stack structure 55 can be formed within each memory opening through the alternating stack (32, 42) as in the first embodiment. The memory stack structures 55 can be formed, for example, by depositing a memory film layer in the memory openings and over the alternating stack (32, 42), and by anisotropically etching the memory film layer. The memory film layer can be a stack of continuous material layers that overlie the entirety of the alternating stack (31, 42,). The memory film layer contacts all sidewall surface(s) and all bottom surface(s) of the memory openings. The memory film layer is a continuous film stack that provides the functionality of charge storage in the absence of an external electrical bias voltage, while enabling charge transfer in the presence of a suitable external electrical bias voltage. In one embodiment, the memory film layer can be a stack, in the order of formation, of a blocking dielectric layer, a charge storage layer, and a tunnel dielectric layer as in the first embodiment.

A semiconductor channel 60 can be formed on inner sidewalls of each memory film 50 by deposition of a semiconductor material layer and a subsequent anisotropic etch of the semiconductor material layer as in the first embodiment. Optionally, a dielectric core 62 can be formed within a cavity inside each semiconductor channel 60, for example, by deposition of a dielectric material such as silicon oxide, and subsequent planarization of the dielectric material. A set of a memory film 50, a semiconductor channel 60, and a dielectric core 62 within a same memory opening constitutes a memory stack structure 55.

Drain regions 63 can be formed by recessing a top portion of each dielectric core and depositing a doped semiconductor material. The doped semiconductor material can be, for example, doped polysilicon. Excess portions of the deposited semiconductor material can be removed from above the top surface of the alternating stack (32, 42), for example, by chemical mechanical planarization (CMP) or a recess etch. After formation of the alternating stack (32, 42) the peripheral region (200, 700) includes the portion 700 in the trench 128 and the portion 200 above the trench 128.

Optionally, at least one support pillar 38 may be formed through the alternating stack (32, 42). As an optional structure, the at least one support pillar 38 may, or may not, be present within the third exemplary structure. In one embodiment, the at least one support pillar 38 can be formed in region 300 in which replacement of the portions of the sacrificial material layers 42 therein with electrically conductive electrodes will be performed. The support pillar 38 may comprise an insulating pillar or a dummy memory stack structure. A dummy memory stack structure is formed at the same time as the memory stack structure 55 and contains the same layers as structure 55. However, the dummy memory stack structure is not electrically connected to a bit line.

A mask layer 36 can be formed over the alternating stack (32, 42), the memory stack structures 55, and the drain regions 63 as in the first embodiment. The mask layer 36 functions as a mask during a subsequent etch process, and as such, can be a hard mask layer.

Figure 35:
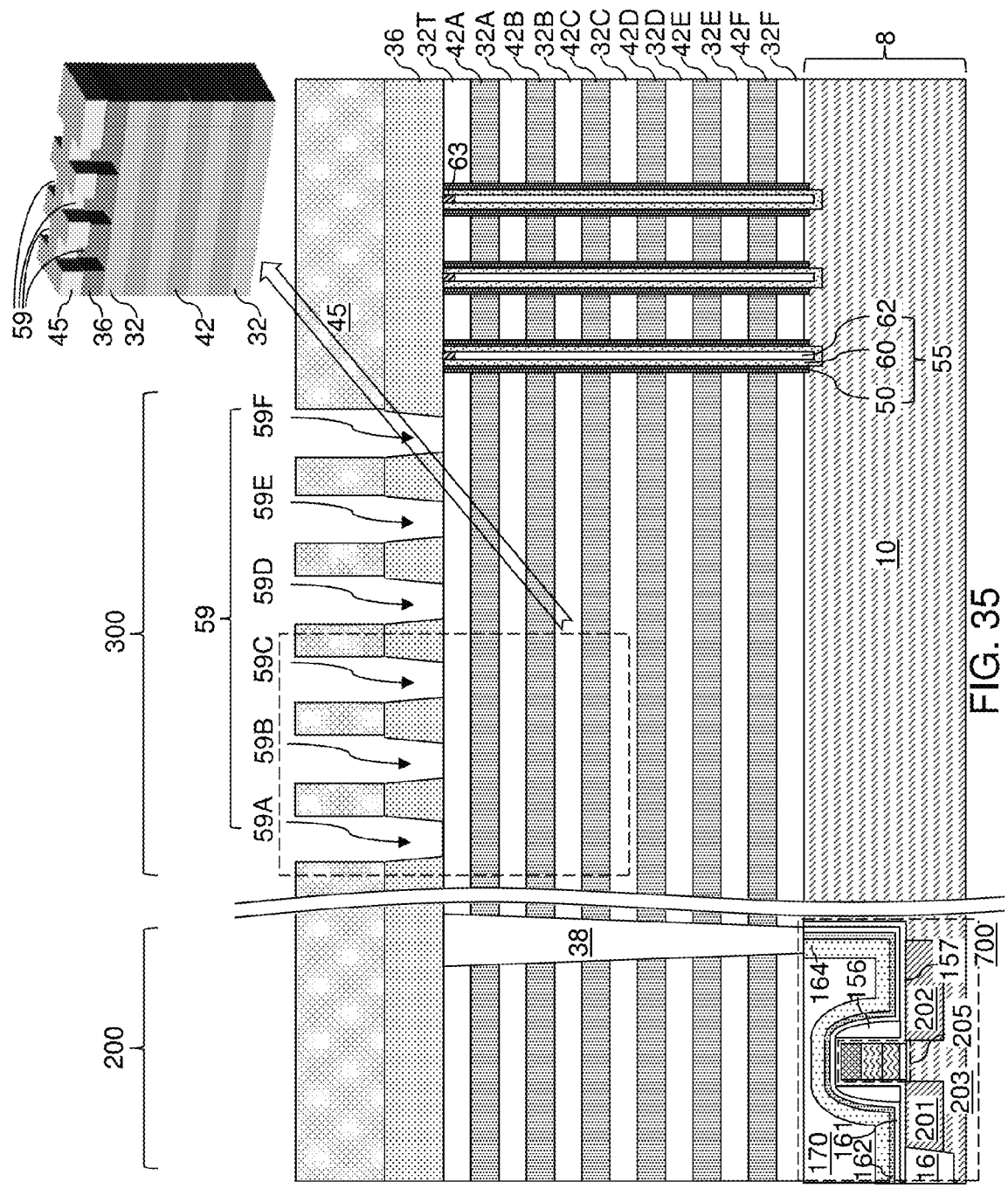

Referring to FIG. 35, a photoresist layer 45 (and optionally additional lithographic material layers such as an organic planarization layer and/or an antireflective coating layer) can be formed over the top surface of the mask layer 36. The photoresist layer 45 can be lithographically patterned to form a plurality of openings therein as in the first embodiment.

The pattern in the openings of the photoresist layer 45 can be transferred into the mask layer 36 by an etch, which can be an anisotropic etch that employs the photoresist layer 45 as an etch mask. The plurality of openings can form a two dimensional array of openings that extend along two different horizontal directions. The processing steps of FIG. 35 can be the same as the processing steps of FIG. 2 according to the first embodiment.

Thus, the alternating stack (32, 42) includes, from top to bottom, a topmost insulator layer 32T, a first-from-top sacrificial material layer 42A, a first-from-top insulator layer 32A, a second-from-top sacrificial material layer 42B, a second-from-top insulator layer 32B, an alternating stack including at least one intermediate sacrificial material layer 42C and at least one intermediate insulator layer 32C, an (N−2)-th-from-top sacrificial material layer 42D, an (N−2)-th-from-top insulator layer 32D, an (N−1)-th-from-top sacrificial material layer 42E, an (N−2)-th-from-top insulator layer 32E, an N-th-from-top sacrificial material layer 42F, and an N-th-from-top insulator layer 32F. It is understood that an insulator layer 32 can refer to any of, or each of, the various insulator layers (32A, 32B, 32C, 32D, 32E, 32F), and a sacrificial material layer 42 can refer to any of, or each of, the various sacrificial material layers (42A, 42B, 42C, 42D, 42E, 42F). Further, insulator layers 32 can refer to any plurality of, or all of, the various insulator layers (32A, 32B, 32C, 32D, 32E, 32F), and sacrificial material layers 42 can refer to any plurality of, or all of, the various sacrificial material layers (42A, 42B, 42C, 42D, 42E, 42F).

The plurality of openings 59 in the mask layer 36 can include at least one first opening 59A that is formed in each area in which it is desired to form a contact opening that extends to the N-th-from-top sacrificial material layer 42F upon full formation, i.e., at the end of processing steps that completes formation of the contact opening. The N-th-from-top sacrificial material layer 42F is the sacrificial material layer 42 that is most proximal to the substrate 8 and most distal from the top surface of the alternating stack (32, 42). The plurality of openings 59 in the mask layer 36 can further include at least one second opening 59B that is formed in each area in which it is desired to form a contact opening that extends to the (N−1)-th-from-top sacrificial material layer 42E upon full formation. The plurality of openings 59 in the mask layer 36 can further include at least one third opening 59C that is formed in each area in which it is desired to form a contact opening that extends to the (N−2)-th-from-top sacrificial material layer 42D upon full formation. The plurality of openings 59 in the mask layer 36 can further include at least one intermediate-level opening 59D that formed in each area in which it is desired to form a contact opening that extends to a sacrificial material layer 42 located between the (N−2)-th-from-top sacrificial material layer 42D and the second-from-top sacrificial material layer 42B upon full formation. The plurality of openings 59 in the mask layer 36 can further include at least one (N−1)-th opening 59E that formed in each area in which it is desired to form a contact opening that extends to the second-from-top sacrificial material layer 42B upon full formation. The plurality of openings 59 in the mask layer 36 can further include at least N-th opening 59F that formed in each area in which it is desired to form a contact opening that extends to the first-from-top sacrificial material layer 42A upon full formation.

In one embodiment, the plurality of openings 59 can be arranged as a linear array such that each opening in the mask layer 36 that corresponds to a contact opening to extend to a deeper depth upon full formation is located to a predetermined side of the linear array with respect to any opening in the mask layer that corresponds to a contact opening to extend to a shallower depth upon full formation. In one embodiment, the plurality of openings 59 can be periodic along one direction such that the pitch between each neighboring pair of openings 59 is the same. In one embodiment, the pitch between each neighboring pair of openings 59 is can increase along one direction with the increase in the target depth of the corresponding contact openings in order to prevent electrical shorts due to lateral broadening of contact openings with depth.

Figure 36:
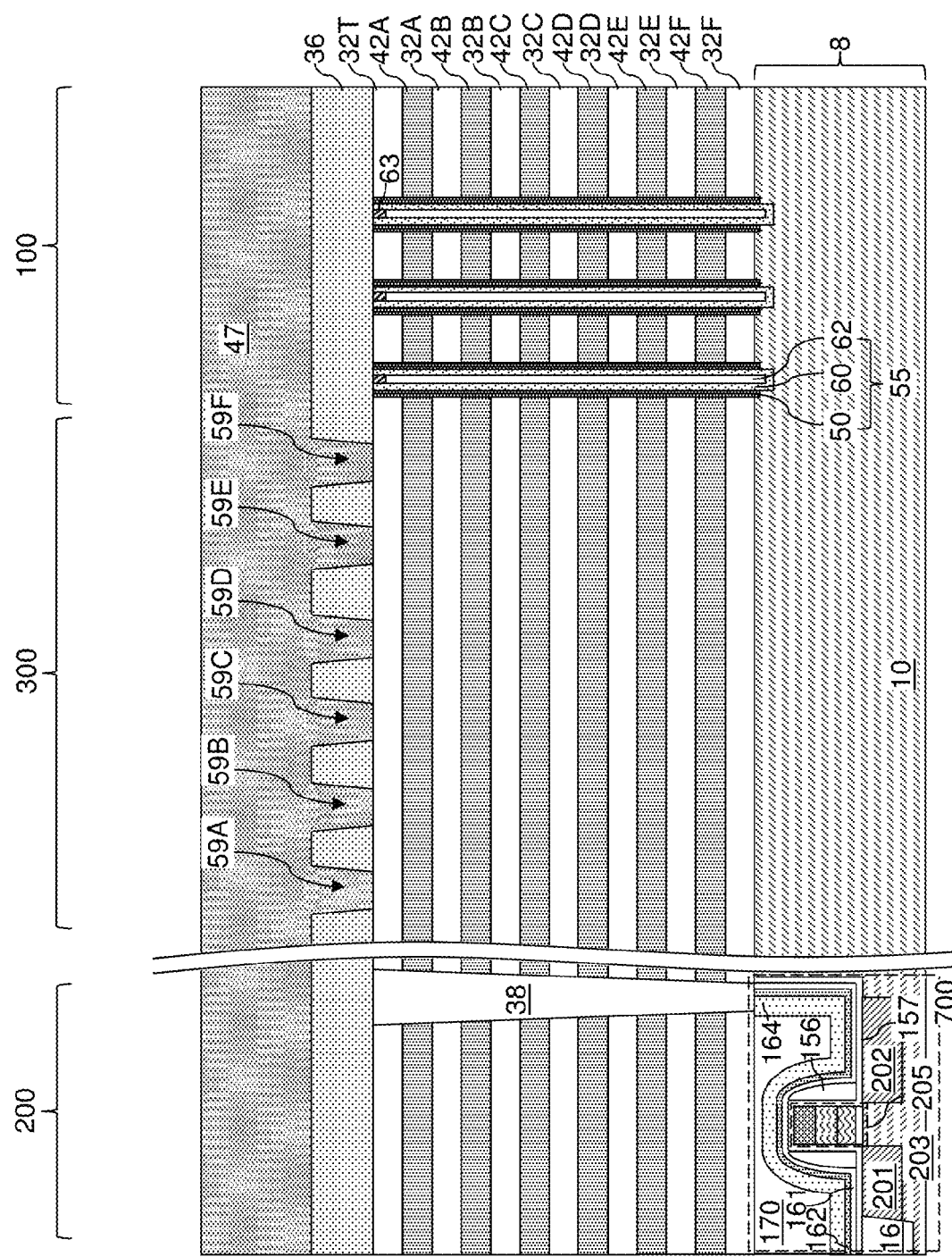

Referring to FIG. 36, a slimming layer 47 can be formed by performing the processing steps of FIG. 3.

Figure 37:
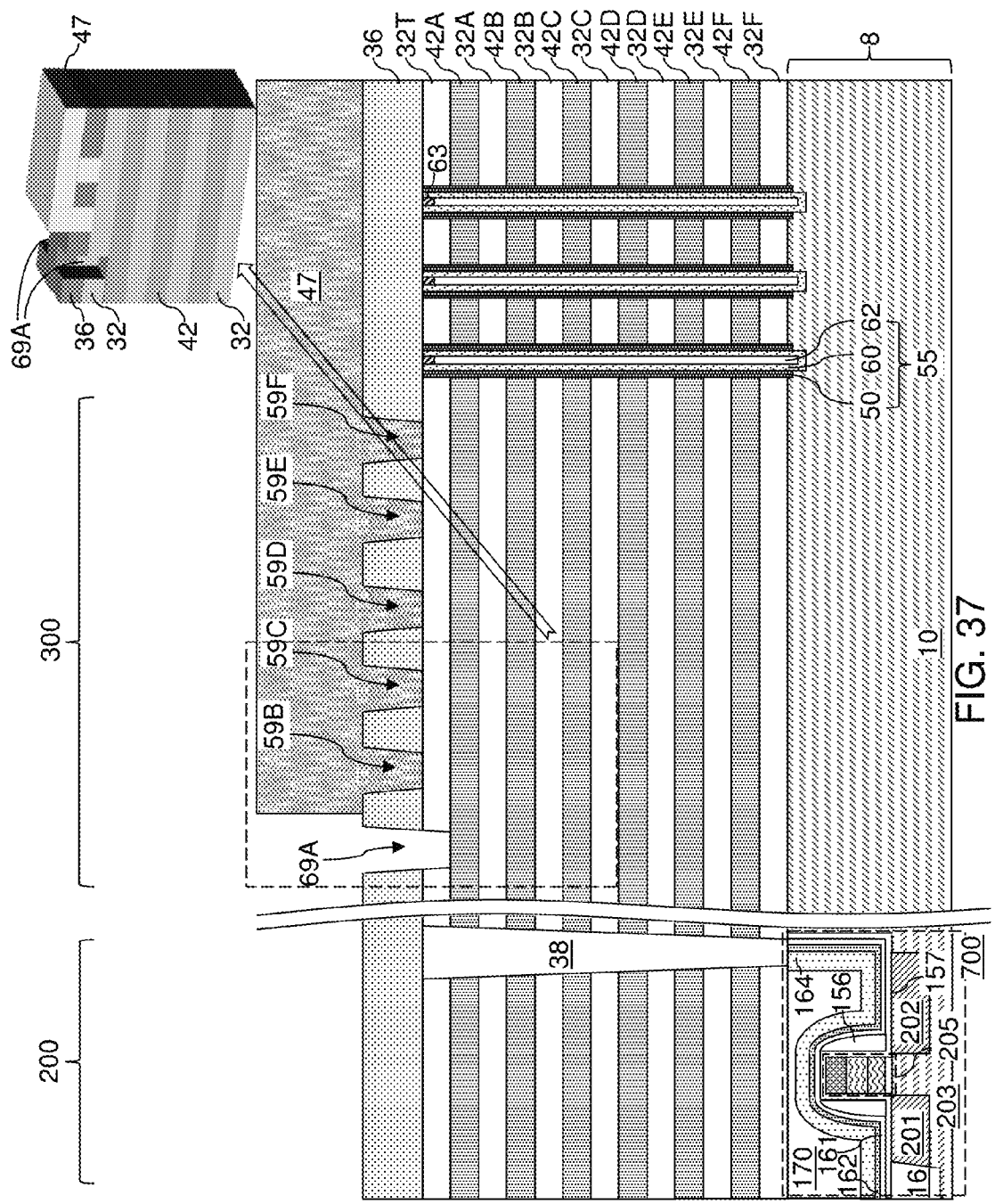

Referring to FIG. 37, the slimming layer 47 can be patterned to physically expose the at least one first opening 59A (See FIG. 3), while all other openings (59B, 59C, 59D, 59E, 59F) are covered by a remaining portion of the slimming layer 47 as in the processing steps of FIG. 4. The first contact opening 69A is then etched through the first opening 59A as described above with respect to FIG. 4.

Figure 38:
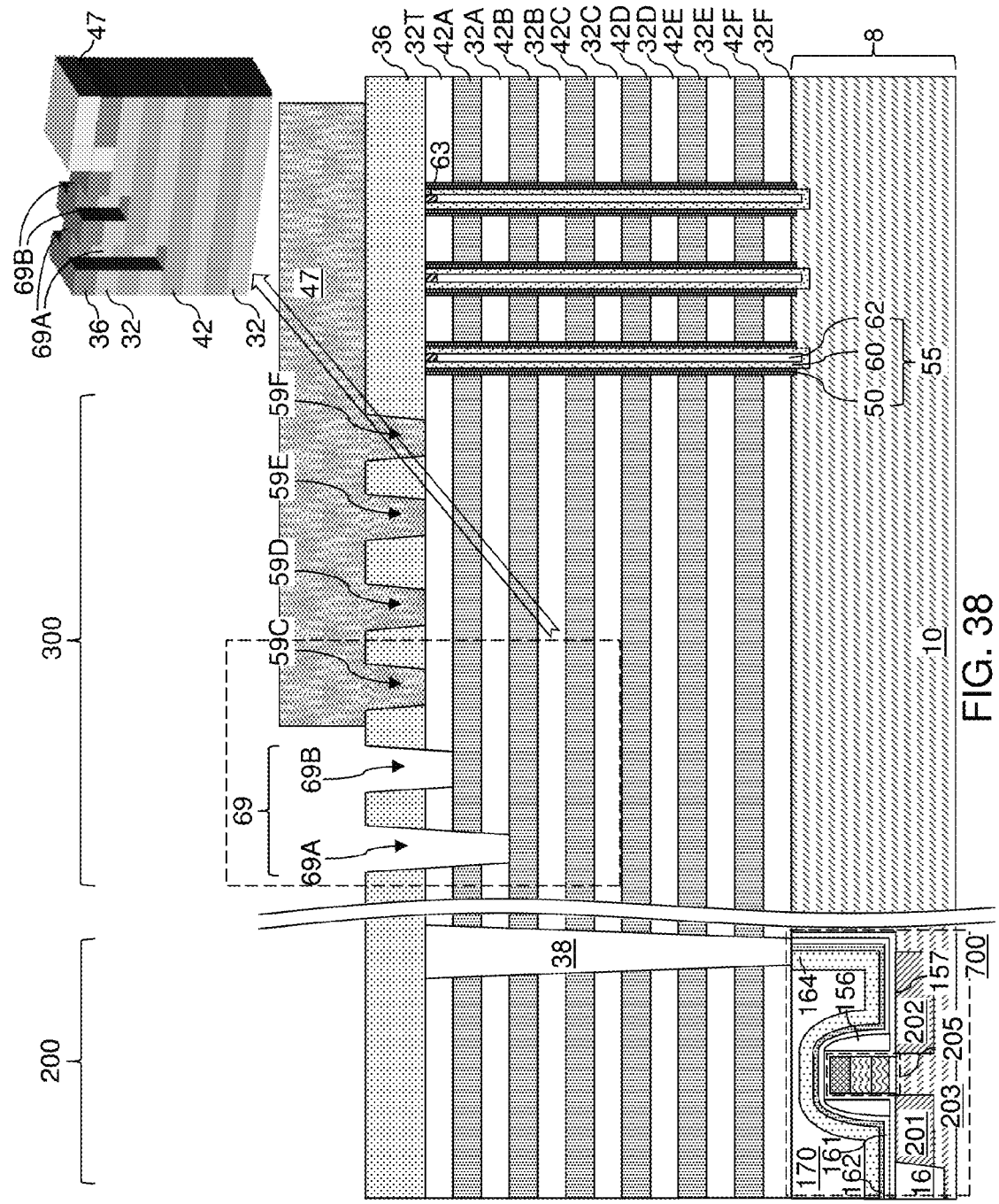

Referring to FIG. 38, a trimming process is performed to trim the slimming layer 47 employing the processing steps of FIG. 5. An anisotropic etch process is performed to vertically extend the at least one first contact opening 69A downward through a pair of a sacrificial material layer 42 and an insulator layer 32. If the bottom surface of each first contact opening 69A is located at the top surface of the first-from-top sacrificial material layer 42A at the end of the processing steps of FIG. 37, the bottom surface of each first contact opening 69A is recessed through the first-from-top sacrificial material layer 42A during a first step of the anisotropic etch, and then further recessed through the first-from-top insulator layer 32A during a second step of the anisotropic etch. During the second step, a second contact opening 69B can be formed through the physically exposed openings in the mask layer 36 and the topmost insulator layer 32 concurrently with the recessing of the first contact opening(s) 69A through the first-from-top insulator layer 32A. Each second contact opening 69B can be formed within an area of a second opening 59B within the mask layer 36.

Figure 39:
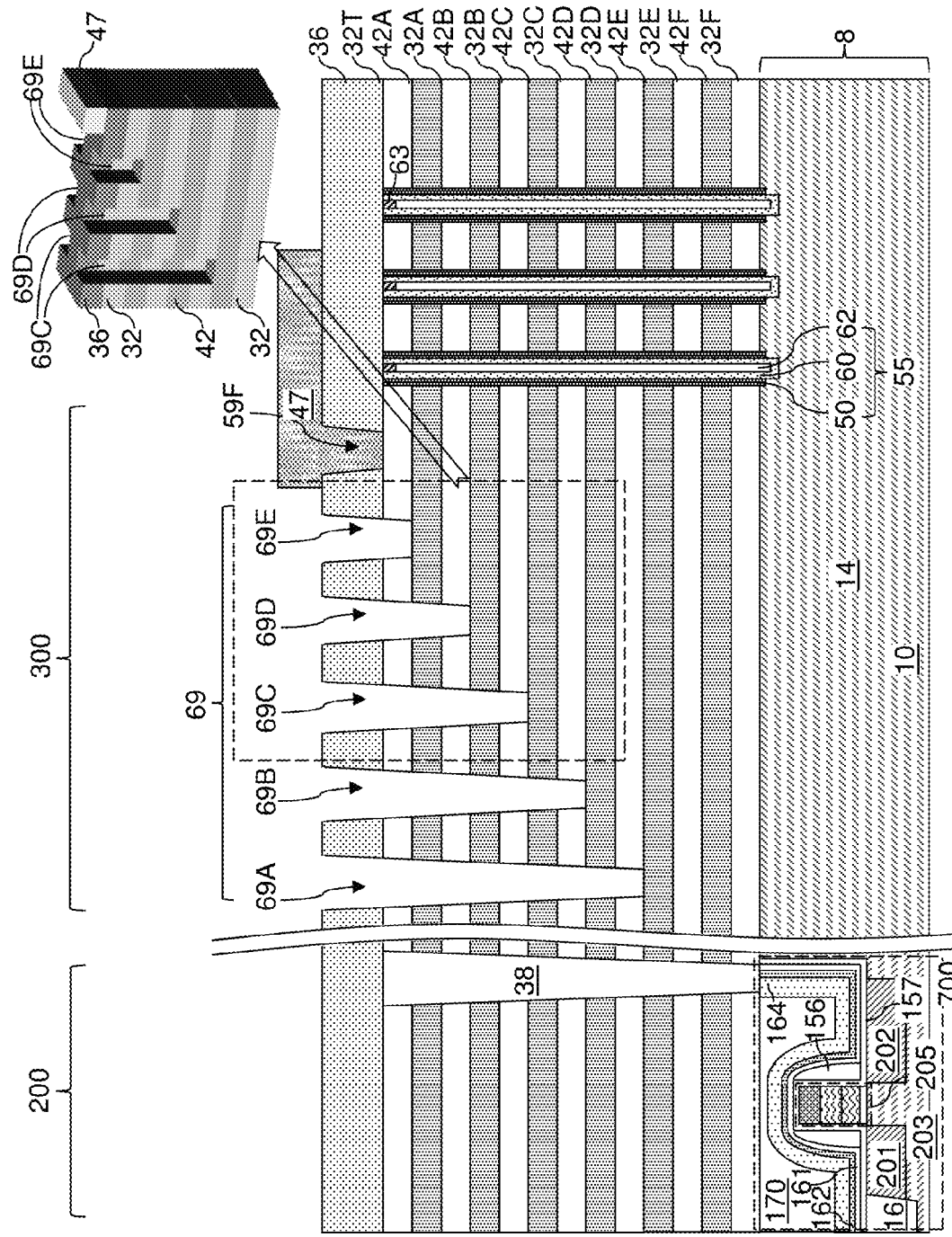

Referring to FIG. 39, etch processes and trimming processes can be iteratively and alternately performed to form additional contact openings (69C, 69D, 69E) and to vertically extend the depths of pre-existing contact openings (69A, 69B) in the same manner as in the first embodiment. The plurality of contact openings 69 can be formed by simultaneously etching a portion of a first insulator layer 32 (e.g., an (i+1)-th-from-top insulator layer 32 in which i is less than N) in the alternating stack (32, 42) within an area of a first contact opening 69A and a portion of a second insulator layer 32 (e.g., an i-th-from-top insulator layer 32) in the alternating stack (32, 42) within an area of a second contact opening 69B. Further, the plurality of contact openings 69 can be formed by simultaneously etching a portion of a first sacrificial material layer 42 (e.g., an (i+1)-th-from-top sacrificial material layer 42 in which i is less than N) in the alternating stack (32, 42) within an area of a first contact opening 69A and a portion of a second sacrificial material layer 42 (e.g., an i-th-from-top sacrificial material layer 42) in the alternating stack (32, 42) within an area of a second contact opening 69B.

A plurality of contact openings 69 is formed within the alternating stack (32, 42). Each of the plurality of contact openings 69 extends at least from the topmost surface of the alternating stack (32, 42), and specifically from the top surface of the mask layer 36, to a surface of a respective material layer. The respective material layers can include sacrificial material layers 42 located at different levels within the alternating stack (32, 42) in case each etch process terminates with a step that etches the second material of the sacrificial material layers 42. Alternatively, the respective material layers can include insulator layers 32 located at different levels within the alternating stack (32, 42) in case each etch process terminates with a step that etches the first material of the insulator layers 32.

Figure 40:
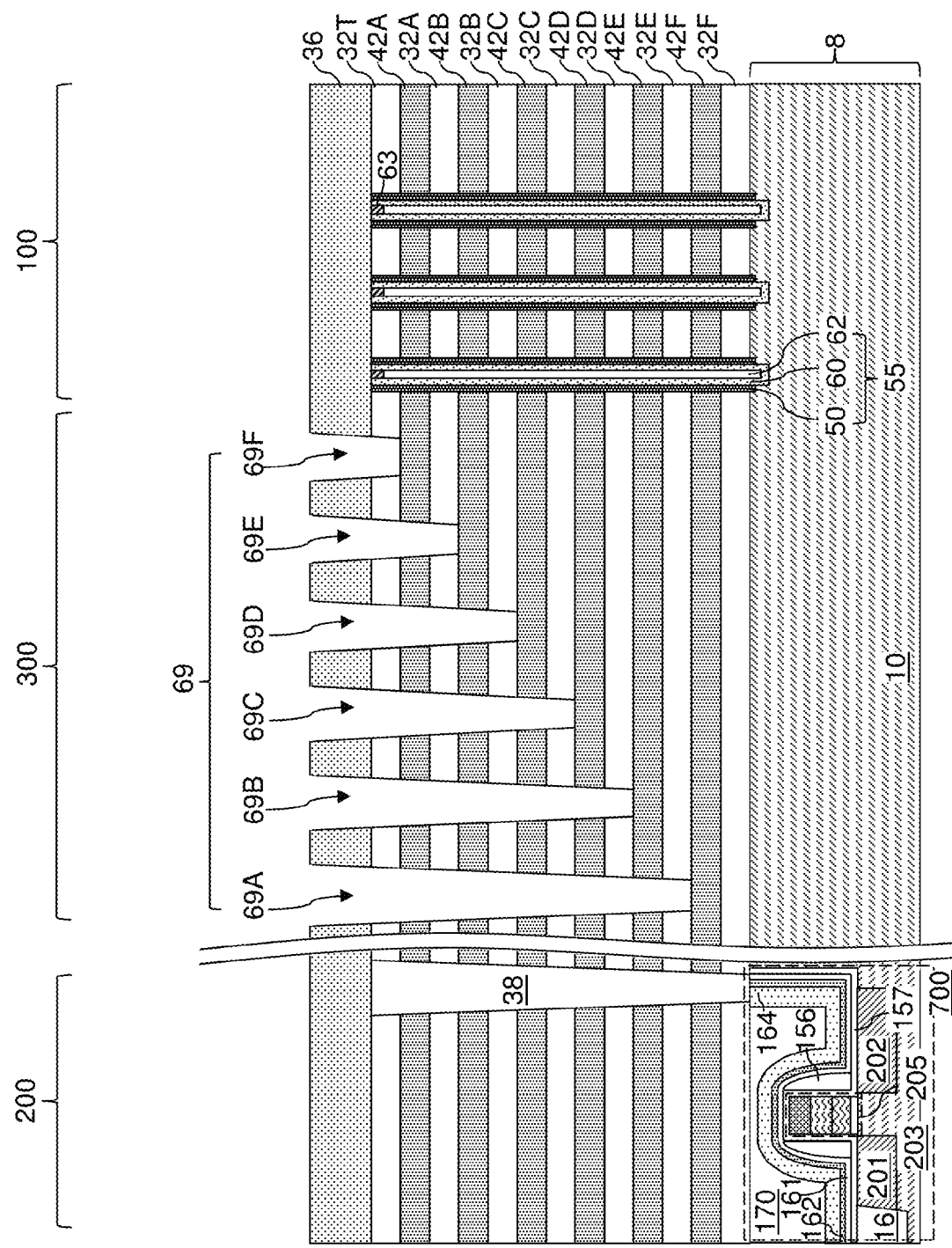

Referring to FIG. 40, the cycles of alternating processes that include a trimming process and an etch process continues until the entire set of openings 59 (See FIG. 35) in the mask layer 36 are physically exposed after the trimming process of the last cycle, and the at least one N-th contact opening 69F is formed through the topmost insulator layer 32. The entirety of the remaining portion of the slimming layer 47 can be removed during the last trimming process. In one embodiment, all of the openings 59 in the mask layer 36 can be physically exposed. Upon termination of the processing steps of FIG. 40, any remaining portion of the slimming material layer 47, if present, is removed. Each of the contact openings 69 extends through the alternating stack (32, 42) to a respective one of the sacrificial material layers 42. The processing steps of FIG. 7 can be employed to form the contact openings 69.

Figure 41:
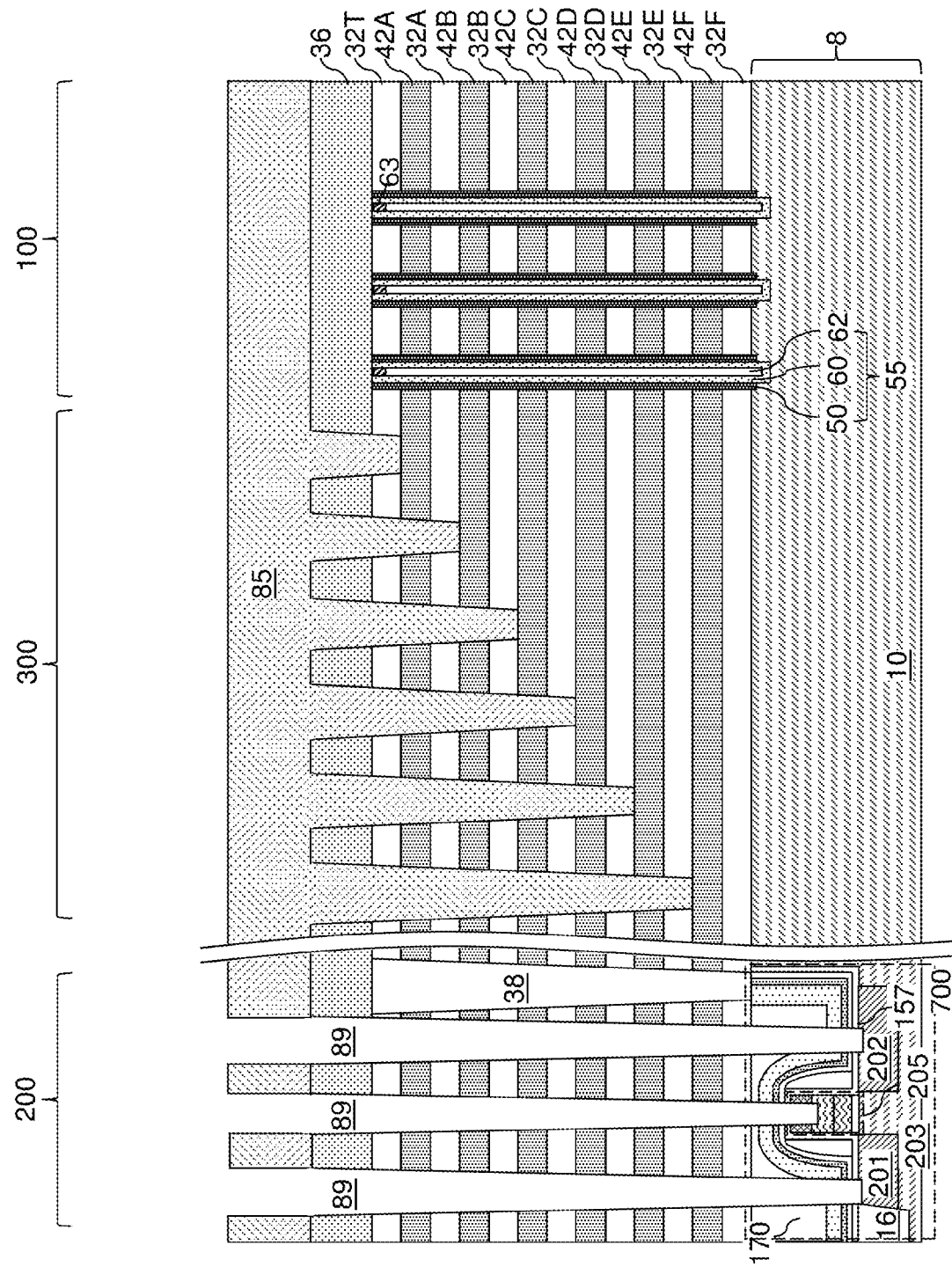
Figure 47:
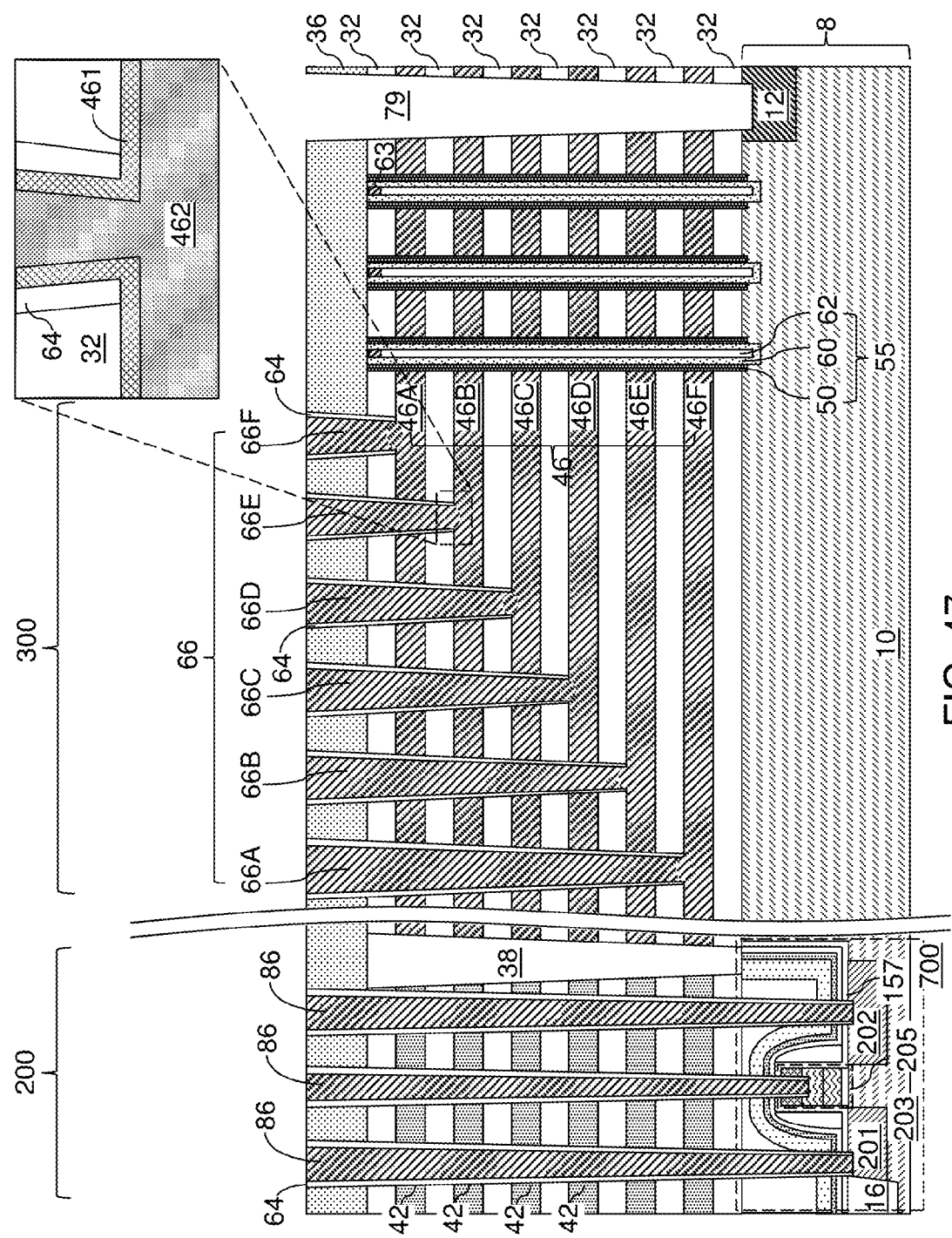

Referring to FIG. 41, a photoresist layer 85 can be applied over the mask layer 36 and lithographically patterned to form openings in areas in which formation of peripheral device electrically conductive via contacts 86 (See FIG. 47)

is desired. The photoresist layer 85 can be a conformal photoresist layer that fills, partially or completely, all openings under the topmost surface of the mask layer 36. The pattern in the photoresist layer 85 can be transferred through the mask layer 36 and the alternating stack (32, 42) and optionally through the planarization dielectric layer 170 employing an anisotropic etch to form via trenches that extend to various conductive components that constitute electrical nodes of the at least one peripheral device 20. Each via trench that extends to the various components of the at least one peripheral device 20 is a contact opening, and is herein referred to as a peripheral contact opening 89. The photoresist layer 85 can be subsequently removed, for example, by ashing. Each peripheral contact opening 89 is a device contact opening that extends through the alternating stack (32, 42) including the insulating layers 32 and the sacrificial material layers 42.

Figure 42:
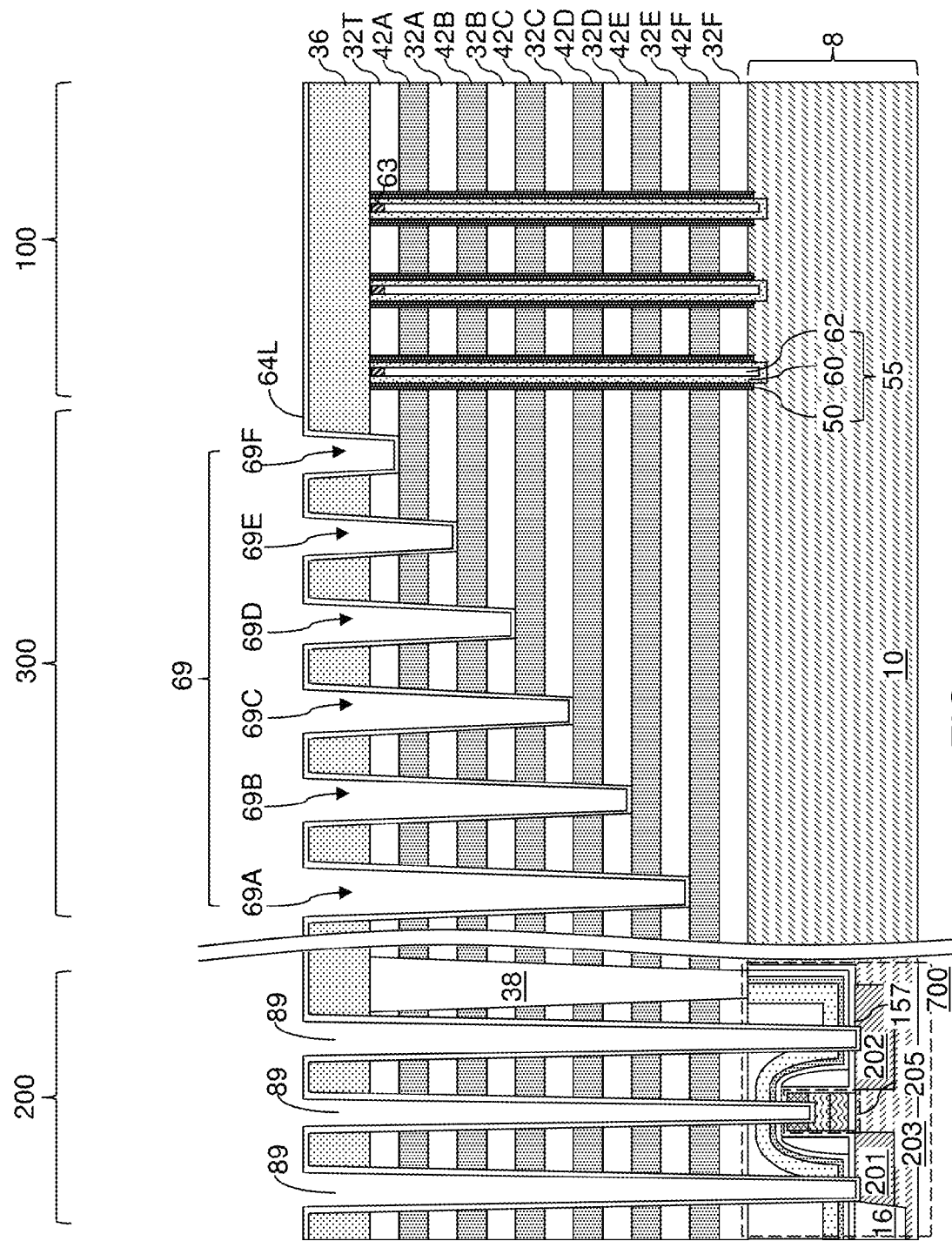

Referring to FIG. 42, a continuous insulating material layer 64L can be formed on physically exposed surfaces on an upper side of the third exemplary structure as in the first embodiment.

Figure 43:
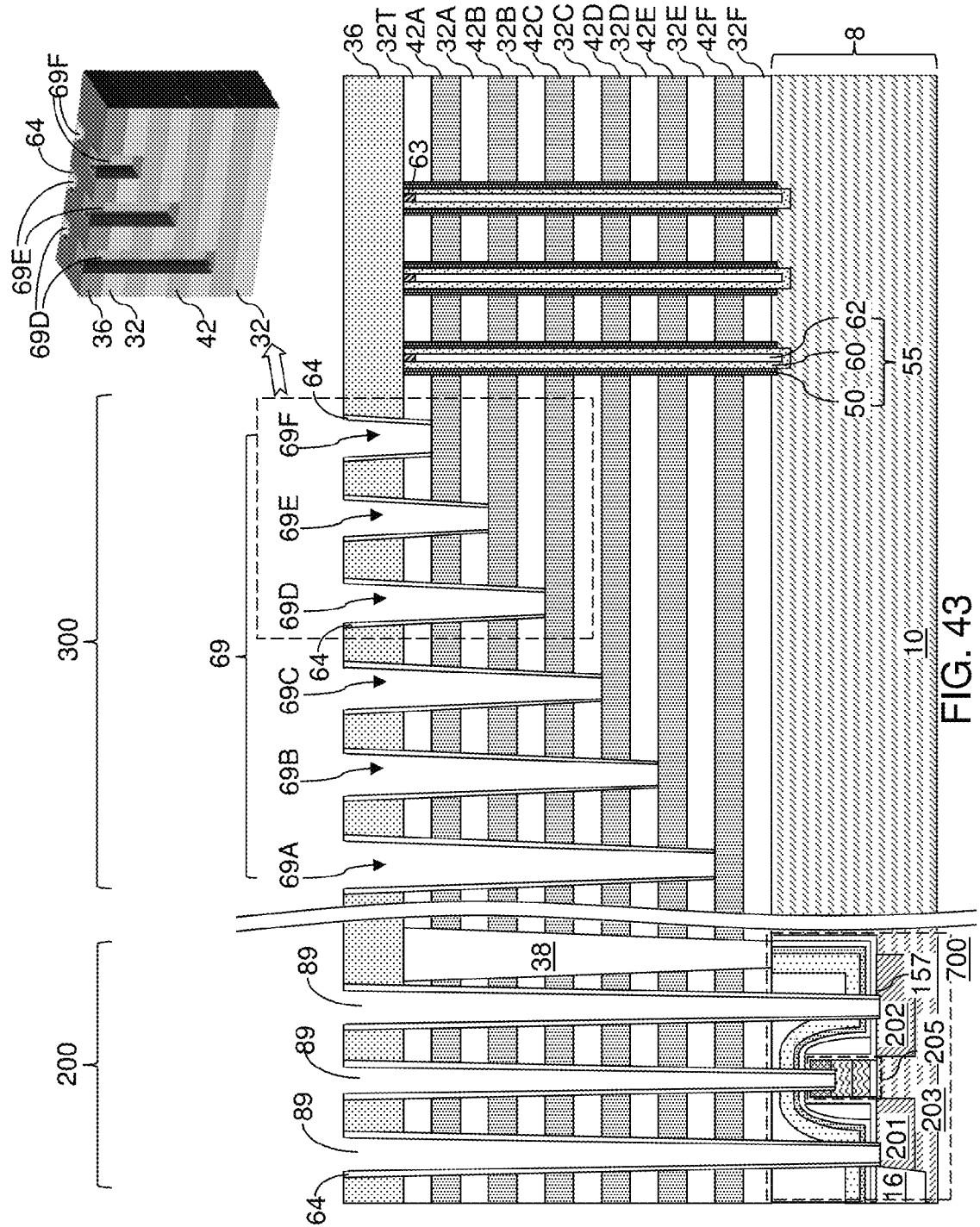

Referring to FIG. 43, insulating liners 64 can be formed on each sidewall of the plurality of contact openings 69 and on each sidewall of the peripheral contact openings 89 by performing an anisotropic etch of the continuous insulating material layer 64L as in the first embodiment.

Figure 44:
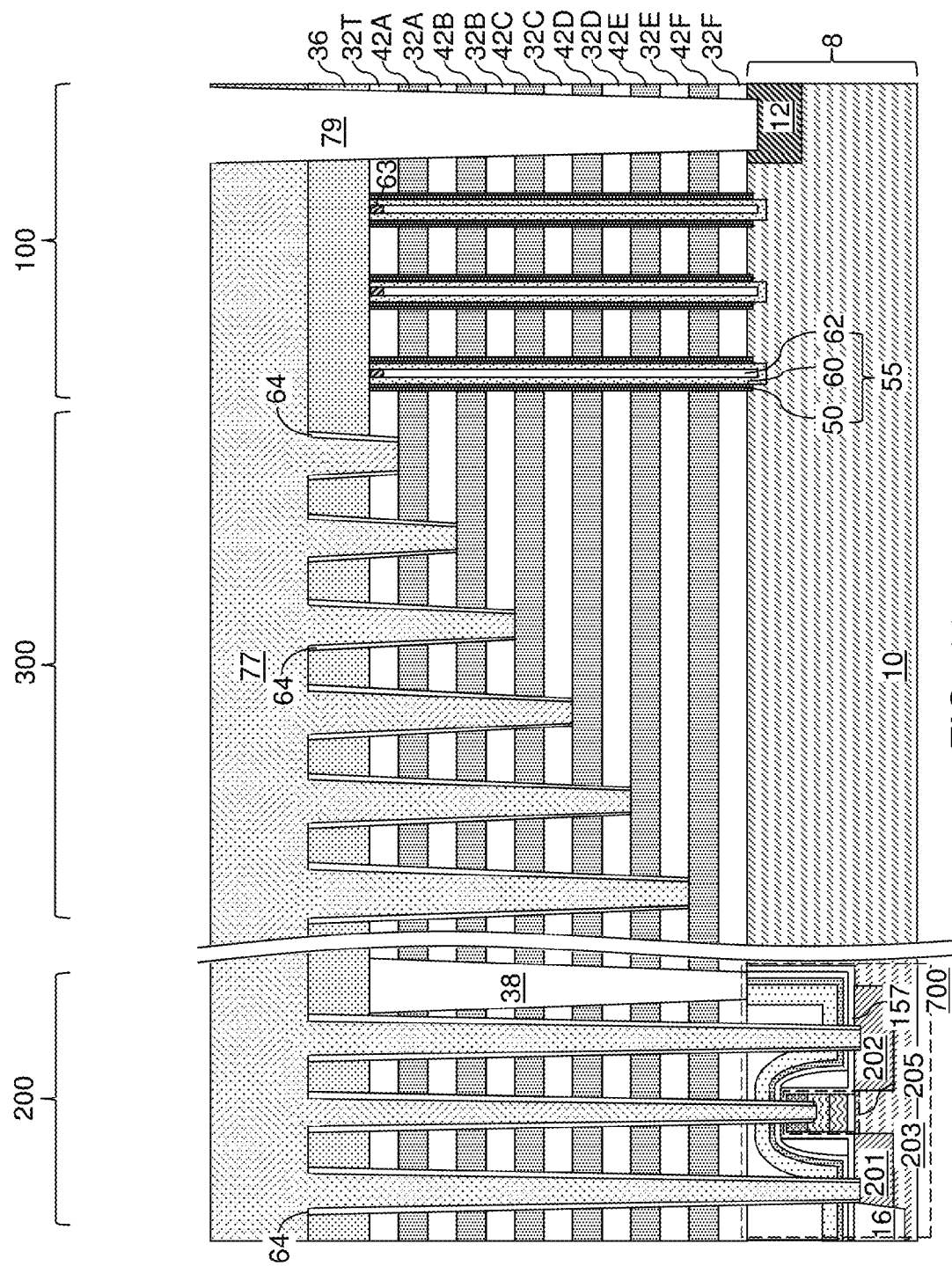

Referring to FIG. 44, a photoresist layer 77 can be applied over the mask layer 36 and lithographically patterned to form at least one backside contact trench 79 in an area in which formation of a backside contact 76 (See FIG. 15) is desired. The pattern in the photoresist layer 77 can be transferred through the mask layer 36 and the alternating stack (32, 42) employing an anisotropic etch to form the at least one backside contact trench 79 that extends at least to the top surface of the substrate 8. The trench that extends at least to the top surface of the substrate 8 is a contact opening, and can be a source contact opening. In one embodiment, electrical dopants (i.e., p-type dopants or n-type dopants) can be implanted into the portion of the doped well (e.g., doped substrate semiconductor layer 10) to form a source region 12 for vertical memory devices including the memory stack structures 55. The photoresist layer 77 can be subsequently removed, for example, by ashing.

Figure 45:
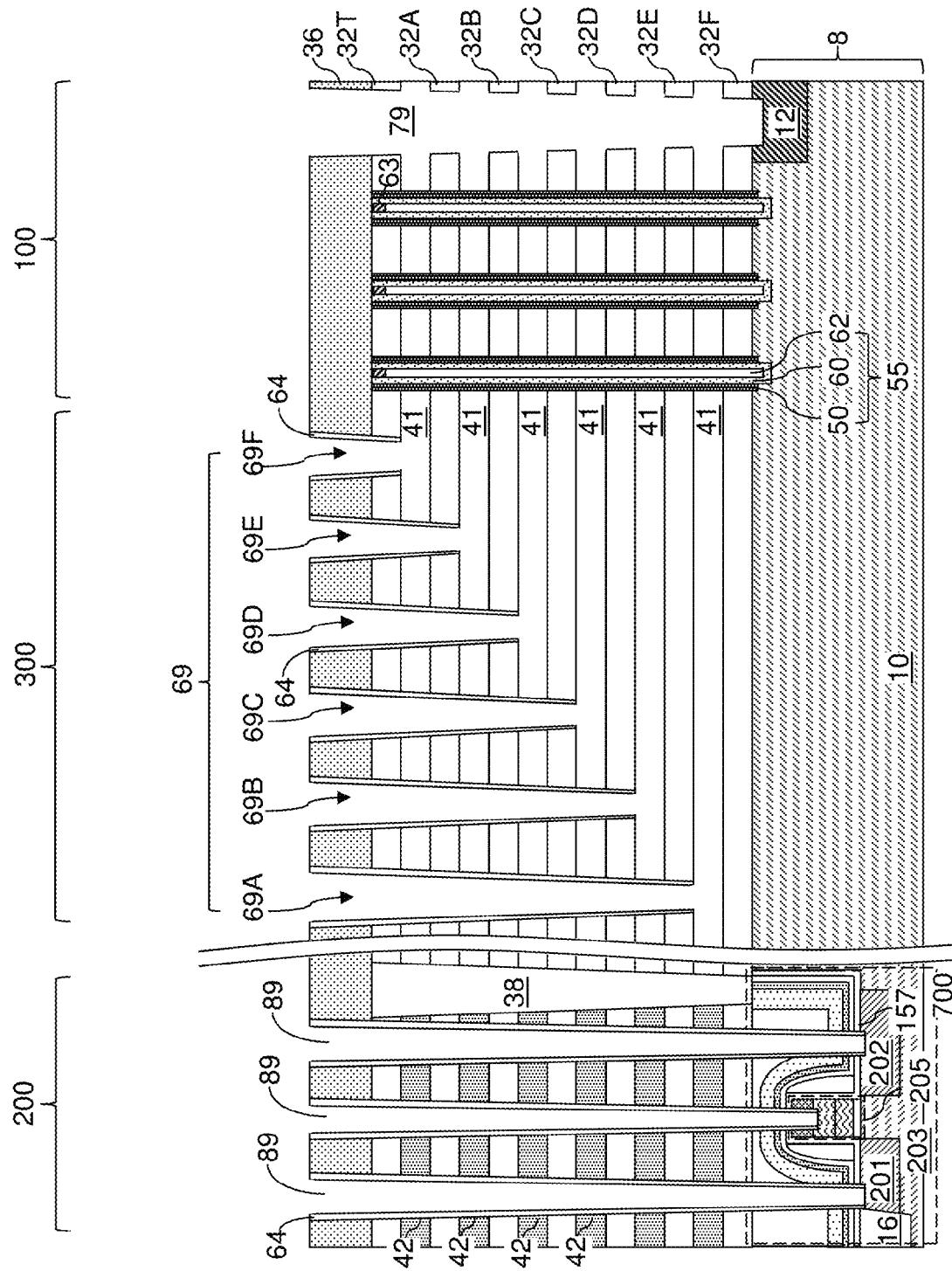

Referring to FIG. 45, an etchant that selectively etches the second material of the sacrificial material layers 42 with respect to the first material of the insulator layers 32 can be introduced into the plurality of contact openings 69 and the at least one backside contact trench 79, for example, employing an isotropic etch process. The sacrificial material layers 42 can be removed from the alternating stack (32, 42) by performing the processing steps of FIG. 12 to form lateral recesses 41 extending substantially parallel to the top surface of the substrate 8 between a respective pair of the insulating layers 32.

Figure 46:
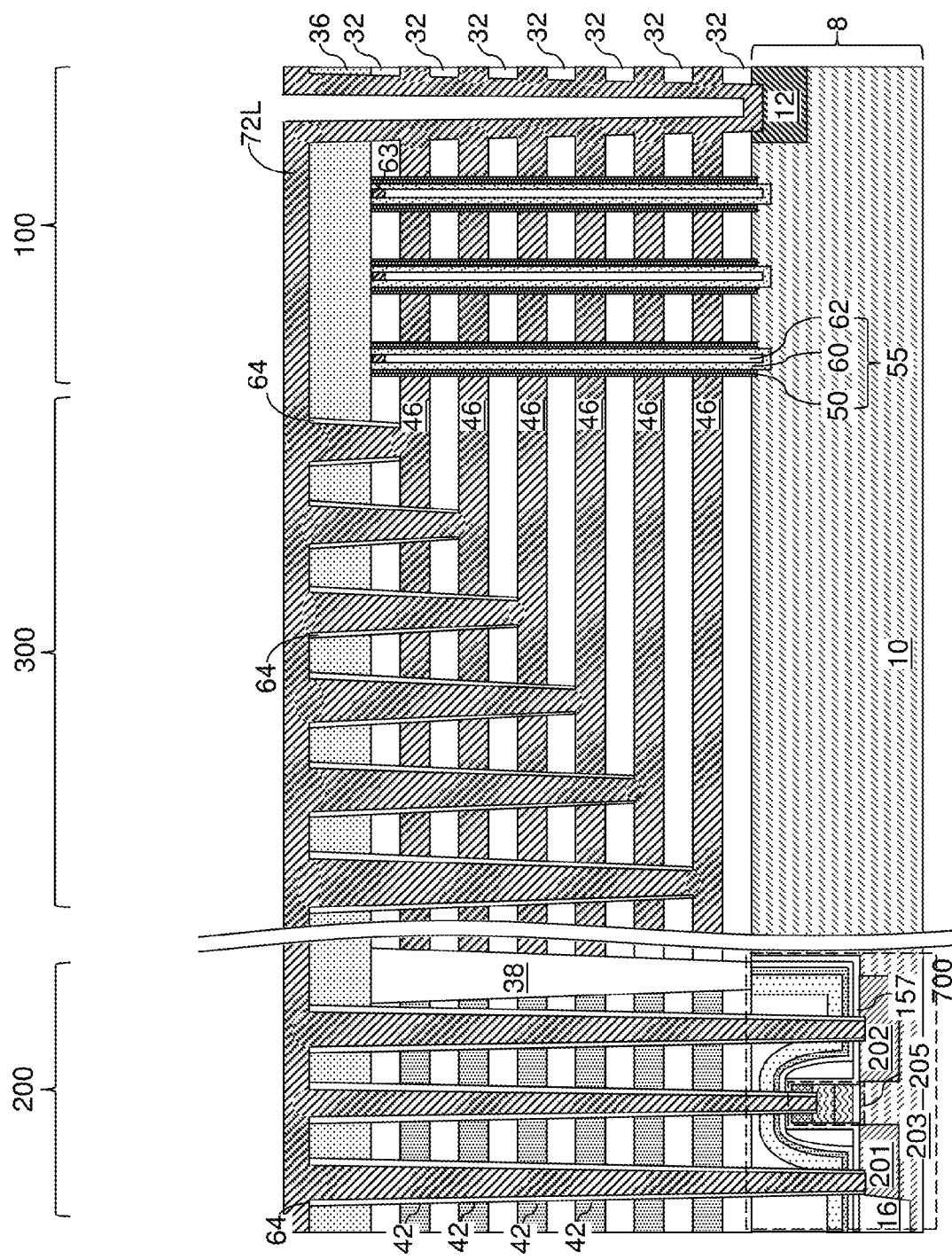

Referring to FIG. 46, a conductive material can be simultaneously deposited in the plurality of contact openings 69 and the plurality of recesses 41, the backside contact trench 79, and the peripheral contact openings 89, and over the top surface of the mask layer 36 by performing the processing steps of FIG. 13. Simultaneous deposition of the conductive material in the plurality of contact openings 69 (See FIG. 45), in the plurality of recesses 41 (See FIG. 45), on the sidewalls and the bottom surface of the backside contact trench 79 (See FIG. 45), and over the top surface of the mask layer 36 forms a plurality of electrically conductive electrodes 46 in the plurality of recesses 41 and a continuous conductive material layer 72L. Each electrically conductive electrode 46 can be a conductive line structure. The continuous conductive material layer 72L includes portions that fill all of the plurality of contact openings 69, a portion formed on the sidewalls of the bottom surface of the backside contact trench 79, and a portion overlying the top surface of the mask layer 36. The continuous conductive material layer 72L and the plurality of electrically conductive electrodes 46 are formed as an integral structure, i.e., a single continuous structure.

Referring to FIG. 47, the deposited conductive material is etched back, for example, by an isotropic etch by performing the processing steps of FIG. 14. The portion of the continuous conductive material layer 72L overlying the top surface of the mask layer 36 and the portion of the continuous conductive material layer 72L located within the backside contact trench 79 is removed. Each electrically conductive electrode 46 can be a conductive line structure. Each remaining portion of the deposited conductive material in a peripheral contact opening 89 (See FIG. 45) constitutes a peripheral device electrically conductive via contact 86. Each peripheral device electrically conductive via contact 86 is a device contact via structure extending through levels of the alternating stack (32, 42) to a respective semiconductor device.

Thus, the alternating stack (32, 46) includes, from top to bottom, a topmost insulator layer 32T, a first-from-top electrically conductive electrode 46A, a first-from-top insulator layer 32A, a second-from-top electrically conductive electrode 46B, a second-from-top insulator layer 32B, an alternating stack including at least one intermediate electrically conductive electrode 46C and at least one intermediate insulator layer 32C, an (N−2)-th-from-top electrically conductive electrode 46D, an (N−2)-th-from-top insulator layer 32D, an (N−1)-th-from-top electrically conductive electrode 46E, an (N−2)-th-from-top insulator layer 32E, an N-th-from-top electrically conductive electrode 46F, and an N-th-from-top insulator layer 32F. It is understood that an insulator layer 32 can refer to any of, or each of, the various insulator layers (32A, 32B, 32C, 32D, 32E, 32F), and an electrically conductive electrode 46 can refer to any of, or each of, the various sacrificial material layers (46A, 46B, 46C, 46D, 46E, 46F). Further, insulator layers 32 can refer to any plurality of, or all of, the various insulator layers (32A, 32B, 32C, 32D, 32E, 32F), and electrically conductive electrodes 46 can refer to any plurality of, or all of, the various electrically conductive electrodes (46A, 46B, 46C, 46D, 46E, 46F).

Remaining continuous portions of the deposited conductive material include a plurality of integrated line and via structures (46, 66). Specifically, each electrically shorted pair of an electrically conductive via contact 66 and an electrically conductive electrode 46 constitutes an integrated line and via structure (46, 66). The first device structure includes a plurality of integrated line and via structures (46, 66) having coplanar topmost surfaces (that are within the horizontal plane including the top surface of the mask layer 36) and bottommost surfaces located at different distances from the horizontal plane including the top surface of the alternating stack (32, 46) of the insulator layers 32 and the electrically conductive electrodes 46. In one embodiment, each instance of the electrically conductive electrodes 46 can be a portion of a respective one of the plurality of integrated line and via structures (46, 66).

The contact via structures 66 and the electrically conductive layers 46 can be formed simultaneously by deposition of a same set of at least one conductive material. Combinations of a contact via structures and an electrically conductive layer are formed as integrated line and via structures (46, 66). Thus, each of the integrated line and via structures (46, 66) includes a respective pair of an electrically conductive layer 46 and a contact via structure 66. A respective conductive material portion (such as a conductive material portion 462) without an interface therein can continuously extend through the electrically conductive layer 46 and the corresponding contact via structure 66 within each integrated line and via structure (46, 66).

Optionally, each integrated line and via structure (46, 66) can include a metallic liner 461 that coats the entire surfaces of a continuous cavity including a corresponding contact opening 69 and a corresponding recess 41. For example, the metallic liners 461 can be a continuous layer of titanium nitride. Each integrated line and via structure (46, 66) can include a conductive material portion 462 that can be embedded within the metallic liner 461, or can contact the surfaces of insulator layers 32, or can contact a dielectric material liner (not shown) such as a blocking dielectric layer that can be formed within the recesses 41 and the dielectric liners 64 prior to formation of the integrated line and via structures (46, 66). In one embodiment, the conductive material portion 462 can include tungsten. Each conductive material portion 462 can be a structure of integral construction, i.e., a single continuous structure. Each conductive material portion 462 can include a vertical conductive material portion and a horizontal conductive material portion that do not have any interface there between, but can be divided only geometrically by a discontinuous change in the horizontal cross-sectional area of the conductive material portion as a function of a vertical distance from the top surface of the alternating stack (32, 46).

Each integrated line and via structure (46, 66) can include a continuous material portion that is continuous throughout the entirety thereof and does not include any interface therein. Specifically, each of the plurality of integrated line and via structures (46, 66) can comprise an electrically conductive electrode 46 and an electrically conductive via contact 66 that adjoins, and overlies, the electrically conductive electrode 46 such that a continuous material portion without an interface therein continuously extends through the electrically conductive electrode 46 and the electrically conductive via contact 66. As used herein, an "interface" refers to any microscopic continuous surface at which different materials contact each other or a same material is spaced by a microscopic cavity or an impurity layer that is inherently present when one material is formed on another material in any environment that can introduce impurity materials. Because the same material is deposited simultaneously to form each continuous material portion of the electrically conductive via contact 66 and the electrically conductive electrode within each integrated line and via structure (46, 66), each continuous material portion in an integrated line and via structure (46, 66) is free of any interface that divides the continuous material portion into two portions.

In one embodiment, each conductive material portion 462 can be a continuous material portion within a respective integrated line and via structure (46, 66). In other words, each conductive material portion 462 can be free of any interface therein and continuously extend through the electrically conductive electrode 46 and the electrically conductive via contact 66 within a respective integrated line and via structure (46, 66). If a metallic liner 461 is present within a line and via structure (46, 66), the metallic liner 461 can be a continuous material portion that is free of any interface therein and continuously extends through the electrically conductive electrode 46 and the electrically conductive via contact 66 within the integrated line and via structure (46, 66). Each conductive material portion 462 within an integrated line and via structure (46, 66) can continuously extend at least from a horizontal plane including the topmost surface of the alternating stack (32, 46) to a sidewall of the conductive material portion 462 located underneath another horizontal plane including a top surface of the electrically conductive electrode 46 within the integrated line and via structure (46, 66).

In one embodiment, each of the plurality of integrated line and via structures (46, 66) can have a topmost surface that is coplanar with the top surface of the alternating stack (32, 46), and electrically conductive electrodes 46 within the plurality of integrated line and via structures (32, 46) can be located at different levels within the alternating stack (32, 46). The different levels are vertically spaced by at least one insulator layer 32. In one embodiment, a dielectric liner 46 can laterally surround each electrically conductive via contact 66 within the plurality of integrated line and via structures (46, 66). Each of the plurality of integrated line and via structures (46, 66) can be electrically isolated from one another by the insulator layers 32 and the dielectric liners 64.

Figure 48:
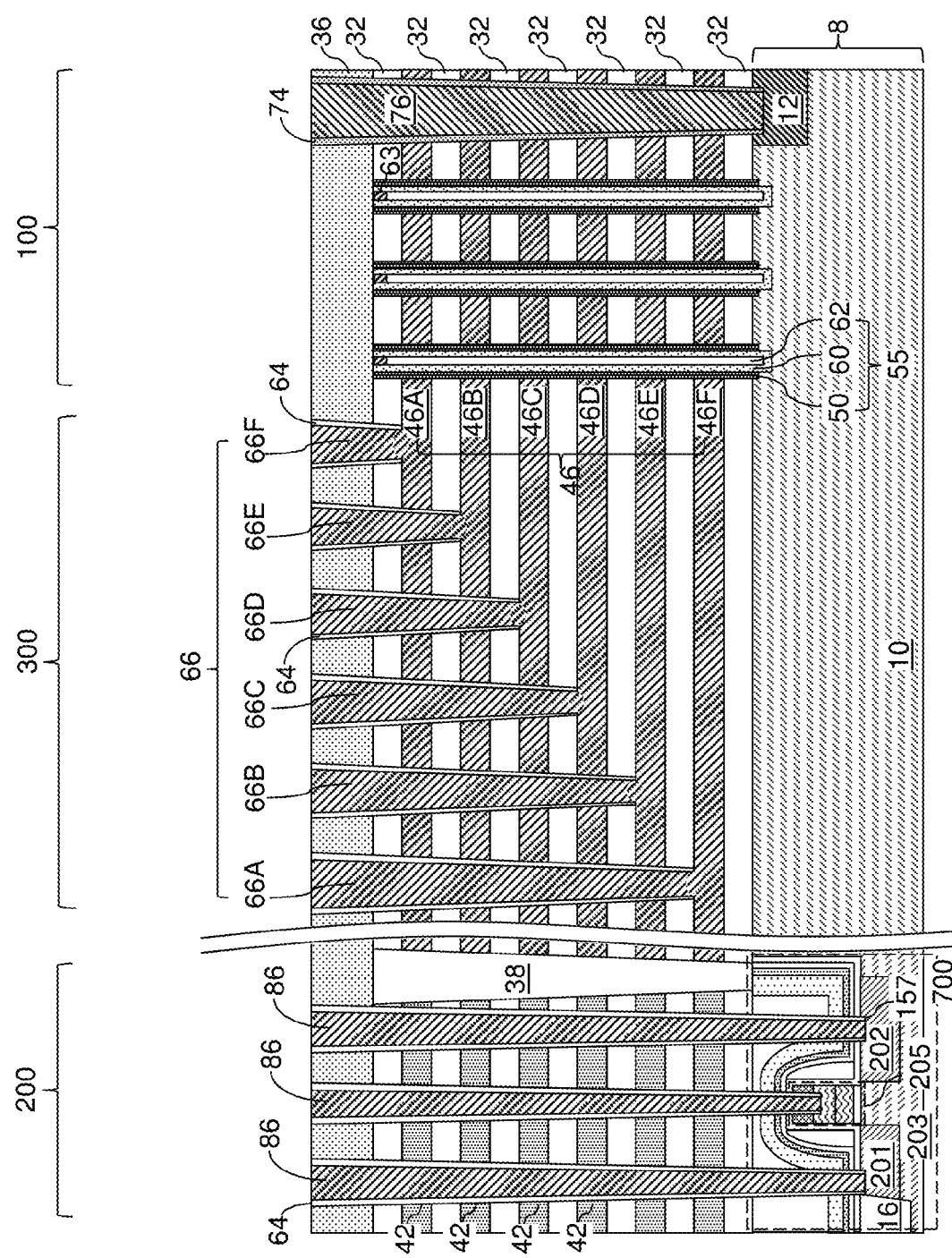

Referring to FIG. 48, an insulating spacer 74 can be formed on the sidewalls of the backside contact trench 79 by deposition of a continuous dielectric material layer and an anisotropic etch as in the first embodiment. The backside contact trench 79 can be subsequently filled with a fill layer of another conductive material, which is herein referred to as a second conductive material. The second conductive material can be the same as, or can be different from, the first conductive material, i.e., the conductive material of the integrated line and via structures (46, 66). The second conductive material can be an electrically conducting material, and can include a metal such as tungsten and/or a metal nitride. The deposited second conductive material can be planarized employing the mask layer 36 as a stopping layer for the planarization process. Remaining portions of the second conductive material after the planarization process constitutes a backside contact 76, which can provide a vertically conductive electrical path to an electrical node of a device component within, or on, the substrate 8 and underneath the alternating stack (32, 46). The backside contact 76 can be a source line electrically connected to a source region in the substrate 8. The top surface of the backside contact 76 can be coplanar with the top surface of the mask layer 36.

In one embodiment, each electrically conductive electrode 46 among the plurality of line and via structures (46, 66) can comprise a word line that function as a common control gate electrode for the plurality of stacked memory devices including the memory stack structures 55. In one embodiment, at least one of the plurality of contact opening 69 (e.g., a first contact opening 69A) can have a first periphery contained entirety within a sidewall of one of the sacrificial material layers 42 (e.g., the N-th-from-top sacrificial material layer 42F) and a second periphery contained entirely within a sidewall of another of the sacrificial material layers 42 (e.g., the (N−1)-th-from-top sacrificial material layer 42E). In one embodiment, at least one of the plurality of contact opening 69 (e.g., a first contact opening 69A) can have a first periphery contained entirety within a sidewall of one of the insulator layers 32 (e.g., the (N−1)-th-from-top insulator layer 32E) and a second periphery contained entirely within a sidewall of another of the insulator layer 32 (e.g., the (N−2)-th-from-top sacrificial material layer 42D).

The third exemplary structure of FIG. 48 includes a memory device, which comprises at least one memory cell (12, 55, 63) located on a substrate 8. Each of the at least one memory cell contains a semiconductor channel 60 including a vertical portion extending substantially perpendicular to a top surface of the substrate 8 and further includes a memory film 50 contacting an outer sidewall of the semiconductor channel 60. The memory device further comprises an alternating stack (32, 46) of insulator layers 32 and electrically conductive electrodes 46 that laterally surrounds portions of the at least one memory cell (12, 55, 63). The memory device further comprises a plurality of integrated line and via structures (46, 66) embedded within the insulator layers 32. Each of the plurality of integrated line and via structures (32, 46) comprises a respective one of the electrically conductive electrodes 46 and an electrically conductive via contact 66 that adjoins, and overlies, the respective electrically conductive electrode 46 such that a conductive material portion 462 without an interface therein continuously extends through the respective electrically conductive electrode 46 and the electrically conductive via contact 66. Each instance of the electrically conductive electrodes 46 is a portion of a respective one of the plurality of integrated line and via structures (46, 66).

In one embodiment, each instance of the electrically conductive electrodes 46 can include a control gate electrode for the at least one memory cell (12, 55, 63). The memory device can further include a source region 12 located within, or on, the substrate 8 and contacting a bottom surface of the at least one semiconductor channel 60. The memory device can further include a drain region 63 located on a top surface of one of the at least one semiconductor channel 60.

The memory device can include a dielectric liner 64 (e.g., the dielectric liner 64 in contact with a first electrically conductive via contact 66A) having an outer sidewall and an inner sidewall. The outer sidewall can contact a first electrically conductive electrode (e.g., the (N−2)-th-from-top electrically conductive electrode 46D) within a first integrated line and via structure (66A, 46F) (e.g., the integrated line and via structure including a third electrically conductive via contact 66C and the (N−2)-th-from-top electrically conductive electrode 46D), and a second electrically conductive electrode (e.g., the (N−1)-th-from-top electrically conductive electrode 46E) within a second integrated line and via structure (66B, 46E) (e.g., the integrated line and via structure including a second electrically conductive via contact 66B and the (N−1)-th-from-top electrically conductive electrode 46E). The second line structure (e.g., the (N−1)-th-from-top electrically conductive electrode 46E) underlies the first line structure (e.g., the (N−2)-th-from-top electrically conductive electrode 46D). The inner sidewall can contact an electrically conductive via contact (e.g., a first electrically conductive via contact 66A) within a third integrated line and via structure (66C, 46D) (e.g., the integrated line and via structure including the first electrically conductive via contact 66A and the N-th-from-top electrically conductive electrode 46F) that contains a third line structure (e.g., the N-th-from-top electrically conductive electrode 46F) underlying the second line structure (e.g., the (N−1)-th-from-top electrically conductive electrode 46E).

Figure 49:
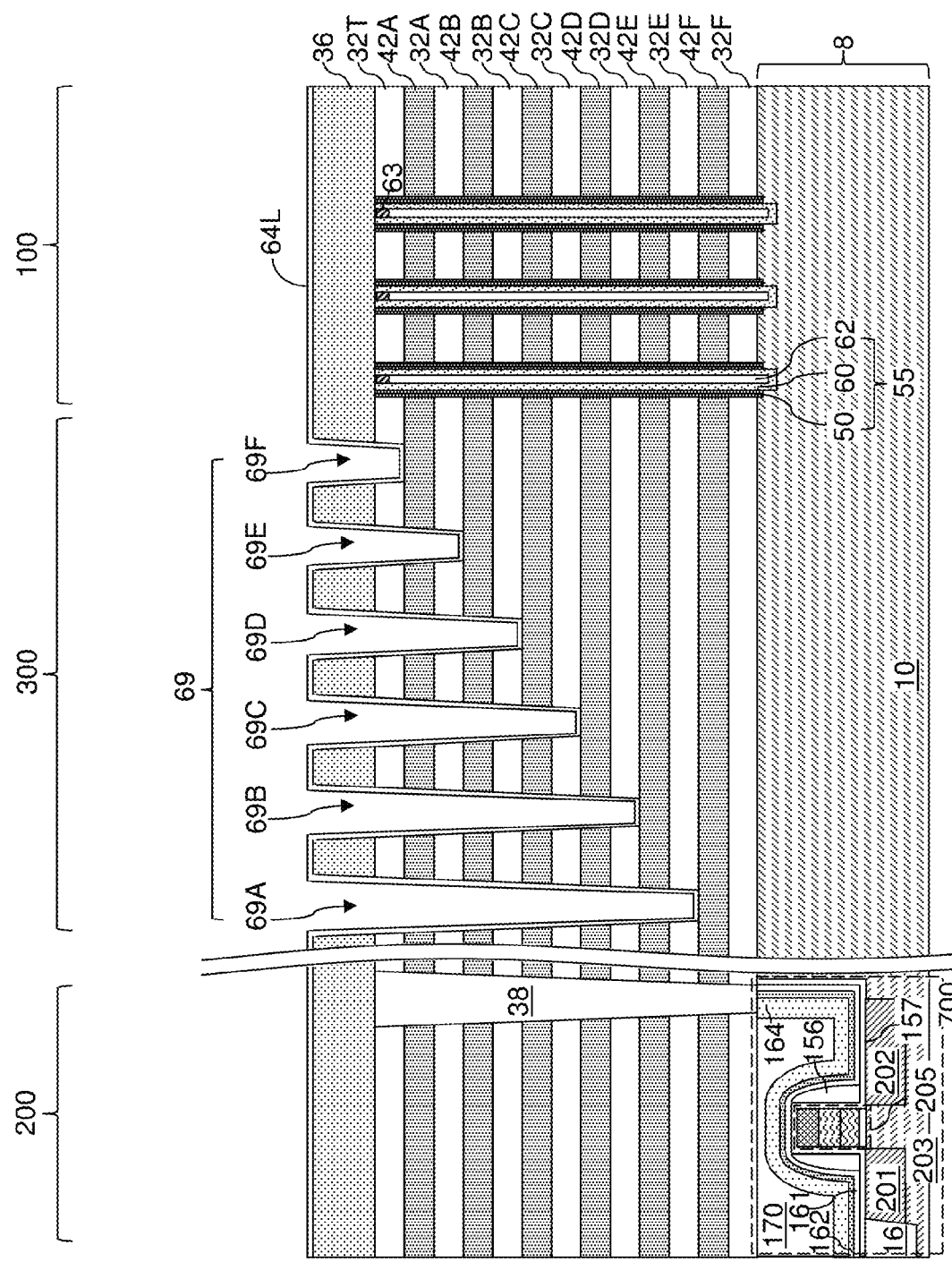
FIGS. 49-59 illustrate sequential vertical cross-sectional views of a fourth exemplary structure employed to fabricate a device structure containing vertical NAND memory devices according to a fourth embodiment of the present disclosure.

Referring to FIG. 49, a fourth exemplary structure according to a second embodiment of the present disclosure can be derived from the third exemplary structure of FIG. 40 by omitting the processing steps of FIG. 41 and by performing the processing steps of FIG. 42 to form a continuous insulating material layer 64L.

Figure 50:
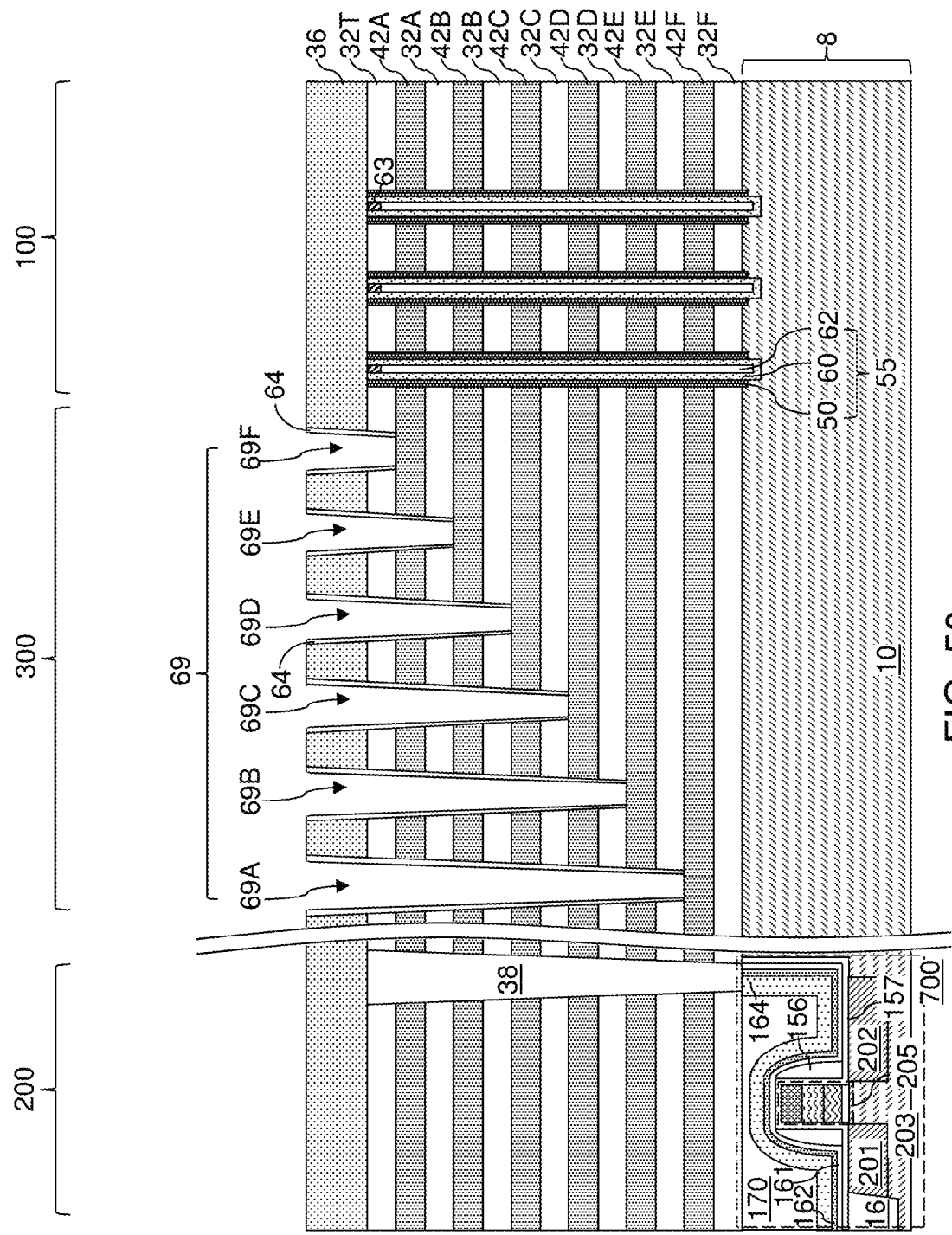

Referring to FIG. 50, the processing steps of FIG. 42 are performed to form insulating liners 64 on the sidewalls of the plurality of contact openings 69. The insulating liners 64 can be formed on each sidewall of the plurality of contact openings 69 by performing an anisotropic etch of the continuous insulating material layer 64L. Specifically, upon anisotropically etching the continuous insulating material layer 64L, each remaining portion of the continuous insulating material layer 64L constitutes an insulating liner 64. A portion of a top surface of a sacrificial material layer 42 is physically exposed at the bottom of each of the plurality of contact openings 69. Each insulating liner 64 can be topologically homeomorphic to a torus.

Figure 51:
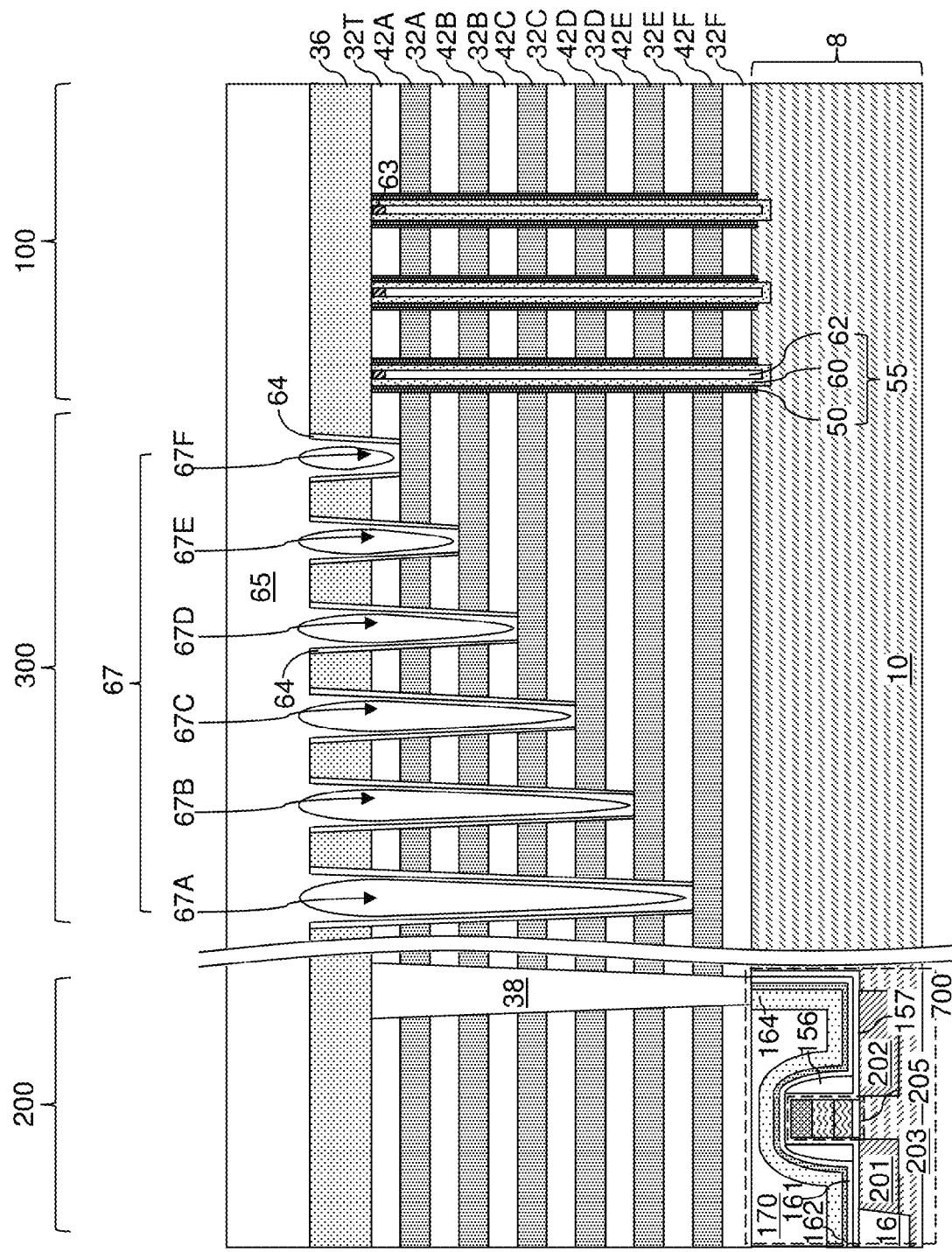

Referring to FIG. 51, a continuous material layer 65 is formed by deposition of a disposable material. The continuous material layer 65 is a non-conformal layer formed by non-conformal deposition of the dielectric material. The disposable material is different from the second material, i.e., the material of the sacrificial material layers 42. In the fourth embodiment, the continuous material layer 65 can be deposited within the contact openings 69 prior to formation of the lateral recesses 41. As in the second embodiment, the disposable material can be a dielectric material such as a doped silicate glass, an undoped silicate glass, an organosilicate glass (which is also referred to as a SiCOH dielectric material), amorphous carbon, diamond-like carbon (DLC), or a combination thereof. In another embodiment, the disposable material can be a semiconductor material such as an elemental semiconductor material, an alloy of at least two elemental semiconductor materials, a compound semiconductor material, an organic semiconductor material, or a combination thereof. For example, the disposable material can include amorphous silicon or polycrystalline silicon. The non-conformal deposition process can be, for example, plasma enhanced chemical vapor deposition (PECVD), physical vapor deposition (PVD), molecular beam deposition, cluster beam ion implantation, or any other deposition method that can provide a directional impingement of molecules or clusters of a deposited material along the direction substantially normal to the top surface of the substrate 8. Processing steps of FIG. 18 can be employed to deposit the continuous material layer 65.

After the processing steps of FIG. 51, an in-process device structure is formed. The in-process device structure includes a stack (32, 42) including an alternating plurality of material layers (e.g., the sacrificial material layers 42) and insulator layers 32 and located over a top surface of a substrate 8. The in-process device structure further includes a plurality of contact openings 69 (See FIG. 55) located within the stack (32, 42). Each of the plurality of contact openings 69 extends at least from a topmost surface of the alternating stack (32, 42) to a surface of a respective material layer (i.e., the various sacrificial material layers 42) among the material layers. The respective material layers are located at different levels. The in-process device structure further includes a continuous material layer 65 overlying the stack (32, 42). A plurality of encapsulated unfilled cavities 67 is present underneath surfaces of the continuous material layer 65 that extend downward from above a horizontal plane including the top surface of the stack (32, 42) into the plurality of contact openings 69. Each of the plurality of encapsulated unfilled cavities 67 occupies a portion of a volume of a respective one of the plurality of contact openings 69.

Figure 52:
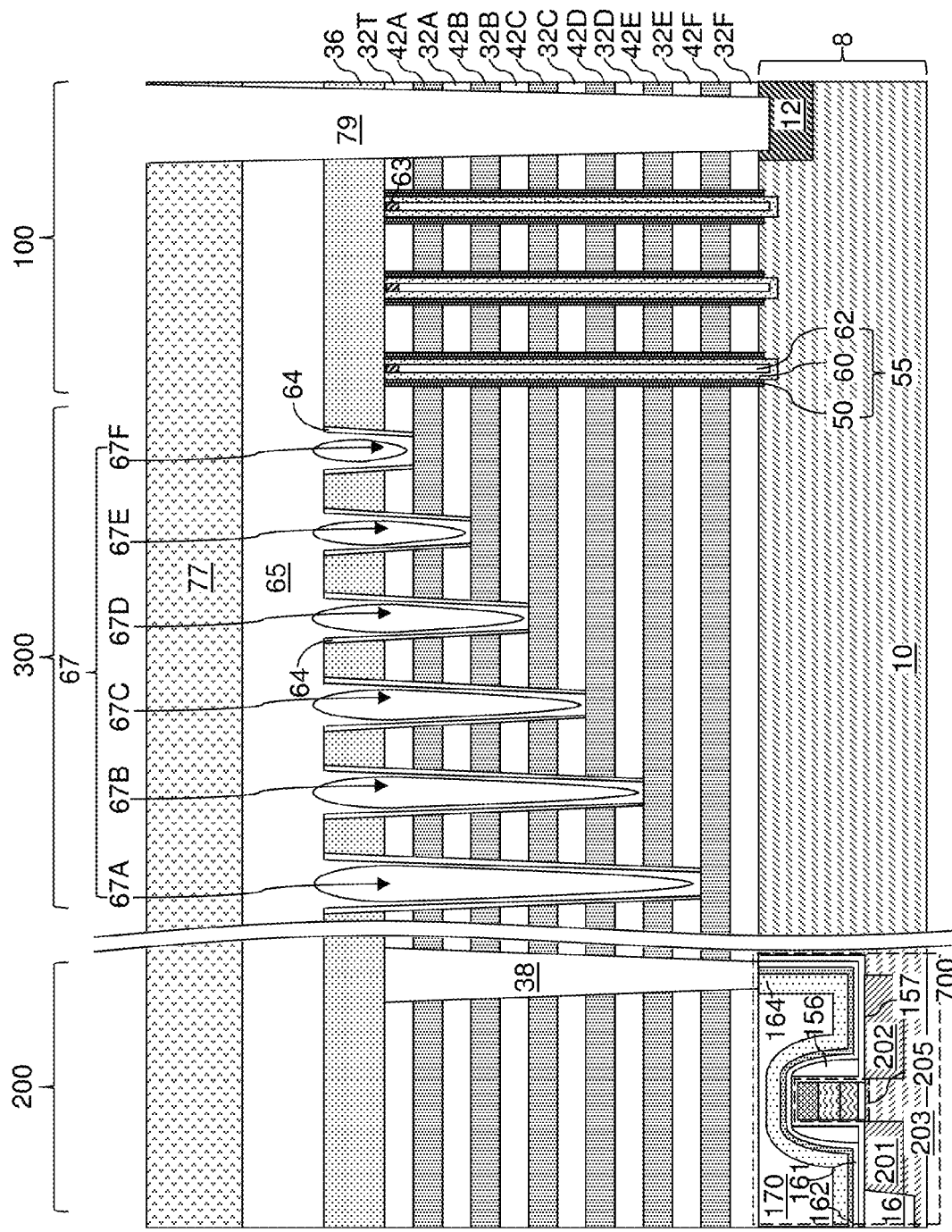

Referring to FIG. 52, a photoresist layer 77 can be applied over the stack of the mask layer 36 and the continuous material layer 65, and lithographically patterned to form at least one opening in an area in which formation of a backside contact 76 (See FIG. 59) is desired. The pattern in the photoresist layer 77 can be transferred through the continuous material layer 65, the mask layer 36, and the alternating stack (32, 42) employing an anisotropic etch to form a via trench that extends at least to the top surface of the substrate 8. The via trench that extends at least to the top surface of the substrate 8 is a contact opening, and is herein referred to as a backside contact trench 79. In one embodiment, the surface that is physically exposed at the bottom of the backside contact trench 79 can be implanted with electrical dopants, such as p-type dopants or n-type dopants, to form a source region 12 for vertical memory devices including the memory stack structures 55. The photoresist layer 77 can be subsequently removed, for example, by ashing. Sidewalls of the sacrificial material layers 42 and sidewalls of the insulator layers 32 are physically exposed as surfaces of the backside contact trench 79.

Figure 53:
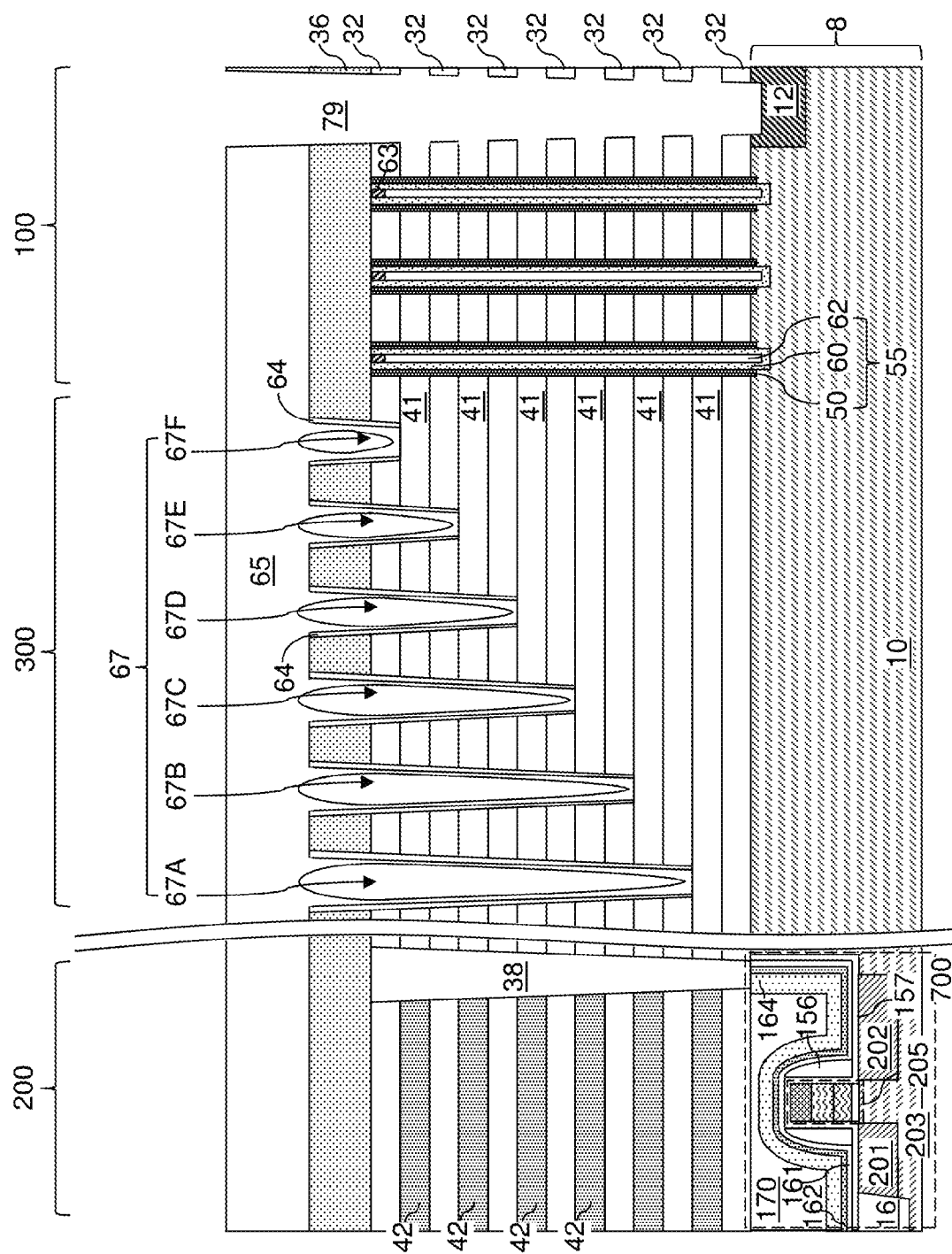

Referring to FIG. 53, the processing steps of FIG. 45 are performed to form a plurality of recesses 41. The sacrificial material layers 42 (See FIG. 52) can be removed selective to the insulator layers 32 to form a plurality of recesses 41 while the plurality of encapsulated unfilled cavities 67 is present. The backside contact trench 79 can be employed as a conduit that introduces etchants for removing the second material of the sacrificial material layers 42 during the selective etch process that forms the plurality of recesses 41. In this case, the removal of the etched portions of the sacrificial material layers 42 selective to the insulator layers 32 can be performed by introducing an etchant to the sacrificial material layers 42 through the backside contact trench 79. The insulating liners 64 protect the sidewalls of each of the plurality of contact openings 69 from an etchant used to remove at least a portion of each sacrificial material layer 42. The removal of the sacrificial material layers 42 can be performed selective to the continuous material layer 65 and the insulating layers 32.

The plurality of recesses 41 can extend substantially parallel to the top surface of the substrate 8. Because a bottom portion of the continuous material layer 65 is present at the bottom of each contact opening 69, a surface of each of the plurality of recesses 41 can be a bottom surface of a respective portion of the non-conformally deposited material, i.e., a respective portion of the continuous material layer 65.

Figure 54:
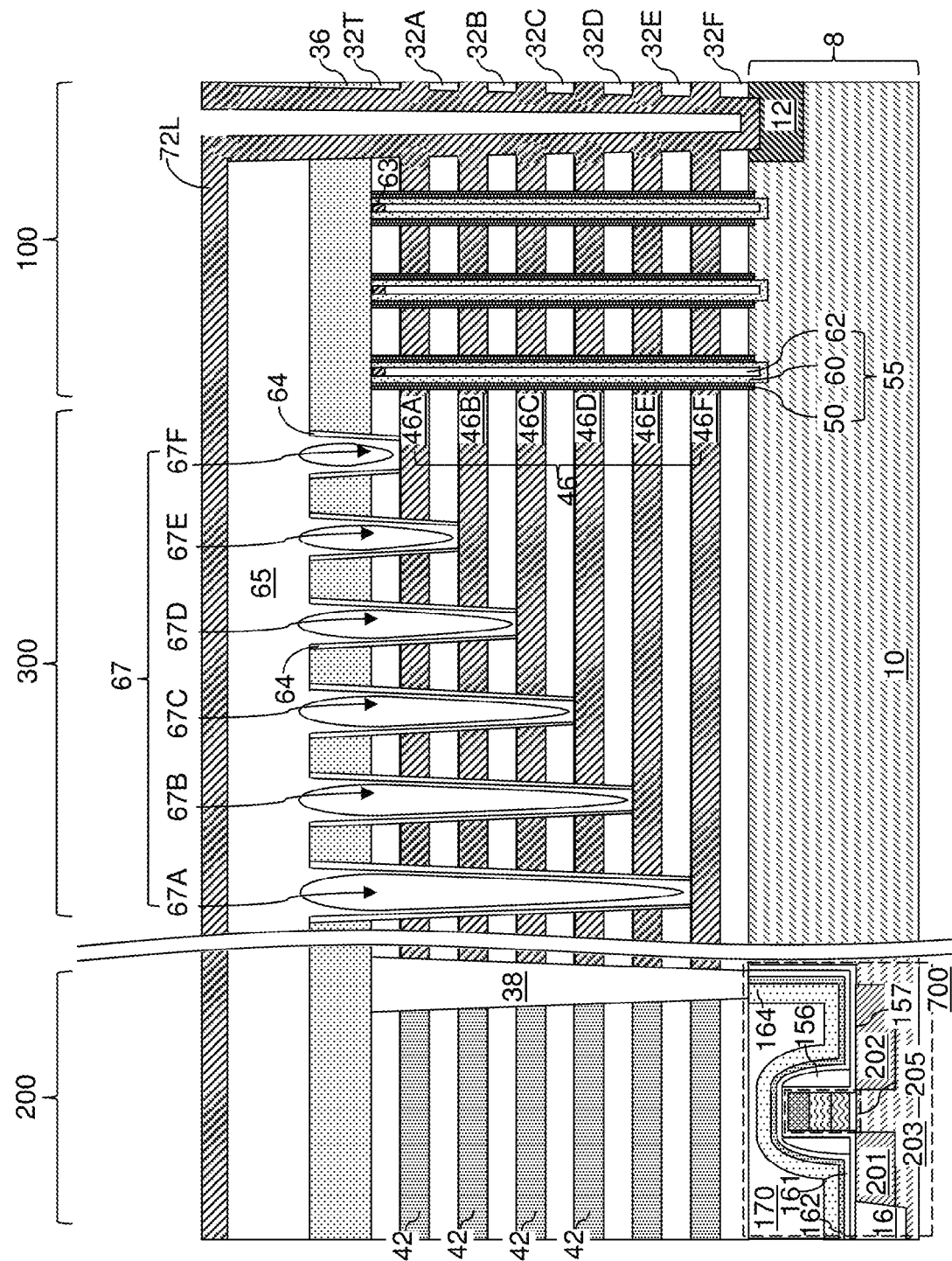

Referring to FIG. 54, the processing steps of FIG. 21 can be subsequently performed to simultaneously deposit a conductive material in the plurality of recesses 41 and the backside contact trench 79, and over the top surface of the continuous material layer 65. The conductive material is herein referred to as a first conductive material, or an electrically conductive electrode material. The first conductive material can be deposited employing the same type of processing steps as in the processing steps of FIG. 21. The backside contact trench 79 can be employed as a conduit that introduces the first conductive material into the plurality of recesses 41. In this case, the deposition of the first conductive material into the plurality of recesses 41 can be performed by introducing of the deposited conductive material into the plurality of recesses 41 through the backside contact trench 79. The insulating liners 64 and continuous material layer 65 (which is a non-conformal layer) substantially prevent the electrically conductive electrode material from covering (i.e., contacting) the sidewalls of each contact opening 69.

Simultaneous deposition of the conductive material in the plurality of recesses 41, on the sidewalls and the bottom surface of the backside contact trench 79 (See FIG. 50), and over the top surface of the continuous material layer 65 forms a plurality of electrically conductive electrodes 46 in the plurality of recesses 41 and a continuous conductive material layer 72L. Each electrically conductive electrode 46 can be a conductive line structure. The continuous conductive material layer 72L includes a portion formed on the sidewalls of the bottom surface of the backside contact trench 79, and a portion overlying the top surface of the mask layer 36. The continuous conductive material layer 72L and the plurality of electrically conductive electrodes 46 are formed as an integral structure, i.e., a single continuous structure. The electrically conductive layers 46 are formed while the continuous material layer 65 is present in the contact openings.

After the processing steps of FIG. 54, an in-process device structure is formed. The in-process device structure includes a stack (32, 46) including an alternating plurality of material layers (e.g., the electrically conductive electrodes 46) and insulator layers 32 and located over a top surface of a substrate 8. The in-process device structure further includes a plurality of contact openings 69 (See FIG. 56) located within the stack (32, 46). Each of the plurality of contact openings 69 extends at least from a topmost surface of the alternating stack (32, 46) to a surface of a respective material layer (i.e., the various electrically conductive electrodes 46) among the material layers. The respective material layers are located at different levels. The in-process device structure further includes a continuous material layer 65 overlying the stack (32, 46). A plurality of encapsulated unfilled cavities 67 is present underneath surfaces of the continuous material layer 65 that extend downward from above a horizontal plane including the top surface of the stack (32, 46) into the plurality of contact openings 69. Each of the plurality of encapsulated unfilled cavities 67 occupies a portion of a volume of a respective one of the plurality of contact openings 69.

In one embodiment, the alternating plurality of material layers can include the electrically conductive electrodes 46, which can include a conductive material such as tungsten. A bottom surface of each portion of the continuous material layer 65 in the plurality of contact openings can be in contact with a respective electrically conductive electrode 46.

Figure 55:
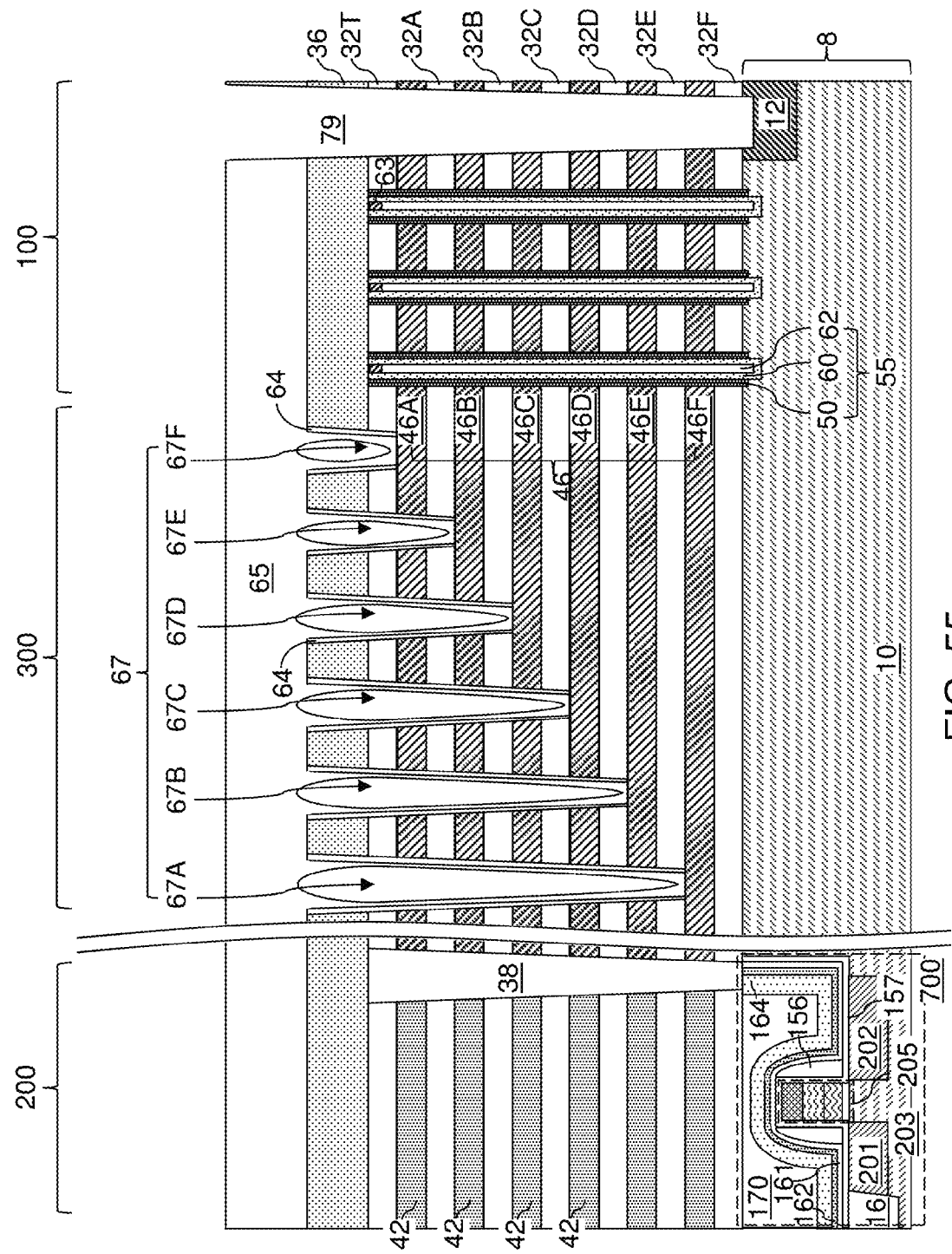

Referring to FIG. 55, the deposited conductive material is etched back, for example, by an isotropic etch. The processing steps of FIG. 14 can be employed. The conductive material layer 72L can be removed by the etch-back process.

Figure 56:
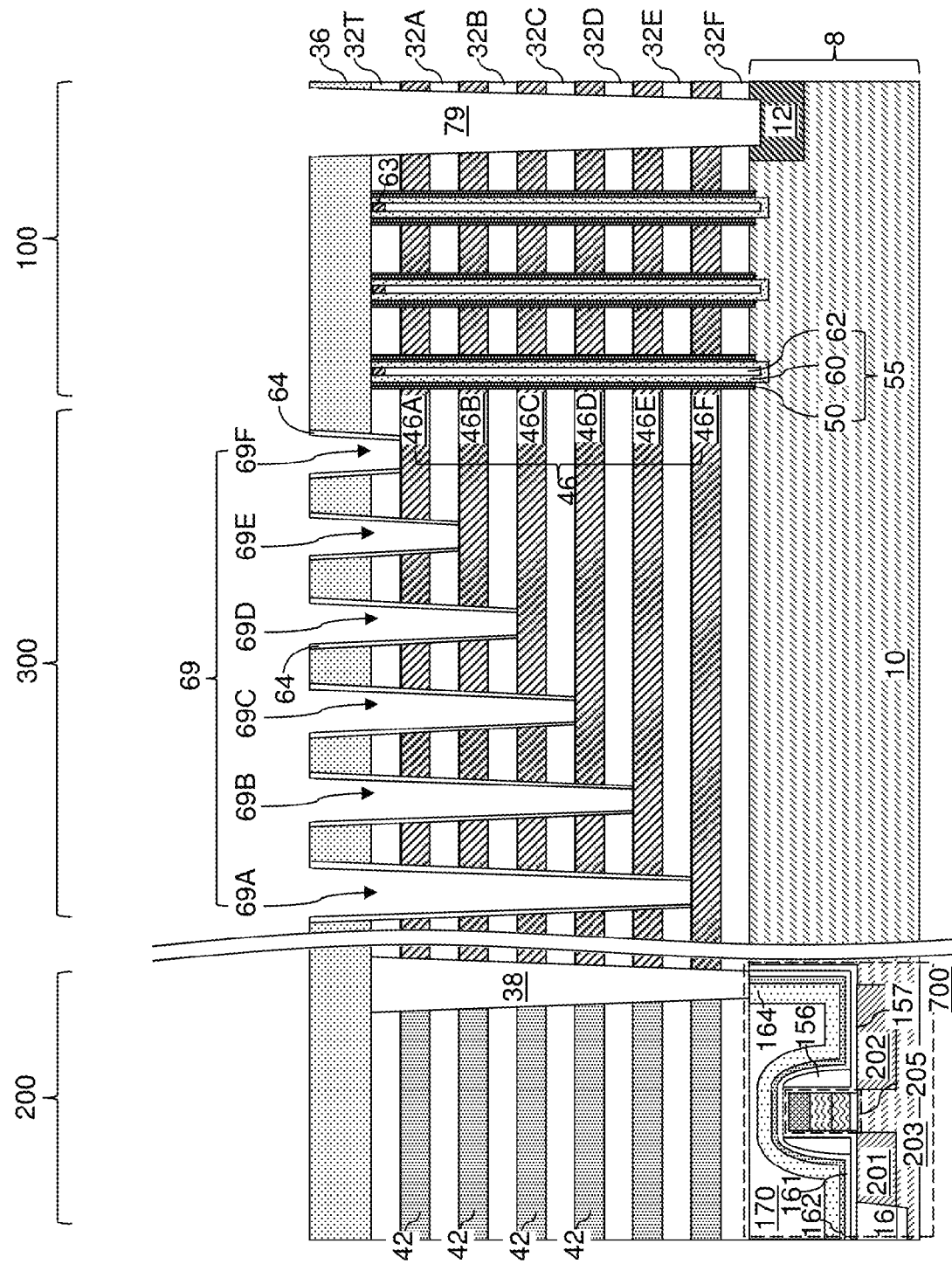

Referring to FIG. 56, the continuous material layer 65 can be removed from above the top surface of the mask layer 36 and from inside the plurality of contact openings 69 without forming a hole in the insulating liners 64. In one embodiment, the continuous material layer 65 can include a material that is different from the material of the insulating liners 64. In this case, the continuous material layer 65 can be removed selective to the material of the insulating liners 64. In another embodiment, the continuous material layer 65 can include the same material as the insulating liners 64. In this case, the horizontally extending portion of the continuous material layer 65 above the top surface of the mask layer 36 can be removed, for example, by a recess etch and/or chemical mechanical planarization, and each bottom portion of the continuous material layer 65 in contact with a top surface of an electrically conductive electrodes 46 can be removed by an anisotropic etch to physically expose a top surface of an underlying electrically conductive electrode 46 within each contact opening 69.

Figure 57:
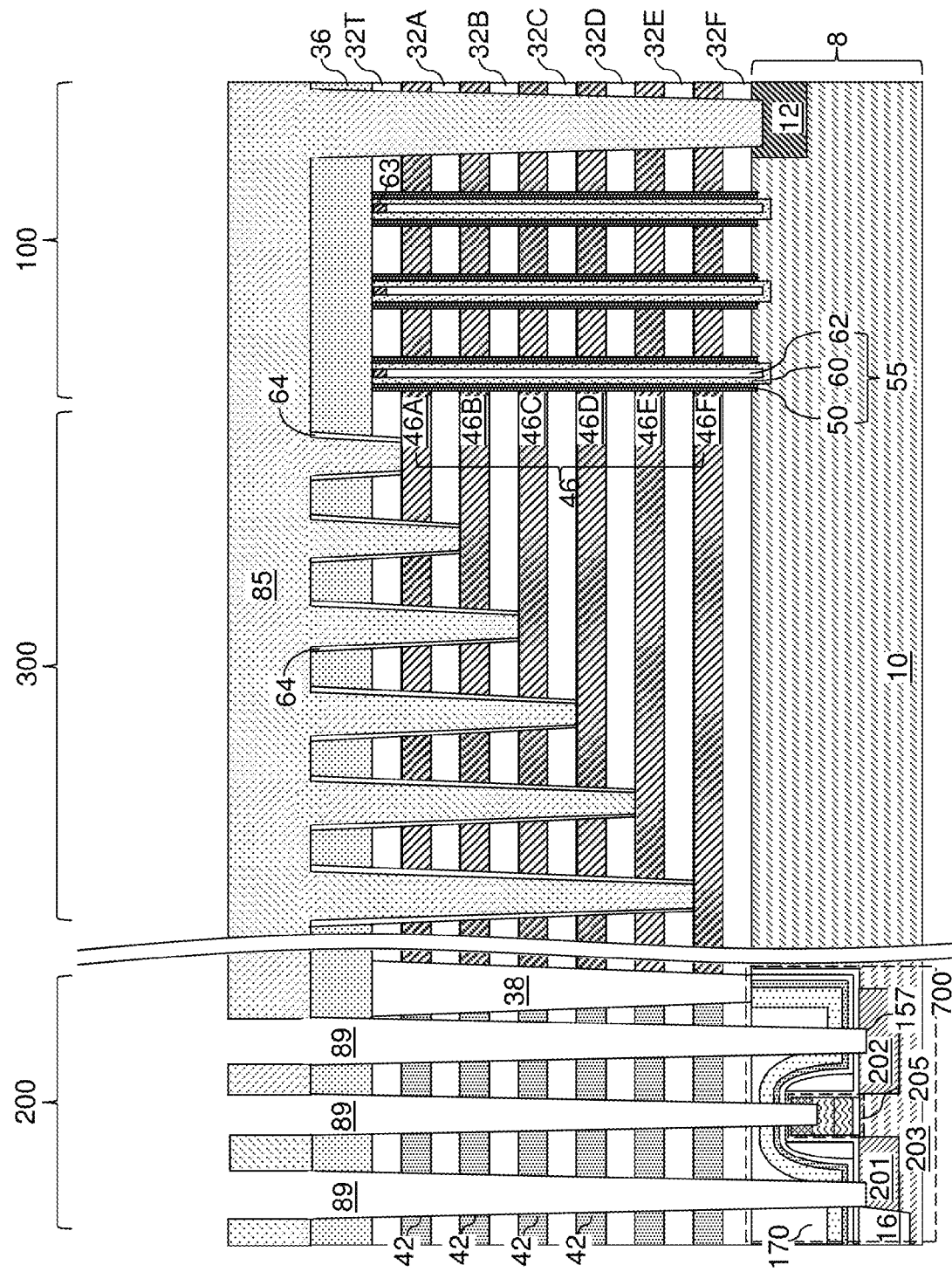

Referring to FIG. 57, the processing steps of FIG. 24 can be performed to form peripheral contact openings 89.

Figure 58:
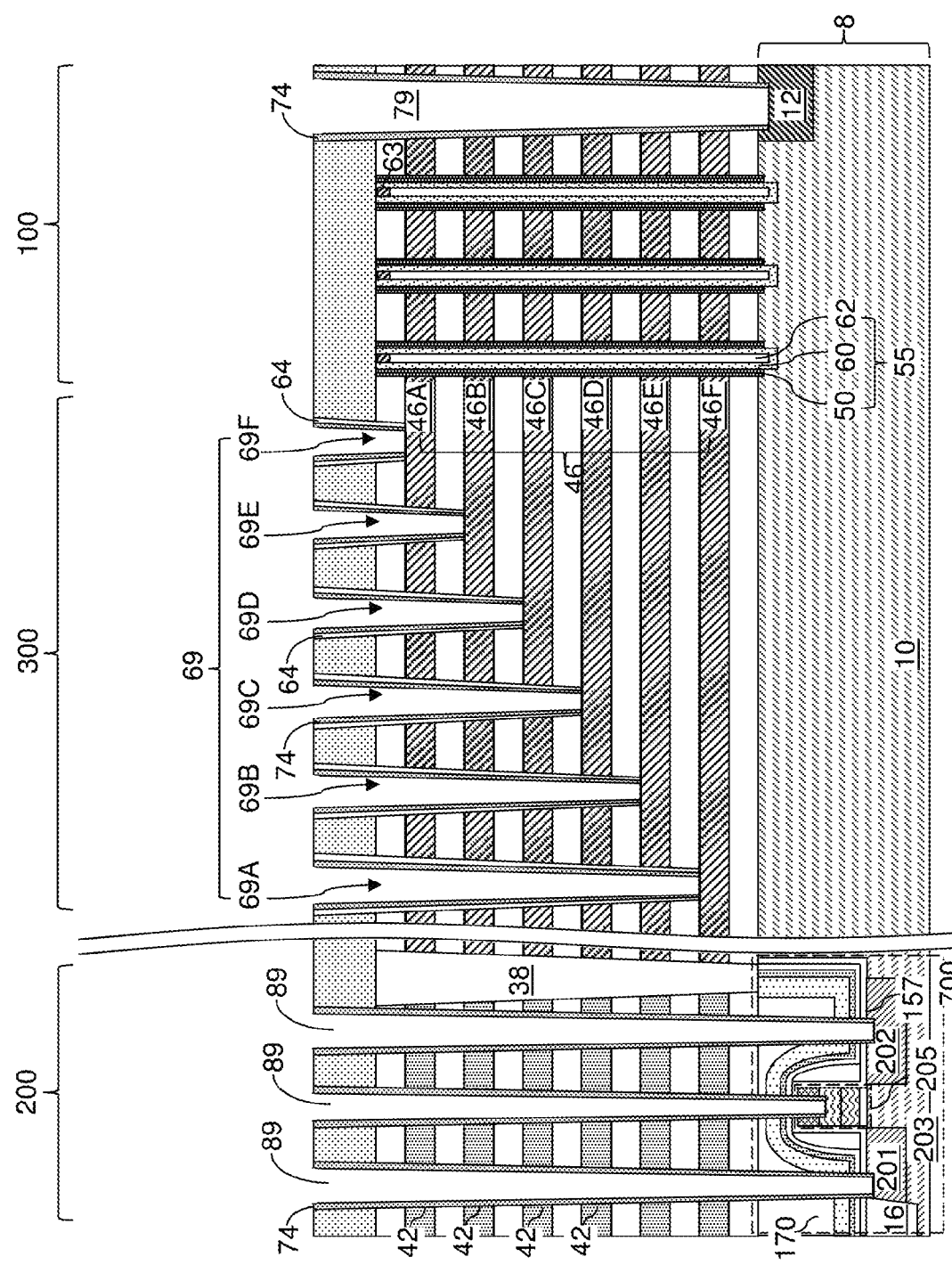

Referring to FIG. 58, insulating spacers 74 can be formed on the sidewalls of the backside contact trench 79, the plurality of contact via trenches 69, and the peripheral contact openings 89. However, in the alternative embodiment illustrated in FIG. 61 and described below, the insulating liners 64 and insulating spacers 74 are omitted from the peripheral contact openings. The insulating spacers 74 can be formed by deposition of a continuous dielectric material layer and an anisotropic etch. The insulating spacers 74 includes a dielectric material that can be the same as, or different from, the dielectric material of the insulating liners 64. For example, the insulating spacers 74 can include silicon oxide, silicon nitride, a dielectric metal oxide, a dielectric metal oxynitride, or a combination thereof. The thickness of the insulating spacers 74, as measured at a bottom portion thereof, can be in a range from 1 nm to 50 nm, although lesser and greater thicknesses can also be employed. In one embodiment, the thickness of the insulating spacer 74 can be in a range from 3 nm to 10 nm.

Figure 59:
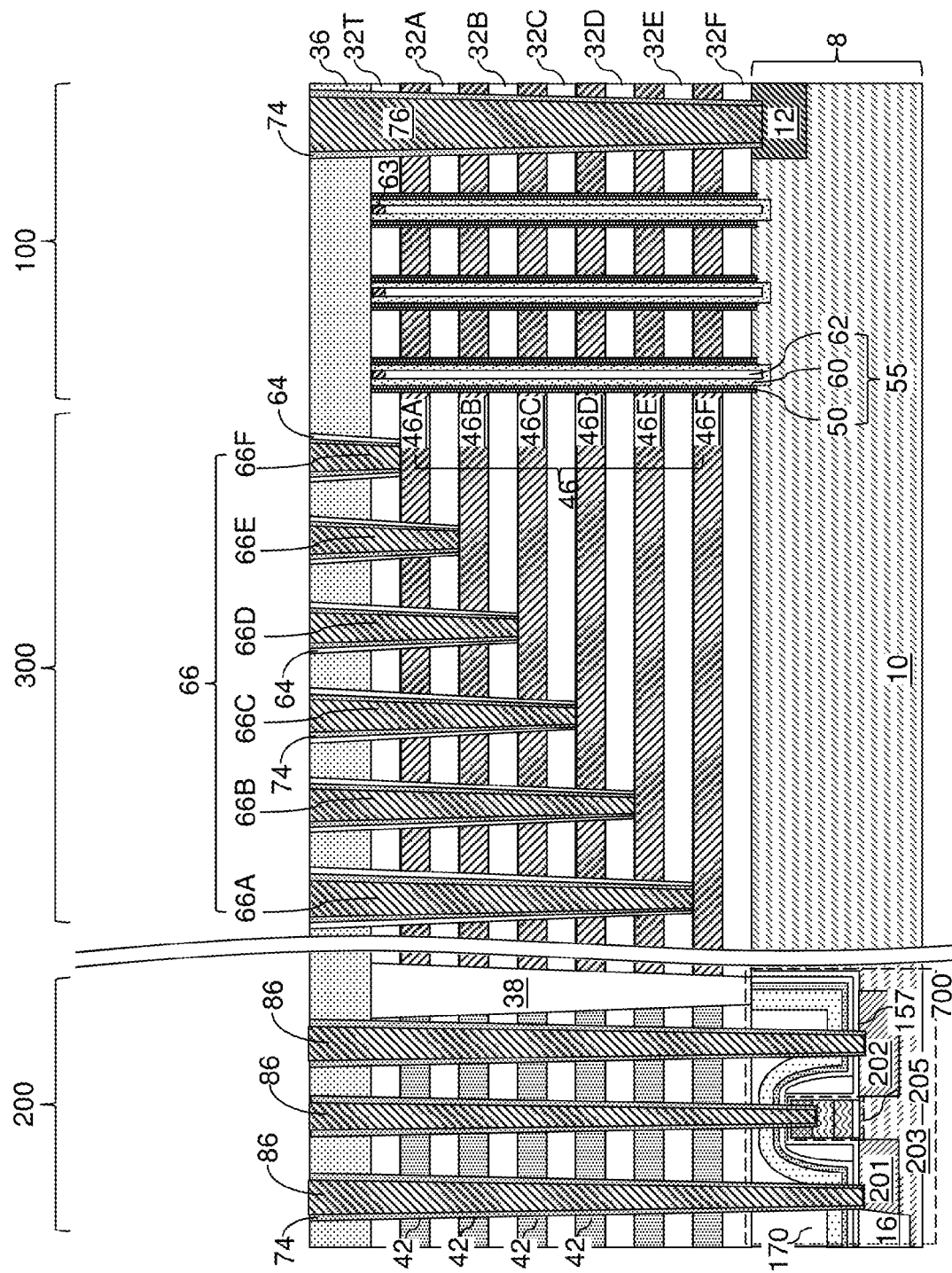

Referring to FIG. 59, the backside contact trench 79, the plurality of contact via trenches 69, and the peripheral contact openings 89 can be subsequently filled with a fill layer of another conductive material, which is herein referred to as a second conductive material. The second conductive material can be the same as, or can be different from, the first conductive material, i.e., the conductive material of the integrated line and via structures (46, 66). The second conductive material can be an electrically conducting material, and can include a metal such as tungsten and/or a metal nitride. The deposited second conductive material can be planarized employing the mask layer 36 as a stopping layer for the planarization process. Specifically, the portion of the conductive material formed over a horizontal plane including the top surface of the mask layer 36 can be removed, for example, by chemical mechanical planarization, a recess etch, or a combination of a recess etch and chemical mechanical planarization. Remaining portions of the second conductive material after the planarization process constitutes a plurality of electrically conductive via contacts 66, a backside contact 76, and peripheral device electrically conductive via contacts 86. The backside contact 76 can be a source line electrically connected to a source region in the substrate 8.

In one embodiment, each electrically conductive electrode 46 among the plurality of line and via structures (46, 66) can comprise a word line that functions as a common control gate electrode for the plurality of stacked memory devices including the memory stack structures 55. In one embodiment, at least one of the plurality of contact opening 69 (e.g., a first contact opening 69A) can have a first periphery contained entirety within a sidewall of one of the sacrificial material layers 42 (e.g., the N-th-from-top sacrificial material layer 42F) and a second periphery contained entirely within a sidewall of another of the sacrificial material layers 42 (e.g., the (N−1)-th-from-top sacrificial material layer 42E). In one embodiment, at least one of the plurality of contact opening 69 (e.g., a first contact opening 69A) can have a first periphery contained entirety within a sidewall of one of the insulator layers 32 (e.g., the (N−1)-th-from-top insulator layer 32E) and a second periphery contained entirely within a sidewall of another of the insulator layer 32 (e.g., the (N−2)-th-from-top sacrificial material layer 42D).

The exemplary device of the present disclosure can include a vertical NAND device containing a plurality of semiconductor channels 60. At least one end portion of each of the plurality of semiconductor channels 60 extends substantially perpendicular to the major surface of the substrate 8. The vertical NAND device further contains a plurality of charge storage regions. Each charge storage region located in a memory film 50 and adjacent to a respective one of the plurality of semiconductor channels 60. The vertical NAND device contains a plurality of control gate electrodes, embodied as the electrically conductive electrodes 46, that extend substantially parallel to the major surface of the substrate 8. The plurality of control gate electrodes comprise at least a first control gate electrode (e.g., the first-from-top electrically conductive electrode 46A) located in the first device level and a second control gate electrode (e.g., the second-from-top electrically conductive electrode 46B) located in the second device level below the first device level. The first control gate electrode can comprises an end portion of a first word line of the plurality of word lines, and the second control gate electrode can comprise an end portion of a second word line of the plurality of word lines. The first and the second word lines extend from the memory array region 100 to the contact region 300. In one embodiment, the plurality of word lines can comprise tungsten or titanium nitride and tungsten word lines deposited by chemical vapor deposition.

In one embodiment, a source line 76 extends through a dielectric insulated trench in the stack to electrically contact the semiconductor channels 60. A bit line (not shown) can be electrically connected to the drain regions 63 via at least one contact via structures (not shown). A source select gate electrode (not shown) may be located adjacent to the semiconductor channels 60 between the major surface of the substrate 8 and the plurality of control gate electrodes embodied as the electrically conductive electrodes 46. A drain select gate electrode (not shown) can be located adjacent to the semiconductor channels 60 above the plurality of control gate electrodes.

In the various embodiments of the present disclosure, a total of two photolithography steps can be used during the steps of forming the mask layer 36 with the plurality of openings, forming the plurality of contact openings 69, selectively removing the sacrificial material layers 42, and depositing the plurality of electrically conductive via contacts 46 and the plurality of electrically conductive electrodes 66. Specifically, a first lithography step is employed to pattern the mask layer 36 at a processing step of FIG. 35, and the second lithography step is employed to initially pattern the slimming layer prior to etching the topmost insulator layer 32 at a processing step of FIG. 37. The peripheral contact openings 89 (See, e.g., FIG. 41) can be formed employing only one photolithographic process.

Unlike the prior art methods, sacrificial material layers 42 need not be in a step pattern in the contact region. Thus, in some embodiments of the present disclosure, the sacrificial material layers 42 are not in a step pattern in the contact region, and laterally contact the same sidewall of a support pillar 38.

In one embodiment, chemical mechanical polishing is not used during the steps of forming the mask layer 36 with the plurality of openings, forming the plurality of contact openings 69, selectively removing the sacrificial material layers 32, and depositing the plurality of electrically conductive via contacts 66 and the plurality of electrically conductive electrodes 46. In one embodiment, unlike the prior art methods, a support pillar is not formed through the stack prior to the step of selectively removing the sacrificial material layers 42.

Figure 60:
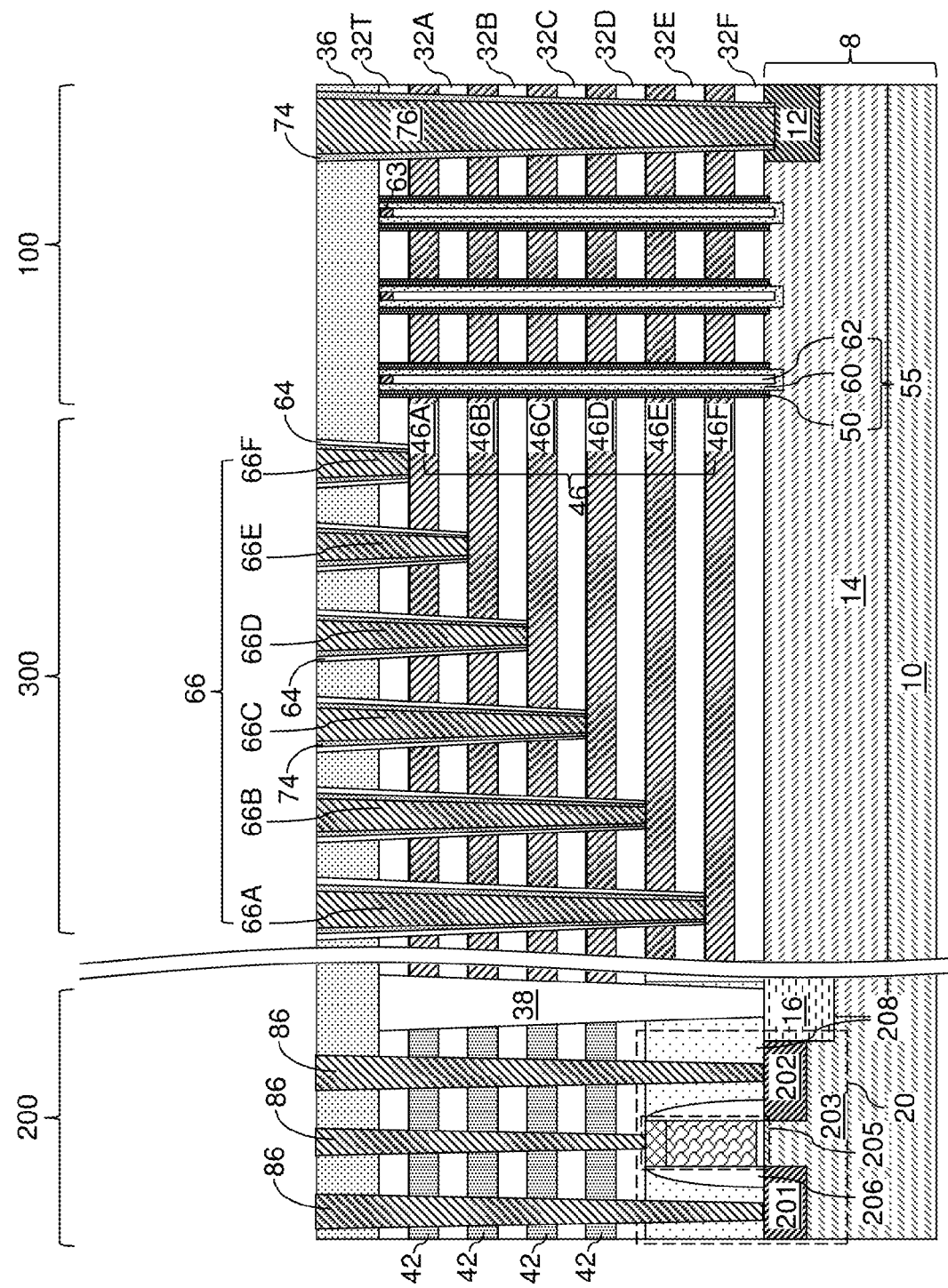
FIG. 60 is a vertical cross-sectional view of a modification of the second exemplary structure according to the second embodiment of the present disclosure.

Referring to FIG. 60, a modification of the second exemplary structure according to the second embodiment of the present disclosure can be derived from the second exemplary structure by omitting formation of the insulating liners 64 and insulating spacers 74 around the peripheral device electrically conductive via contacts 86. Specifically, the insulating liners 64 and spacers 74 are omitted from the peripheral contact openings 89 because the entirely of the peripheral contact openings 89 extend through insulating layers in the peripheral region (e.g., through at alternating stack of silicon nitride sacrificial material layers 42 and silicon oxide insulating layers 32 in region 200 and through insulating layers (157, 161, 162, 164 and 170) in region 700). Thus, the liner 64 and spacer 74 may be omitted since the contacts 86 will not form a short circuit with word lines 46 in the alternating stack because the insulating sacrificial material layers 42 are not removed from the alternating stack in the peripheral region 200. In this case, the sidewalls of the peripheral device electrically conductive via contacts 86 can contact sidewalls of the alternating stack of the insulating layers 32 and the dielectric material layers as embodied as remaining portions of the sacrificial material layers 42.

Figure 61:
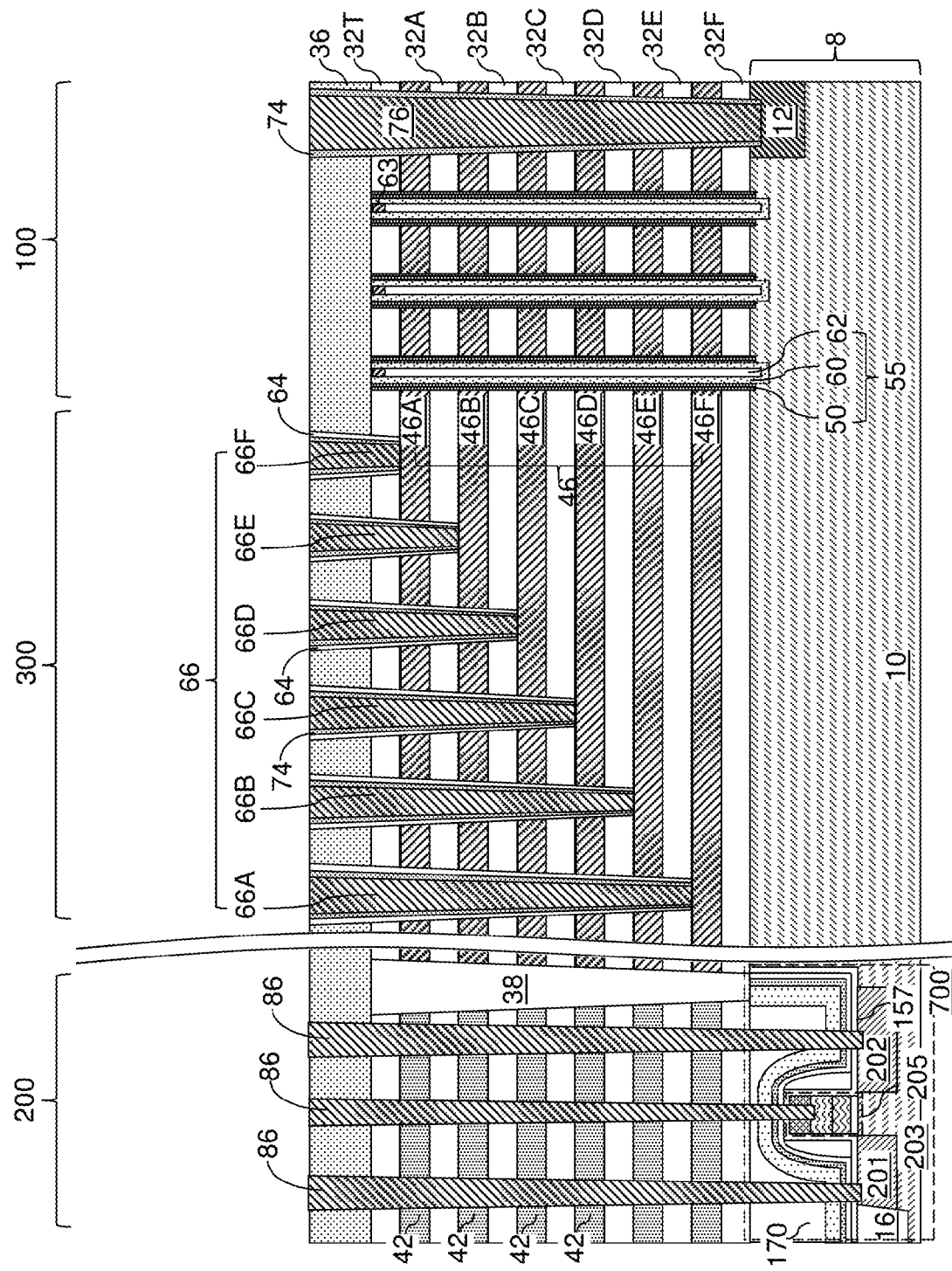
FIG. 61 is a vertical cross-sectional view of a modification of the fourth exemplary structure according to the fourth embodiment of the present disclosure.

Referring to FIG. 61, a modification of the fourth exemplary structure according to the fourth embodiment of the present disclosure can be derived from the fourth exemplary structure by omitting formation of the insulating liners 64 and insulating spacers 74 around the peripheral device electrically conductive via contacts 86. Specifically, the insulating liners 64 and spacers 74 are omitted from the peripheral contact openings 89. In this case, the sidewalls of the peripheral device electrically conductive via contacts 86 can contact sidewalls of the alternating stack of the insulating layers 32 and the dielectric material layers as embodied as remaining portions of the sacrificial material layers 42.

In embodiments illustrated in FIGS. 60 and 61, the peripheral device electrically conductive via contacts 86 are device contact via structures formed directly on sidewalls of the insulating layers 32 and the remaining portions of the sacrificial material layers 42 around the respective device contact opening.

In each of the first through fourth embodiments, a first sidewall of a dielectric support pillar 38 may be a stopping structure during formation of the lateral recesses 41. A second sidewall of the support pillar 38 can contact the remaining portions of the sacrificial material layers 42 that are present over the substrate 8 after formation of the lateral recesses 41. Device contact via structure (as embodied as the peripheral device electrically conductive via contacts 86) extend through a remaining region of the alternating stack (32, 42) including the insulating layers 32 and remaining portions of the sacrificial material layers 42 that are present over the substrate 8 after formation of the lateral recesses 41.

The various exemplary structures of the present disclosure can include a three-dimensional memory device comprising: a first alternating stack (32, 46) of insulating layers 32 and electrically conductive layers 46 located over a substrate 8; memory stack structures 55 extending through the alternating stack (32, 46), each of the memory stack structures 55 comprising a memory film 50 and a vertical semiconductor channel 60 extending substantially perpendicular to a top surface of the substrate 8 and laterally surrounded by the memory film 50; and an array of contact via structures 66 located within the alternating stack (32, 46) and laterally spaced apart along a first horizontal direction and having different heights. Each contact via structure 66 within the array of contact via structures 66 is laterally surrounded by a respective insulating liner 74. Top surfaces of the plurality of contact via structures 66 are located within a same horizontal plane. A bottom portion of each of the plurality of contact via structures 66 is adjoined to a respective electrically conductive layer 46. Each contact via structure 66 that passes through a topmost electrically conductive layer 46 is laterally surrounded by each electrically conductive layer 46 that overlies the respective electrically conductive layer 46 to which the contact via structure 66 is adjoined.

In one embodiment, the three-dimensional memory device can comprise: a second alternating stack (32, 42) of additional insulating layers 32 and spacer material layers 42 located over the substrate 8; a semiconductor device (which is located in a peripheral device region (200/700)) located on the substrate 8; and a device contact via structure 86 extending through the second alternating stack (32, 42) and contacting the semiconductor device. In one embodiment, a top surface of the device contact via structure 86 is within a same horizontal plane as the top surfaces of the plurality of contact via structures 66.

In one embodiment, each additional insulating layer 32 in the second alternating stack (32, 42) is located at a same vertical distance from a horizontal plane including a top surface of the substrate 8 as a corresponding insulating layer 32 in the first alternating stack (32, 46). Each spacer material layer 42 in the second alternating stack (32, 42) is located at a same vertical distance from the horizontal plane including the top surface of the substrate 8 as a corresponding electrically conductive layer 46.

In one embodiment, each insulating layer 32 in the first alternating stack (32, 42) is located at a same vertical distance from a horizontal plane including a top surface of the substrate as a corresponding additional insulating layer 32 in the second alternating stack (32, 42). Each electrically conductive layer 46 in the first alternating stack (32, 46) is located at a same vertical distance from the horizontal plane including the top surface of the substrate 8 as a corresponding spacer material layer 42 in the second alternating stack (32, 42).

In one embodiment, the total number of electrically conductive layers 46 in the first alternating stack (32, 46) equals the total number of spacer material layers 42 in the second alternating stack (32, 42). The total number of insulating layers 32 in the first alternating stack (32, 42) equals the total number of additional insulating layers 32 in the second alternating stack (32, 42).

In one embodiment, the substrate 8 comprises a recessed region including a recessed horizontal surface that is vertically recessed with respect to the top surface of the substrate 8 as in the third and fourth embodiments. The semiconductor device can be located directly on the recessed horizontal surface. A planarization dielectric layer 170 can be located over the recessed horizontal surface, and can have a top surface that is within a same horizontal plane as the top surface of the substrate 8. In one embodiment, at least one dielectric liner (157, 161, 162, 164) can overlie the semiconductor device and underlie the planarization dielectric layer 170. Each of the at least one dielectric liner (157, 161, 162, 164) can include a respective vertical portion that is located over a sidewall of the substrate 8 (i.e., over the sidewall of the trench 128) extending between the top surface of the substrate 8 and the recessed horizontal surface of the substrate. Each of the at least one dielectric liner (157, 161, 162, 164) can have a respective topmost surface within the same horizontal plane as the top surface of the substrate 8.

The spacer material layers 42 of the second alternating stack (32, 42) can comprise dielectric material layers. At least one support pillar 38 can overlie the substrate 8. One or more support pillars can comprise: a first sidewall contacting sidewalls of layers within the first alternating stack (32, 42), and a second sidewall contacting sidewalls of layers within the second alternating stack (32, 46).

In the first and third embodiments, each pair of an electrically conductive layer 46 and a corresponding contact via structure 66 constitutes an integrated line and via structure (46, 66) in which a respective conductive material portion (such as a conductive material portion 462) without an interface therein continuously extends through the electrically conductive layer 46 and the corresponding contact via structure 66.

In the second and fourth embodiments, each electrically conductive layer 46 contacts a corresponding contact via structure 66 at an interface including a portion of a top surface of the electrically conductive layer 46.

In each of the above embodiments, the three-dimensional memory device can comprise a vertical NAND device located over the substrate 8. The electrically conductive layers 46 can comprise, or can be electrically connected to, a respective word line of the NAND device. The substrate 8 can comprise a silicon substrate. The vertical NAND device can comprise an array of monolithic three-dimensional NAND strings located over the silicon substrate. At least one memory cell in a first device level of the array of monolithic three-dimensional NAND strings can be located over another memory cell in a second device level of the array of monolithic three-dimensional NAND strings. The silicon substrate can contain an integrated circuit comprising a driver circuit for the memory device located thereon.

The array of monolithic three-dimensional NAND strings can comprise a plurality of semiconductor channels (including a horizontal semiconductor channel extending between the source region 12 and the memory stack structures 55 and vertical semiconductor channels 60). At least one end portion (such as each vertical semiconductor channel 60) of each of the plurality of semiconductor channels extends substantially perpendicular to a top surface of the substrate 8. The array of monolithic three-dimensional NAND strings can comprise a plurality of charge storage elements (as embodied as portions of the memory film 50 located at each level of the electrically conductive layers 46). Each charge storage element can be located adjacent to a respective one of the plurality of semiconductor channels. The array of monolithic three-dimensional NAND strings can comprise a plurality of control gate electrodes (as embodied as a subset of the electrically conductive layers 46) having a strip shape extending substantially parallel to the top surface of the substrate 8. The plurality of control gate electrodes comprise at least a first control gate electrode located in a first device level and a second control gate electrode located in a second device level.

The structures and methods of the third and fourth embodiments have the following non-limiting advantage. The structures and methods reduce or eliminate dishing that occurs during planarization of upper insulating layers in prior art methods due to a step present in the underlying layers which extend over the protruding peripheral transistors. By placing the peripheral transistors in a trench 128 in the substrate 8 and forming a planar insulating layer 170 over the peripheral transistors, the step is replaced by a planar surface. Thus, the overlying layers do lack the step and dishing is reduced or eliminated.

Although the foregoing refers to particular preferred embodiments, it will be understood that the disclosure is not so limited. It will occur to those of ordinary skill in the art that various modifications may be made to the disclosed embodiments and that such modifications are intended to be within the scope of the disclosure. Where an embodiment employing a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A three-dimensional memory device comprising:
a first alternating stack of insulating layers and electrically conductive layers located over a substrate;
memory stack structures extending through the alternating stack, each of the memory stack structures comprising a memory film and a vertical semiconductor channel extending substantially perpendicular to a top surface of the substrate and laterally surrounded by the memory film;
an array of contact via structures located within the alternating stack and laterally spaced apart along a first horizontal direction and having different heights; and
a peripheral semiconductor device located in a peripheral region on the substrate; wherein:
each contact via structure within the array of contact via structures is laterally surrounded by a respective insulating liner;
top surfaces of the plurality of contact via structures are located within a same horizontal plane;
a bottom portion of each of the plurality of contact via structures is adjoined to a respective electrically conductive layer; and
each contact via structure that passes through a topmost electrically conductive layer is laterally surrounded by each electrically conductive layer that overlies the respective electrically conductive layer to which the contact via structure is adjoined.

2. The three-dimensional memory device of claim 1, further comprising:
a second alternating stack of additional insulating layers and spacer material layers located over the peripheral semiconductor device in the peripheral region; and
a device contact via structure extending through the second alternating stack and contacting the peripheral semiconductor device.

3. The three-dimensional memory device of claim 2, wherein a top surface of the device contact via structure is within a same horizontal plane as the top surfaces of the plurality of contact via structures.

4. The three-dimensional memory device of claim 2, wherein:
each additional insulating layer in the second alternating stack is located at a same vertical distance from a horizontal plane including a top surface of the substrate as a corresponding insulating layer in the first alternating stack; and
each spacer material layer in the second alternating stack is located at a same vertical distance from the horizontal plane including the top surface of the substrate as a corresponding electrically conductive layer.

5. The three-dimensional memory device of claim 4, wherein:
each insulating layer in the first alternating stack and each additional insulating layer in the second alternating stack, and each electrically conductive layer in the first alternating stack comprise the same silicon oxide layers; and each spacer material layer in the second alternating stack comprises a silicon nitride layer.

6. The three-dimensional memory device of claim 2, wherein:
a total number of electrically conductive layers in the first alternating stack equals a total number of spacer material layers in the second alternating stack; and
a total number of insulating layers in the first alternating stack equals a total number of additional insulating layers in the second alternating stack.

7. The three-dimensional memory device of claim 2, further comprising a support pillar overlying the substrate, wherein the support pillar comprises:
a first sidewall contacting sidewalls of layers within the first alternating stack; and
a second sidewall contacting sidewalls of layers within the second alternating stack.

8. The three-dimensional memory device of claim 1, wherein:
the substrate comprises a recessed trench region including a recessed horizontal surface that is vertically recessed with respect to the top surface of the substrate, and
the peripheral semiconductor device is located directly on the recessed horizontal surface in the recessed trench region.

9. The three-dimensional memory device of claim 8, further comprising a planarization dielectric layer located over the recessed horizontal surface and having a top surface that is within a same horizontal plane as the top surface of the substrate.

10. The three-dimensional memory device of claim 9, further comprising at least one dielectric liner overlying the semiconductor device and underlying the planarization dielectric layer and including a respective vertical portion that is located over a sidewall of the substrate extending between the top surface of the substrate and the recessed horizontal surface of the substrate and has a respective topmost surface within the same horizontal plane as the top surface of the substrate.

11. The three-dimensional memory device of claim 8, wherein the memory device comprises a NAND memory device and the peripheral semiconductor device comprises a word line driver transistor for the NAND memory device.

12. The three-dimensional memory device of claim 1, wherein each pair of an electrically conductive layer and a corresponding contact via structure constitutes an integrated line and via structure in which a respective conductive material portion without an interface therein continuously extends through the electrically conductive layer and the corresponding contact via structure.

13. The three-dimensional memory device of claim 1, wherein each electrically conductive layer contacts a corresponding contact via structure at an interface including a portion of a top surface of the electrically conductive layer.

14. The three-dimensional memory device of claim 1, wherein:
the three-dimensional memory device comprises a vertical NAND device located over the substrate;
the electrically conductive layers comprise, or are electrically connected to, a respective word line of the NAND device;
the substrate comprises a silicon substrate;
the vertical NAND device comprises an array of monolithic three-dimensional NAND strings over the silicon substrate;
at least one memory cell in a first device level of the array of monolithic three-dimensional NAND strings is located over another memory cell in a second device level of the array of monolithic three-dimensional NAND strings;
the silicon substrate contains an integrated circuit comprising a driver circuit for the memory device located thereon; and
the array of monolithic three-dimensional NAND strings comprises:
a plurality of semiconductor channels, wherein at least one end portion of each of the plurality of semiconductor channels extends substantially perpendicular to a top surface of the substrate;
a plurality of charge storage elements, each charge storage element located adjacent to a respective one of the plurality of semiconductor channels; and
a plurality of control gate electrodes having a strip shape extending substantially parallel to the top surface of the substrate, the plurality of control gate electrodes comprise at least a first control gate electrode located in a first device level and a second control gate electrode located in a second device level.

15. A method of forming a three-dimensional memory structure, comprising:
forming a peripheral semiconductor device on a semiconductor substrate;
forming an alternating stack of sacrificial material layers and insulating layers over the peripheral semiconductor device and over a top surface of the substrate;
forming contact openings partially through the alternating stack, wherein each of the contact openings extends through the alternating stack to a respective one of the sacrificial material layers;
selectively removing the sacrificial material layers from the alternating stack to form lateral recesses extending substantially parallel to the top surface of the substrate between a respective pair of the insulating layers;
forming electrically conductive layers in the lateral recesses;
forming contact via structures in volumes of the contact openings; and
forming a device contact via structure extending through levels of the alternating stack to the peripheral semiconductor device.

16. The method of claim 15, wherein the device contact via structure extends through a remaining region of the alternating stack including the insulating layers and remaining portions of the sacrificial material layers that are present over the substrate after formation of the lateral recesses.

17. The method of claim 16, further comprising:
forming a device contact opening through the alternating stack including the insulating layers and the sacrificial material layers; and
forming the device contact via structure directly on sidewalls of the insulating layers and the remaining portions of the sacrificial material layers around the device contact opening.

18. The method of claim 16, further comprising forming a support pillar through the alternating stack, wherein a first sidewall of the support pillar is a stopping structure during formation of the lateral recesses, and a second sidewall of the support pillar contacts the remaining portions of the sacrificial material layers that are present over the substrate after formation of the lateral recesses.

19. The method of claim 15, further comprising:
vertically recessing a region of the substrate to form a recessed horizontal surface that is vertically recessed from the top surface of the substrate, wherein the peripheral semiconductor device is formed directly on the recessed horizontal surface of the substrate; and
forming a planarization dielectric layer over the peripheral semiconductor device, wherein a top surface of the planarization dielectric layer is within a same horizontal plane as the top surface of the substrate.

20. The method of claim 19, wherein the alternating stack is formed directly on the top surface of the planarization dielectric layer and directly on the top surface of the substrate.

21. The method of claim 15, wherein:
the contact via structures and the electrically conductive layers are formed as integrated line and via structures;
each of the integrated line and via structures includes a respective pair of an electrically conductive layer and a contact via structure; and
a respective conductive material portion without an interface therein continuously extends through the electrically conductive layer and the corresponding contact via structure within each integrated line and via structure.

22. The method of claim 15, wherein the contact via structures and the electrically conductive layers are formed simultaneously by deposition of a same conductive material.

23. The method of claim 15, further comprising depositing a continuous material layer within the contact openings prior to formation of the lateral recesses, wherein removal of the sacrificial material layers is performed selective to the continuous material layer and the insulating layers.

24. The method of claim 23, wherein:
the electrically conductive layers are formed while the continuous material layer is present in the contact openings; and
the contact via structures are formed by removing the continuous material layer and filling the contact openings with a conductive material.

25. The method of claim 15, wherein:
the three-dimensional memory device comprises a vertical NAND device located over the substrate;
the electrically conductive layers comprise, or are electrically connected to, a respective word line of the NAND device;
the substrate comprises a silicon substrate;
the vertical NAND device comprises an array of monolithic three-dimensional NAND strings over the silicon substrate;
at least one memory cell in a first device level of the array of monolithic three-dimensional NAND strings is located over another memory cell in a second device level of the array of monolithic three-dimensional NAND strings;
the silicon substrate contains an integrated circuit comprising a driver circuit for the memory device located thereon; and
the array of monolithic three-dimensional NAND strings comprises:
a plurality of semiconductor channels, wherein at least one end portion of each of the plurality of semiconductor channels extends substantially perpendicular to a top surface of the substrate;
a plurality of charge storage elements, each charge storage element located adjacent to a respective one of the plurality of semiconductor channels; and
a plurality of control gate electrodes having a strip shape extending substantially parallel to the top surface of the substrate, the plurality of control gate electrodes comprise at least a first control gate electrode located in a first device level and a second control gate electrode located in a second device level.

\* \* \* \* \*